US008008105B2

(12) United States Patent
Huang

(10) Patent No.: US 8,008,105 B2

(45) Date of Patent: Aug. 30, 2011

(54) METHODS FOR FABRICATING MICRO-ELECTRO-MECHANICAL DEVICES

(75) Inventor: Yongli Huang, San Jose, CA (US)

(73) Assignee: Kolo Technologies, Inc., San Jose, CA (US)

(*) Notice: Subject to any disclaimer, the term of this patent is extended or adjusted under 35 U.S.C. 154(b) by 0 days.

(21) Appl. No.: 11/914,594

(22) PCT Filed: May 18, 2006

(86) PCT No.: PCT/IB2006/051567

§ 371 (c)(1), (2), (4) Date: Nov. 16, 2007

(87) PCT Pub. No.: WO2006/123299

PCT Pub. Date: Nov. 23, 2006

(65) Prior Publication Data

US 2008/0194053 A1 Aug. 14, 2008

Related U.S. Application Data

(60) Provisional application No. 60/682,619, filed on May 18, 2005, provisional application No. 60/692,038, filed on Jun. 17, 2005, provisional application No. 60/705,606, filed on Aug. 3, 2005, provisional application No. 60/744,242, filed on Apr. 4, 2006.

(51) Int. Cl.
*H01L 21/00* (2006.01)

(52) U.S. Cl. ........................................ 438/52; 438/53

(58) Field of Classification Search .................... 438/52, 438/53; 257/E21.532

See application file for complete search history.

(56) References Cited

U.S. PATENT DOCUMENTS 2,975,307 A 3/1961 Schroeder et al.
4,889,832 A 12/1989 Chatterjee
5,055,731 A 10/1991 Nihei et al.

(Continued)

FOREIGN PATENT DOCUMENTS

EP 1306901 A2 5/2003

(Continued)

OTHER PUBLICATIONS

Chow et al, "Process Compatible Polysilicon-Based Electrical Through-Wafer Interconnects in Silicon Substrates," Journal of Electromechanical Systems, IEEE, vol. 11, No. 6, Dec. 2002, pp. 631-640.

(Continued)

*Primary Examiner* — William M. Brewster

(74) *Attorney, Agent, or Firm* — Lee & Hayes, PLLC

(57) ABSTRACT

A method for fabricating a micro-electro-mechanical device (such as a cMUT) is disclosed. The method combines a substrate, a middle spring layer and a top plate using wafer bonding technology or sacrificial technology. A cavity is formed on either the top of the substrate or the bottom of the middle spring layer. A connector is formed on either the top of the middle spring layer or the bottom of the top plate. Upon joining the three layers, the connector defines a transducing space between the top plate and the middle spring layer. The connector is horizontally distanced from the sidewall to define a cantilever anchored at the sidewall. The cantilever and the cavity allow a vertical displacement of the connector, which transports the top wafer in a piston-like motion to change the transducing space. Multiple device elements can be made on the same substrate.

62 Claims, 39 Drawing Sheets

346

301

U.S. PATENT DOCUMENTS

| | | | | |
|---|---|---|---|---|
| 5,894,452 | A | 4/1999 | Ladabaum et al. | |
| 5,993,677 | A | 11/1999 | Biasse et al. | |
| 6,002,117 | A | 12/1999 | Pak | |
| 6,004,832 | A | 12/1999 | Haller et al. | |
| 6,283,601 | B1 | 9/2001 | Hagelin et al. | |
| 6,512,625 | B2 * | 1/2003 | Mei et al. | 359/290 |
| 6,585,653 | B2 | 7/2003 | Miller | |
| 6,600,587 | B2 | 7/2003 | Sniegowski et al. | |
| 6,605,518 | B1 | 8/2003 | Ohmi et al. | |
| 6,684,469 | B2 | 2/2004 | Horning et al. | |
| 6,828,656 | B2 | 12/2004 | Forbes et al. | |
| 6,865,140 | B2 | 3/2005 | Thomenius et al. | |
| 7,052,464 | B2 | 5/2006 | Wodnicki | |
| 7,564,172 | B1 * | 7/2009 | Huang | 310/328 |
| 2002/0031294 | A1 | 3/2002 | Takeda et al. | |
| 2002/0074670 | A1 | 6/2002 | Suga | |
| 2003/0022475 | A1 | 1/2003 | Vieux-Rochaz et al. | |
| 2003/0207566 | A1 | 11/2003 | Forbes et al. | |
| 2003/0222354 | A1 | 12/2003 | Mastromatteo et al. | |
| 2004/0027671 | A1 | 2/2004 | Wu et al. | |
| 2004/0085858 | A1 | 5/2004 | Khuri-Yakub et al. | |
| 2004/0106221 | A1 * | 6/2004 | Hunter et al. | 438/21 |
| 2005/0046922 | A1 | 3/2005 | Lin et al. | |
| 2005/0075572 | A1 | 4/2005 | Mills et al. | |
| 2005/0168849 | A1 | 8/2005 | Lin | |
| 2005/0237858 | A1 | 10/2005 | Thomenius et al. | |
| 2006/0004289 | A1 | 1/2006 | Tian et al. | |
| 2006/0125348 | A1 | 6/2006 | Smith et al. | |
| 2008/0194053 | A1 * | 8/2008 | Huang | 438/53 |
| 2008/0197751 | A1 * | 8/2008 | Huang | 310/311 |
| 2008/0290756 | A1 * | 11/2008 | Huang | 310/300 |
| 2009/0140606 | A1 * | 6/2009 | Huang | 310/322 |

FOREIGN PATENT DOCUMENTS

WO W02004084300 A1 9/2004

OTHER PUBLICATIONS

Ergun et al, "Capacitive Micromachined Ultrasonic Transducers: Fabrication Technology," IEEE Transactions on Ultrasonics, Ferroelectrics, and Frequency Control, vol. 52, No. 12, Dec. 2005, pp. 2242-2258.

Huang et al, "Fabricating Capacitive Micromachined Ultrasonic Transducers with Wafer-Bonding Technology," Journal of Microelectromechanical Systems, IEEE, vol. 12, No. 2, Apr. 2003, pp. 128-137.

Jin et al, "Micromachined Capacitive Transducer Arrays for Medical Ultrasound Imaging," 1998 IEEE Ultrasonics Symposium, pp. 1877-1880.

Lemmerhirt et al, "Air-Isolated Through-Wafer Interconnects for Microsystem Applications," The 12th International Conference on Solid State Sensors, Actuators and Microsystems, IEEE, Jun. 6-12, 2003, pp. 1067-1070.

Jin et al, "Recent Progress in Capacitive Micromachined Ultrasonic Immersion Transducer Array," The 8th International Symposium on Integrated Circuits, Devices and Systems, Singapore, Sep. 8-10, 1999, pp. 159-162.

Douglass et al, "Why is the Texas Instruments Digital Micromirror Device(TM) (DMD(TM)) so Reliable?", 1997, 7 pgs.

Hornbeck et al, "Digital Light Processing and MEMS: Timely Convergence for a Bright Future," DLP—Digital Light Processing, 1995, 25 pgs.

Huang et al, "Capacitive Micromachined Ultrasonic Transducers (CMUTS) with Isolation Posts," 2004 IEEE International Ultrasonics, Ferroelectrics, and Frequency Control Joint 50th Anniversary Conference, pp. 2223-2226.

Huang et al, "New Fabrication Process for Capacitive Micromachined Ultrasonic Transducers," IEEE, 2003, pp. 522-525.

Huang et al, "Optimized Membrane Configuration Improves CMUT Performance," 2004 IEEE Ultrasonics Symposium, 2004 IEEE International Ultrasonics, Ferroelectrics, and Frequency Control Joint 50th Anniversary Conference, pp. 505-508.

Hwang et al, "Design and Fabrication of the Thin-Film Micromirror Array-actuated for Large Projection Displays," Journal of the Korean Physical Society, vol. 33, Nov. 1998, pp. S467-S470.

Jeon et al, "Electrostatic Digital Micromirror Using Interdigitated Cantilevers," IEEE, 2002, pp. 528-531.

Khuri-Yakub et al, "Micromachined Ultrasonic Transducers and Their Use for 2D and 3D Imaging," Acoustical Imaging, Kluwer Academic Publishers, Netherlands, 2004, pp. 1-9.

Kim et al, "A High Fill-Factor Micro-Mirror Stacked on a Crossbar Torsion Spring for Electrostatically-Actuated Two-Axis Operation in Large-Scale Optical Switch," IEEE, 2003, pp. 259-262.

Zhou et al, "Two-Axis Scanning Mirror for Free-Space Optical Communication between UAVs," IEEE/LEOS Optical MEMS 2003, Hawaii, US, Aug. 2003, pp. 1-2.

Huang et al, "Capacitive Micromachined Ultrasonic Transducers (CMUTS) with Piston-Shaped Membranes," 2005 IEEE Ultrasonics Symposium, 2005, pp. 589-592.

PCT International Search Report and Written Opinion for PCT Application No. PCT/IB06/51567, mailed on Jun. 5, 2008, 7 pgs.

PCT International Search Report and Written Opinion for PCT Application No. PCT/IB06/51568, mailed on Jun. 16, 2008, 7 pgs.

PCT International Search Report and Written Opinion for PCT Application No. PCT/IB06/51569, mailed on Jun. 18, 2008, 7 pgs.

PCT International Search Report and Written Opinion for PCT Application No. PCT/IB06/51948, mailed on Jul. 7, 2008, 9 pgs.

The Extended Europoean Search Report mailed on Feb. 18, 2011 for European Patent Application No. 06744966.0, a counterpart foreign application for U.S. App. No. 11/914,584.

Final Office Action for U.S. Appl. No. 11/917,666, mailed Apr. 25, 2011, Yongli Huang, "Micro-Electro-Mechanical Transducer Having an Insulation Extension".

Non-Final Office Action for U.S. Appl. No. 11/914,584 mailed on Apr. 25, 2011, Yongli Huang, "Through-Wafer Interconnection".

* cited by examiner

FIG. 3.1
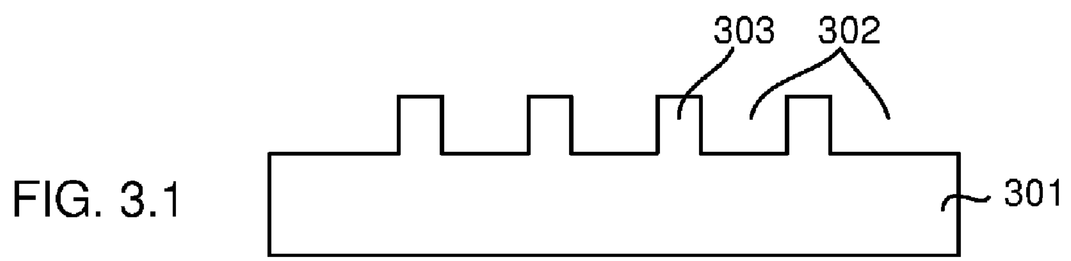
FIG. 3.2
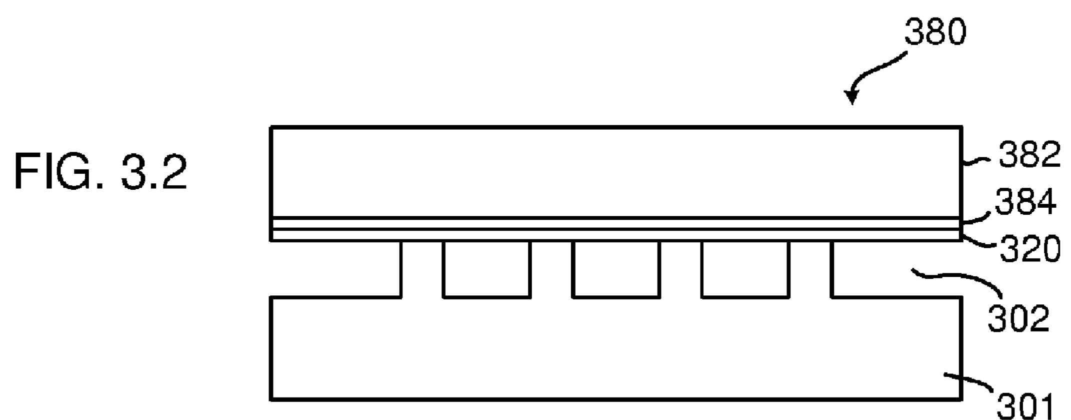
FIG. 3.3
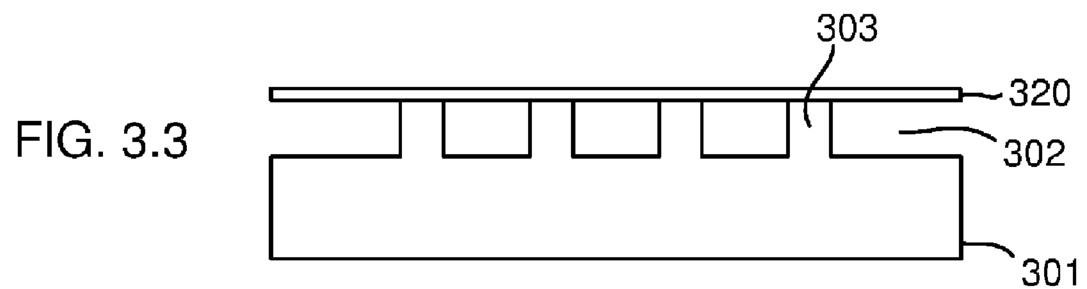
FIG. 3.4
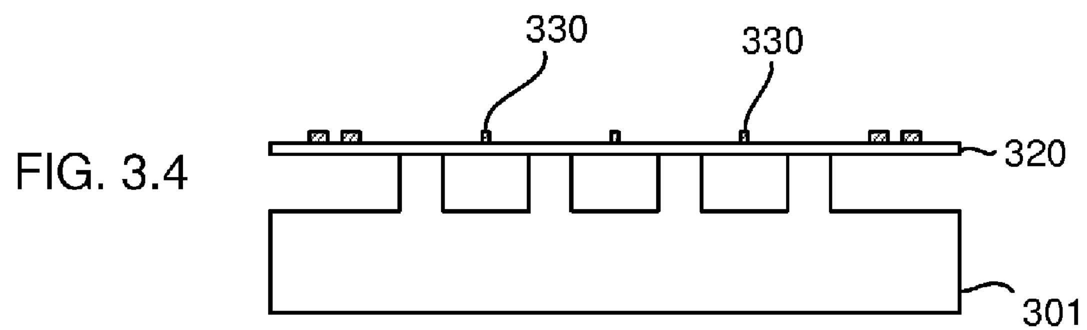

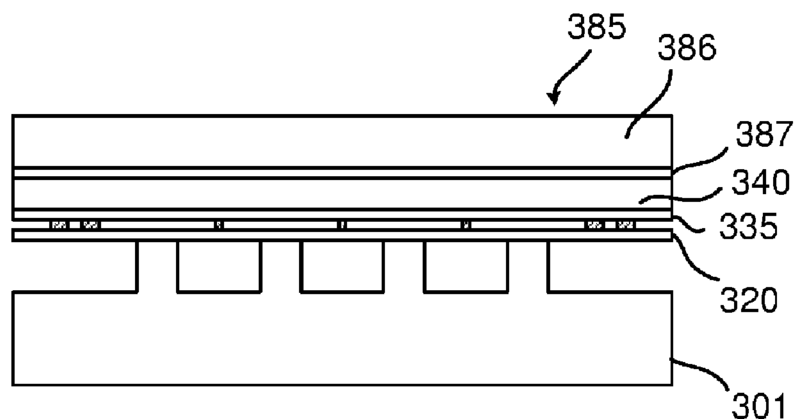
385
386
387
340
335
320
301
FIG. 3.5
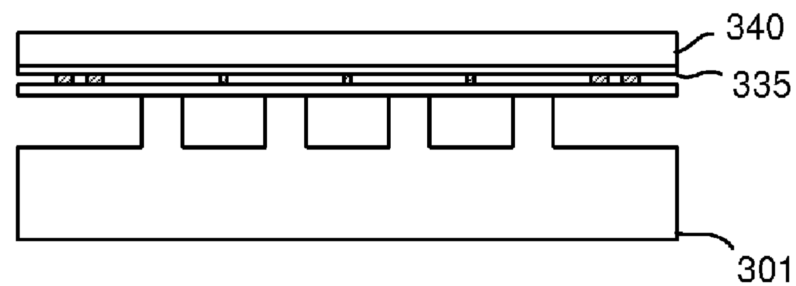
340
335
301
FIG. 3.6
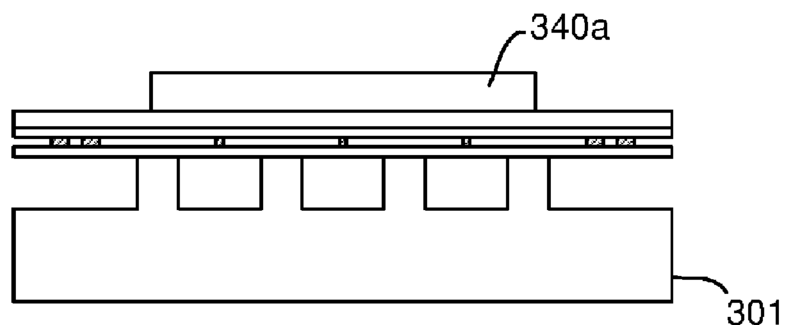
340a
301
FIG. 3.6A
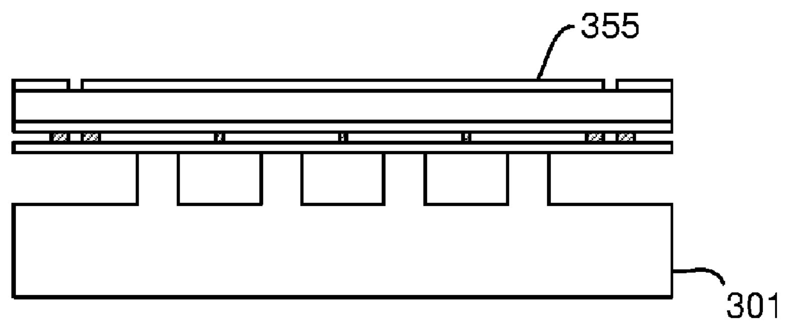
355
301
FIG. 3.7

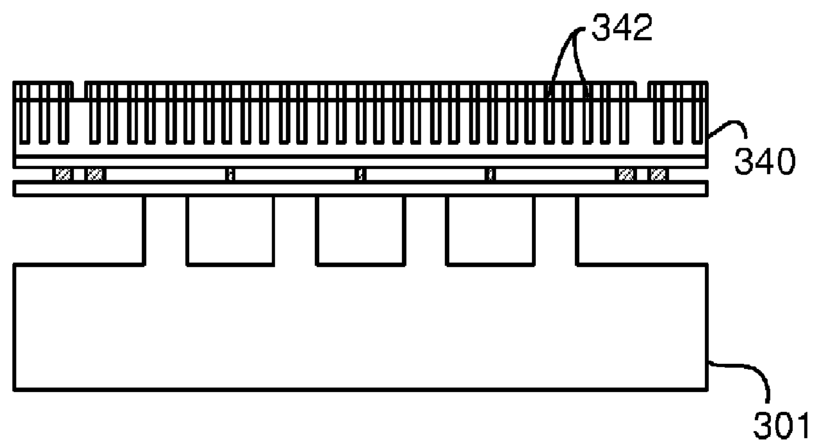
FIG. 3.7A
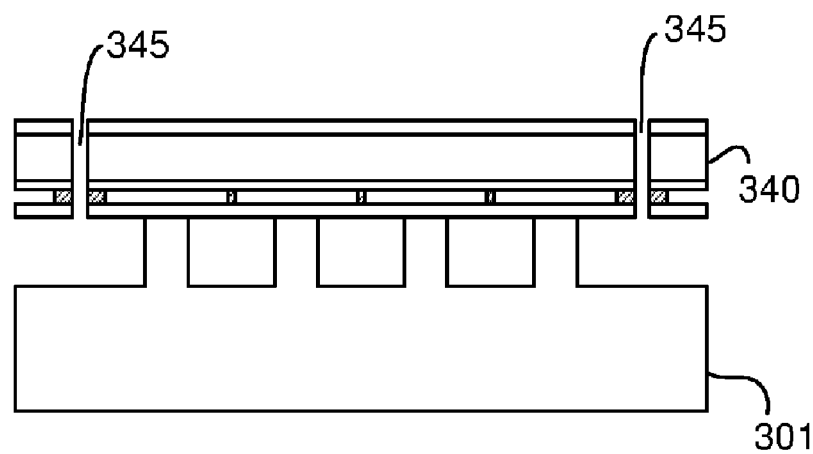
FIG. 3.8
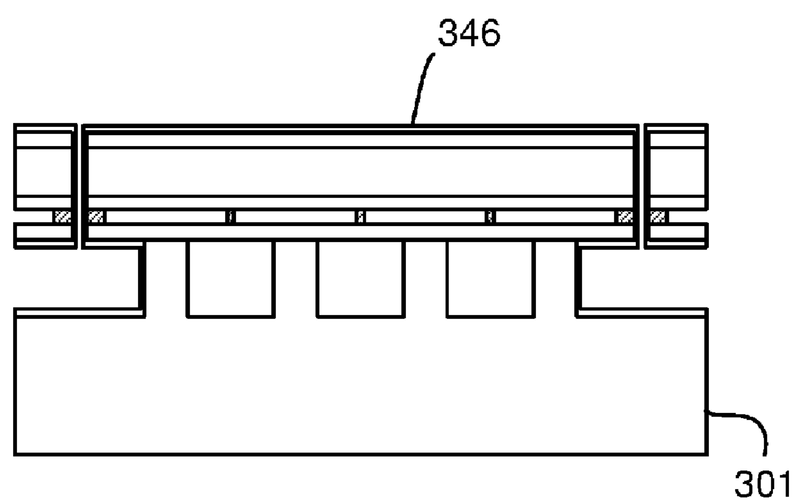
FIG. 3.9

FIG. 4.1A
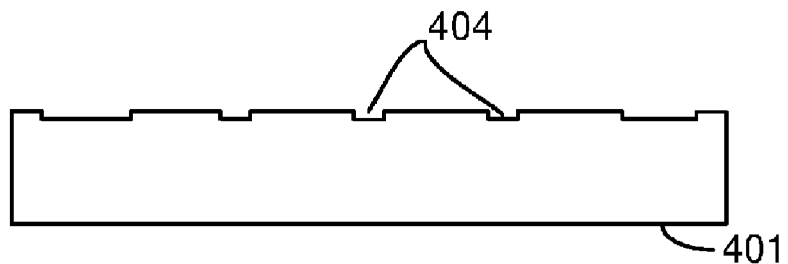
FIG. 4.1B
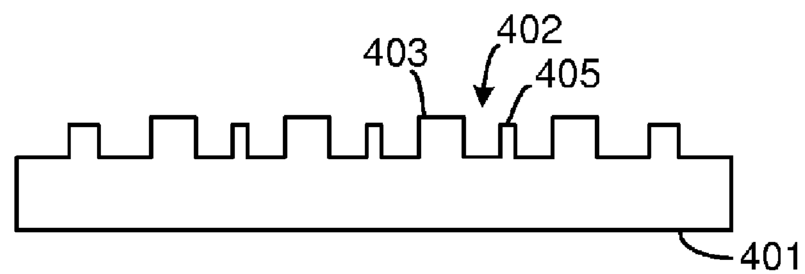
FIG. 4.2
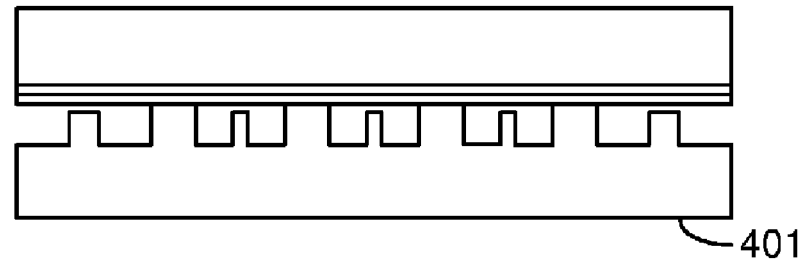
FIG. 4.3
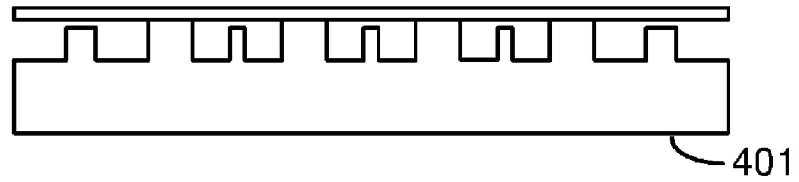

FIG. 4.4
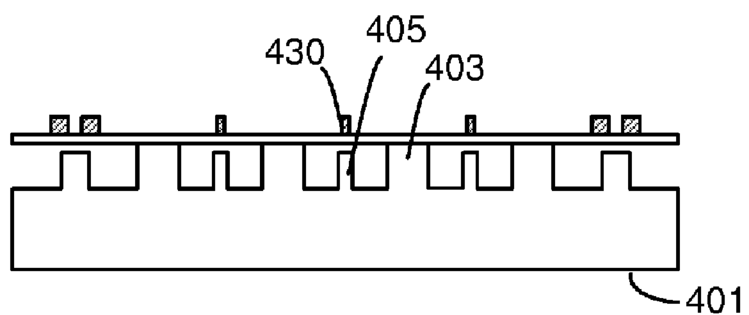
FIG. 4.5
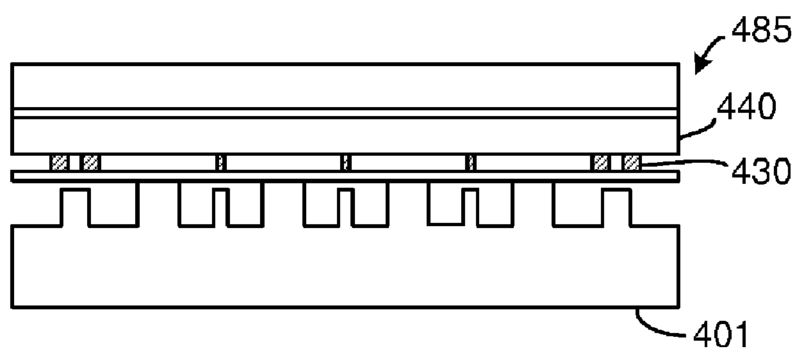
FIG. 4.6
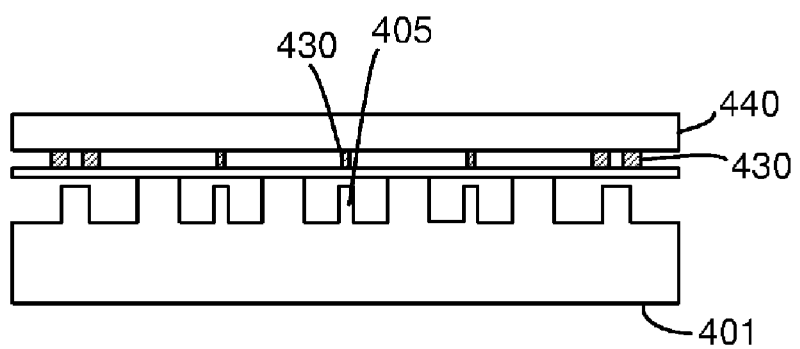
FIG. 4.6A
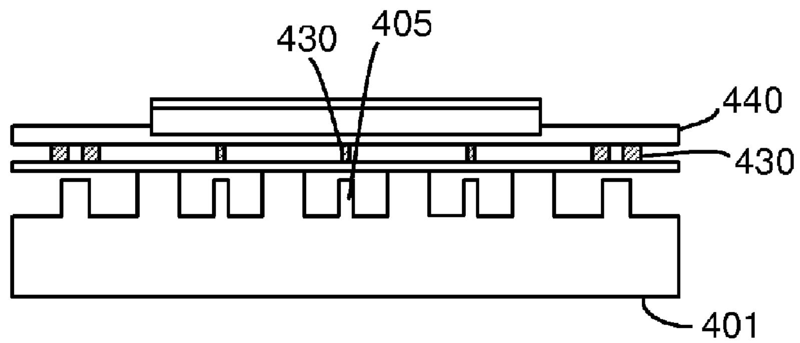

FIG. 4.7
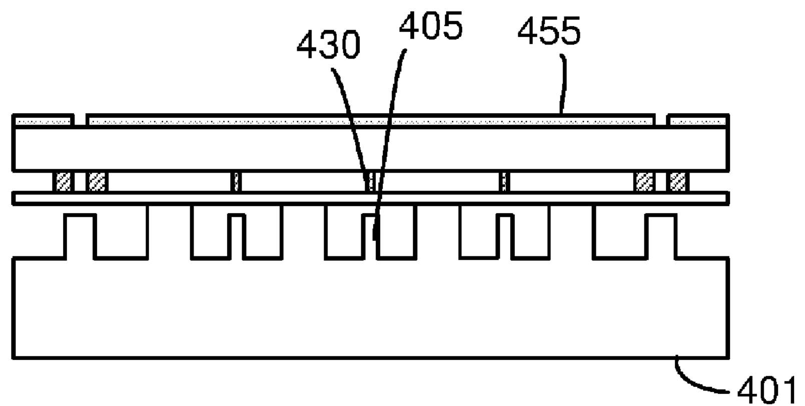
FIG. 4.7A
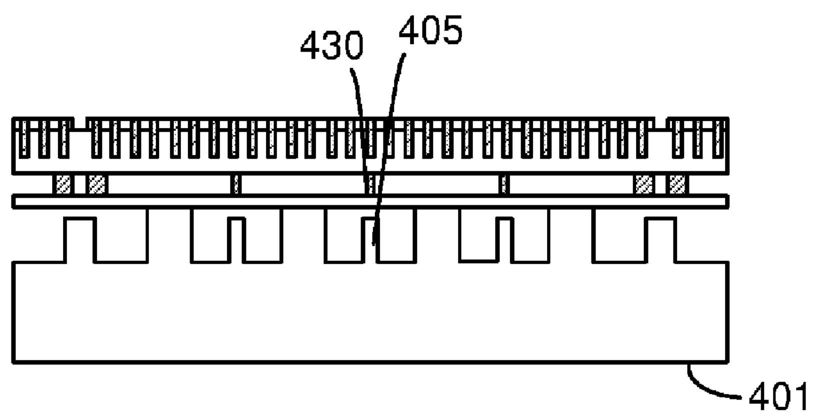
FIG. 4.8
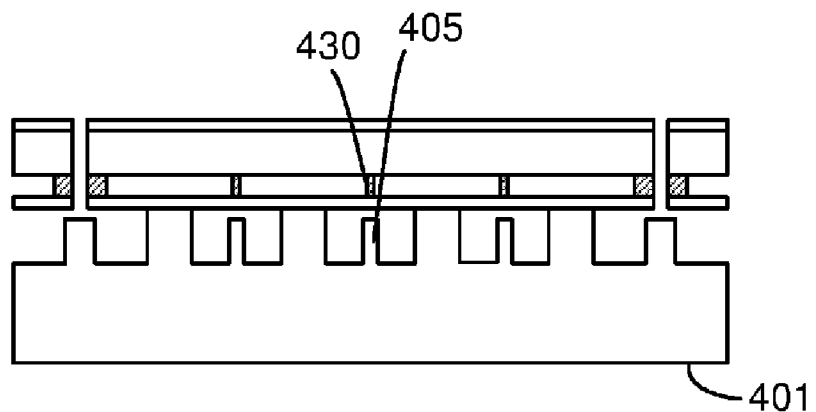

FIG. 5.1
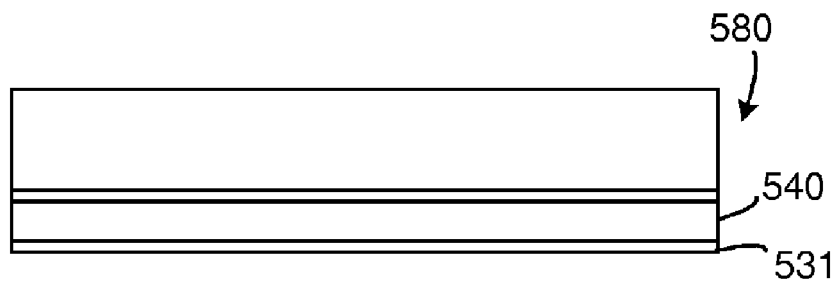
FIG. 5.2
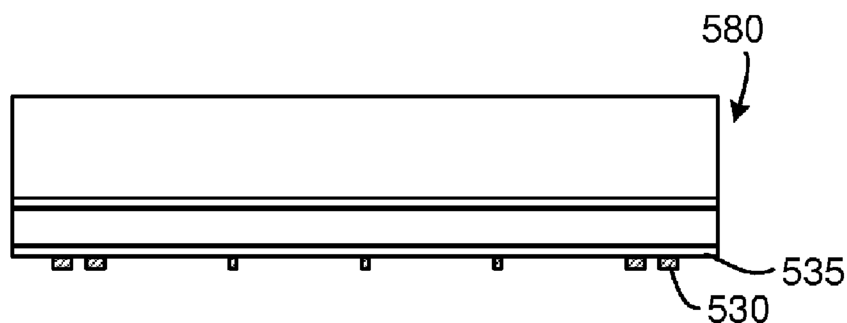
FIG. 5.3
580
540
530
520
594
592
FIG. 5.4
580
530
520

FIG. 5.5A
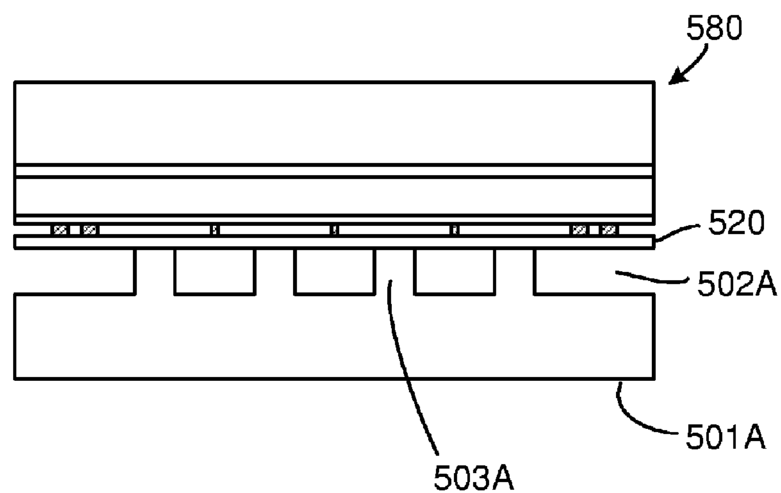
FIG. 5.5B
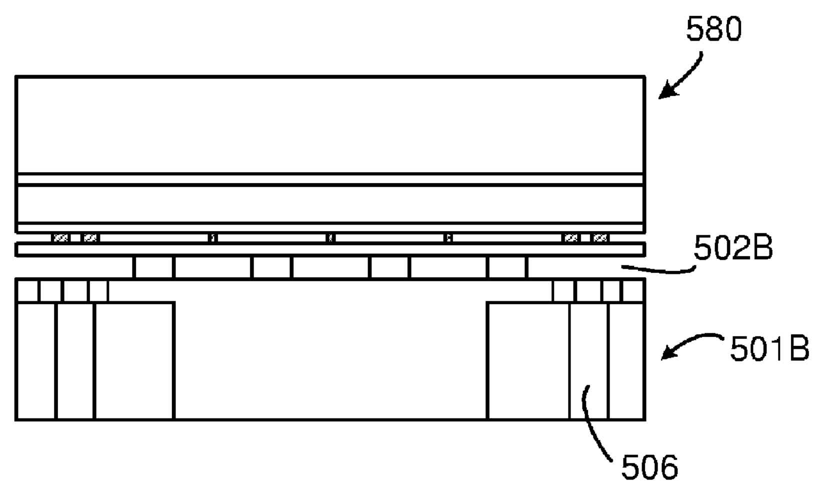
FIG. 5.5C_1
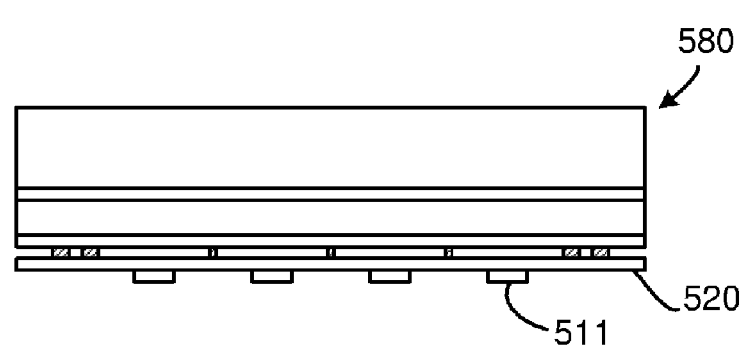

FIG. 5.5C_2
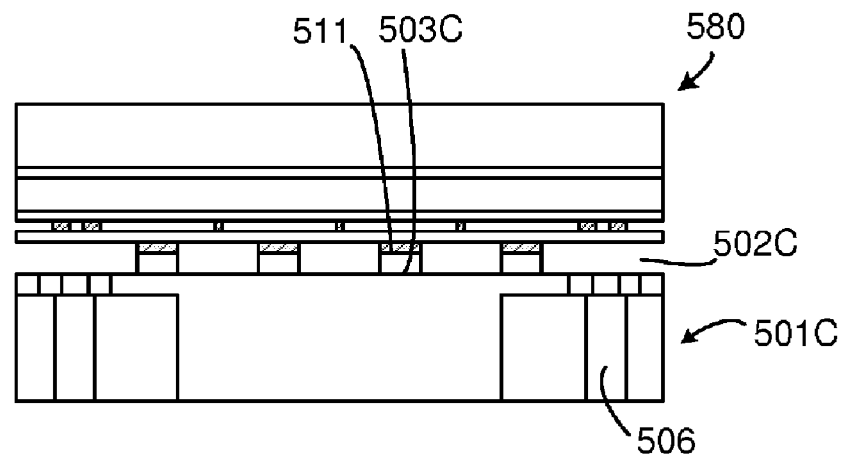
FIG. 5.5D
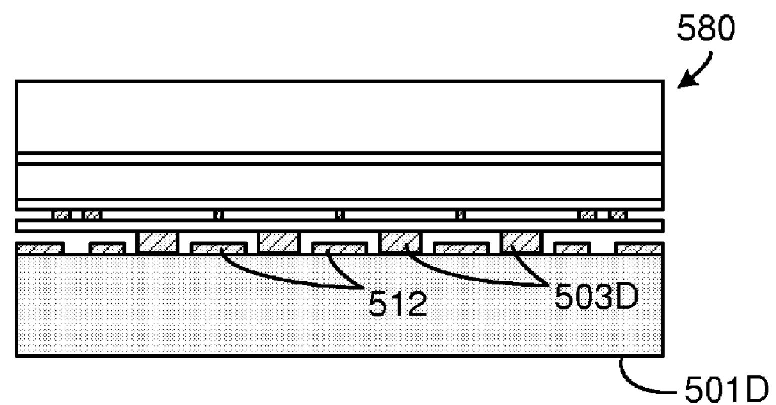
FIG. 5.5E
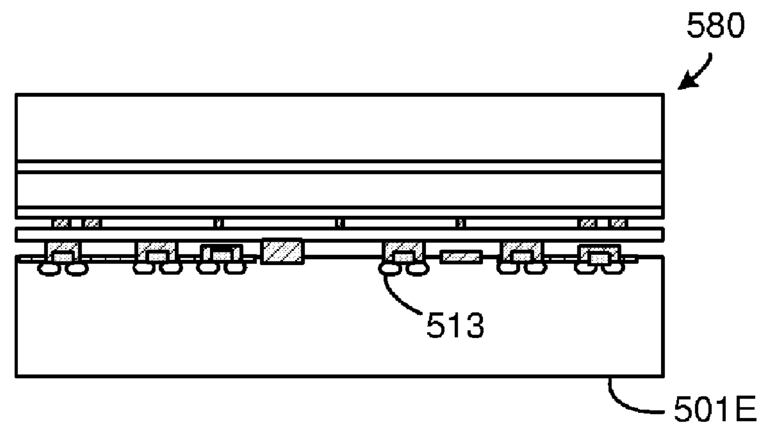

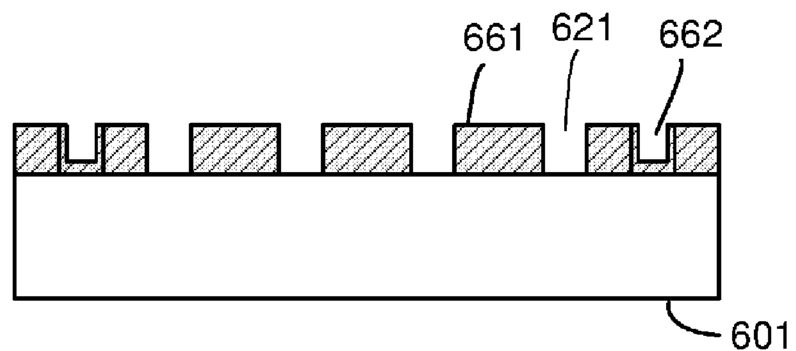
FIG. 6.1
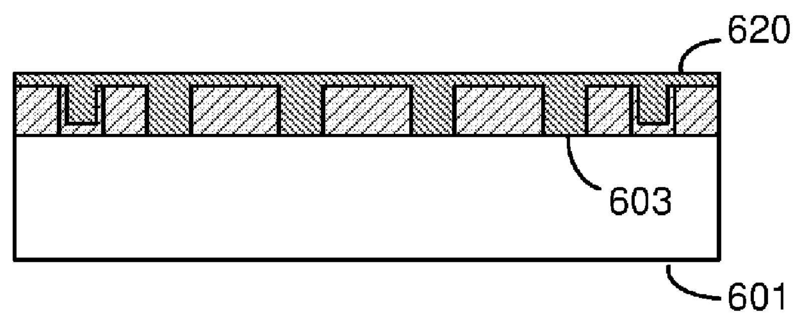
FIG. 6.2
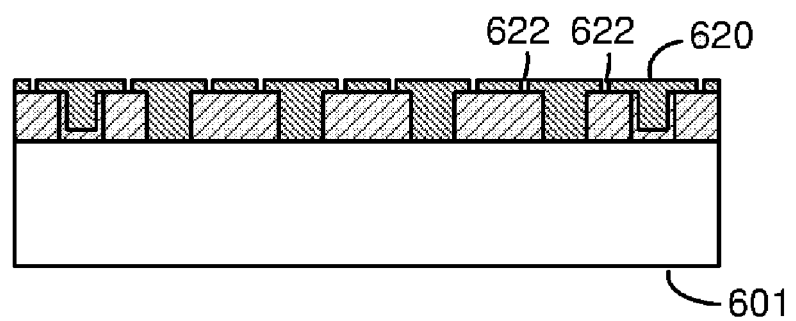
FIG. 6.3
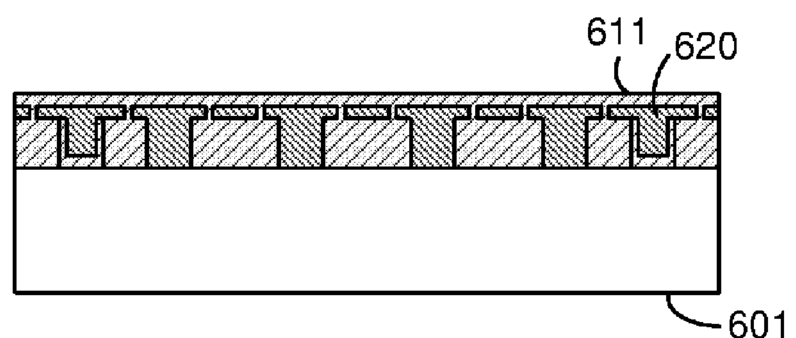
FIG. 6.4

FIG. 6.5
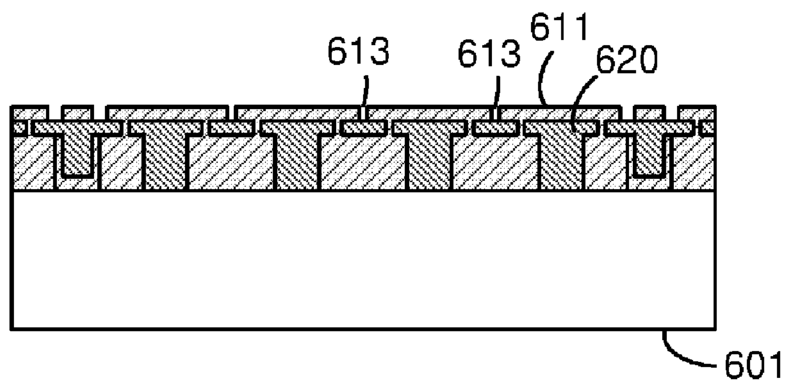
FIG. 6.6
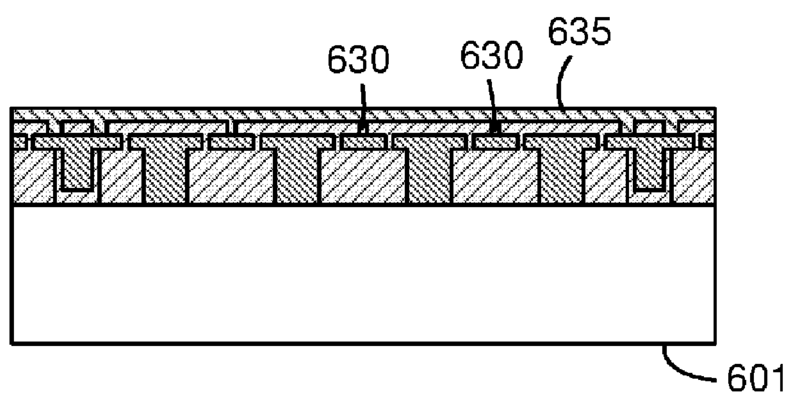
FIG. 6.7
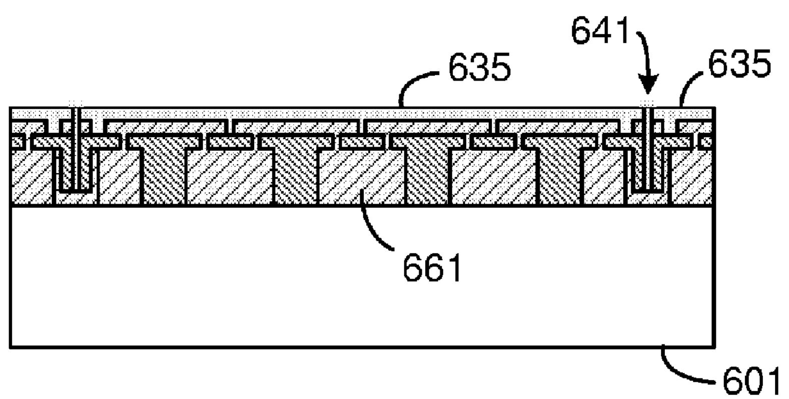
FIG. 6.8
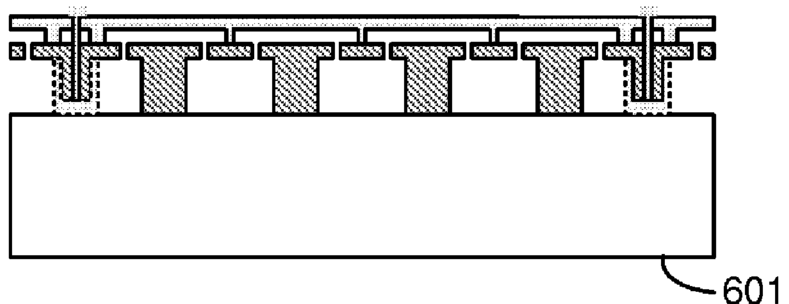

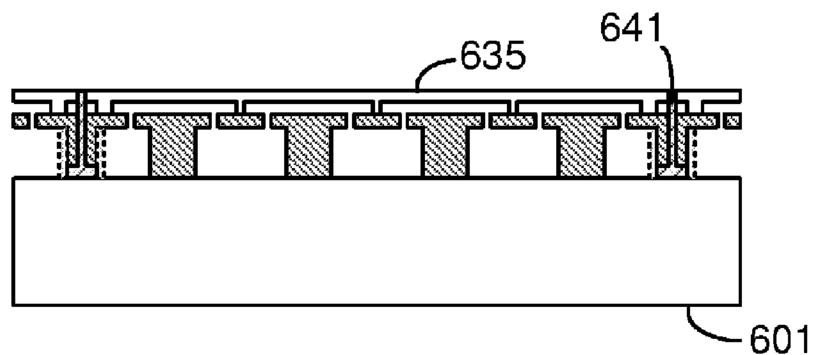
FIG. 6.9
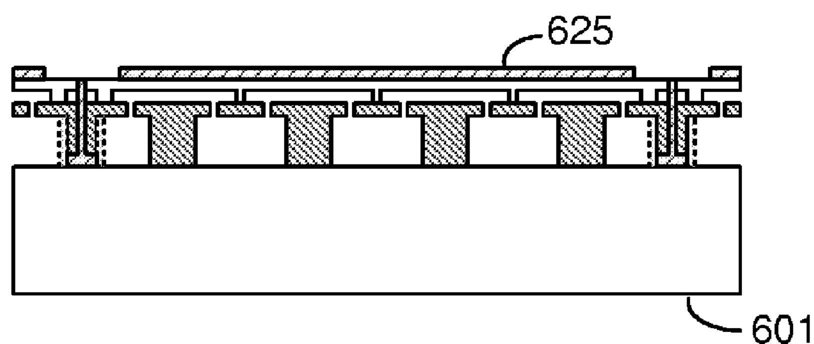
FIG. 6.10
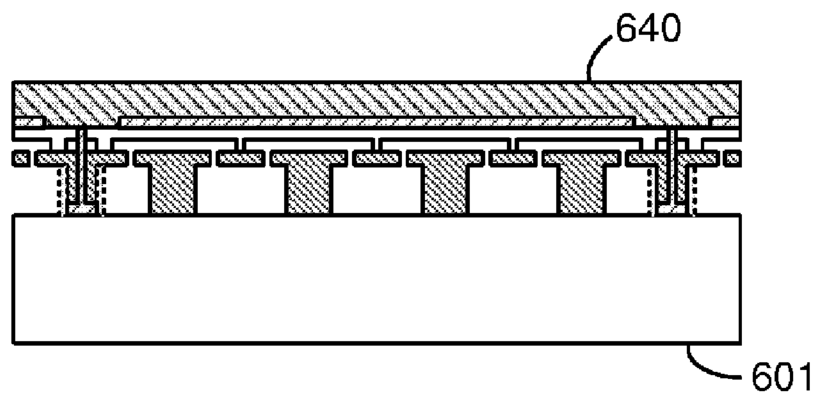
FIG. 6.11
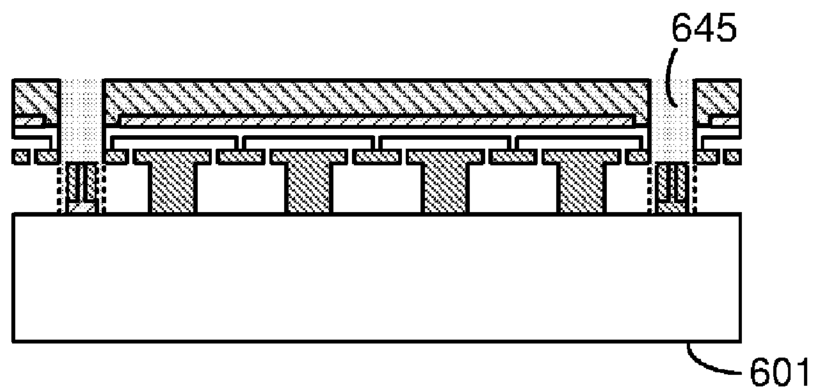
FIG. 6.12

FIG. 7.1
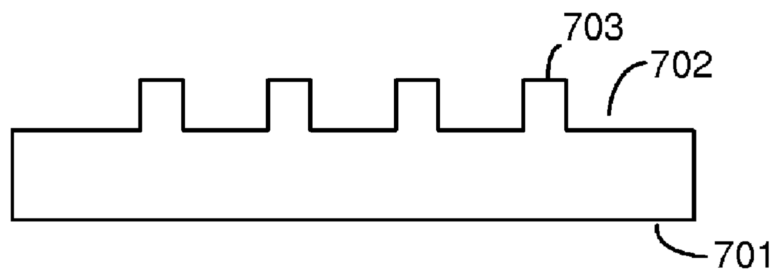
FIG. 7.2
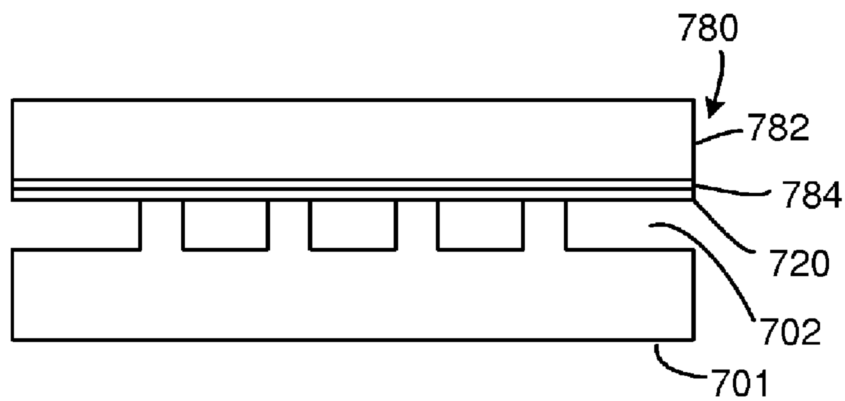
FIG. 7.3
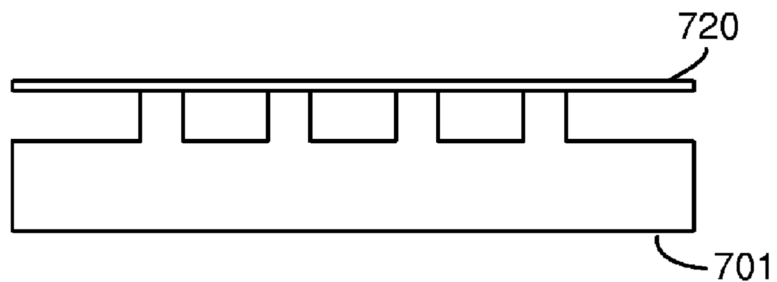
FIG. 7.4
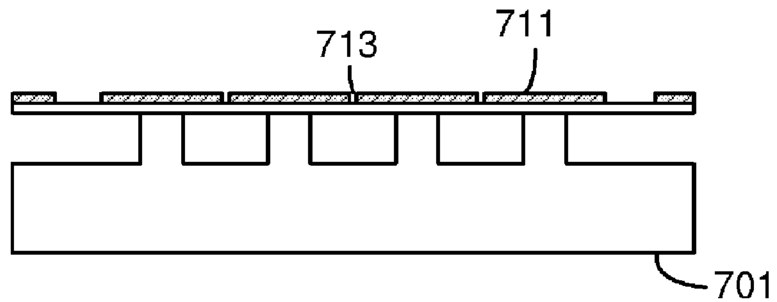

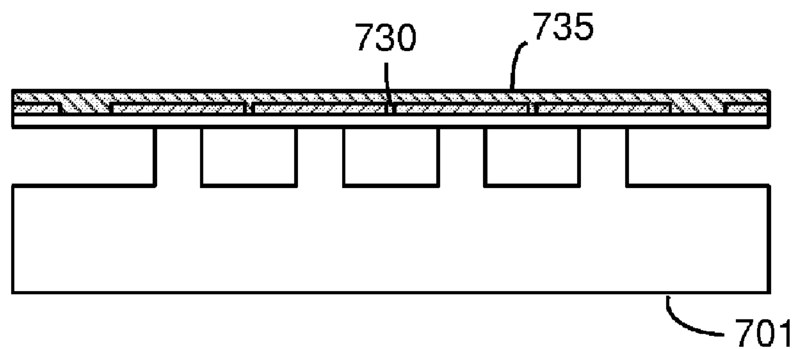
FIG. 7.5
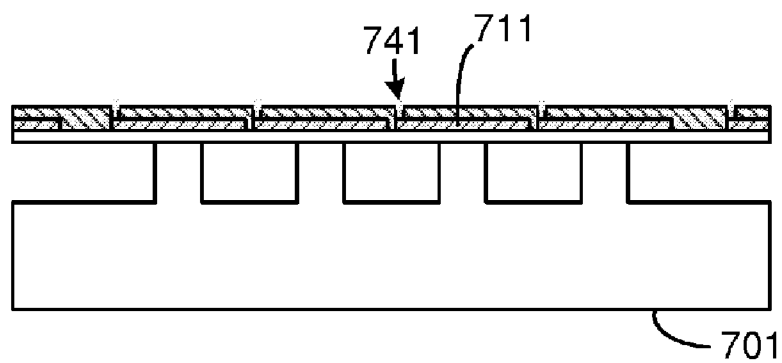
FIG. 7.6
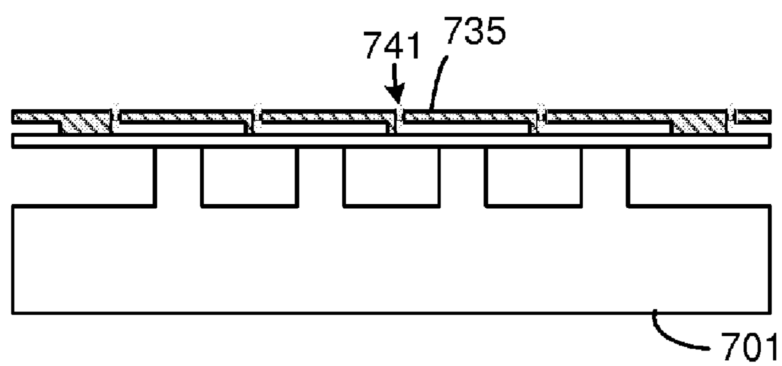
FIG. 7.7
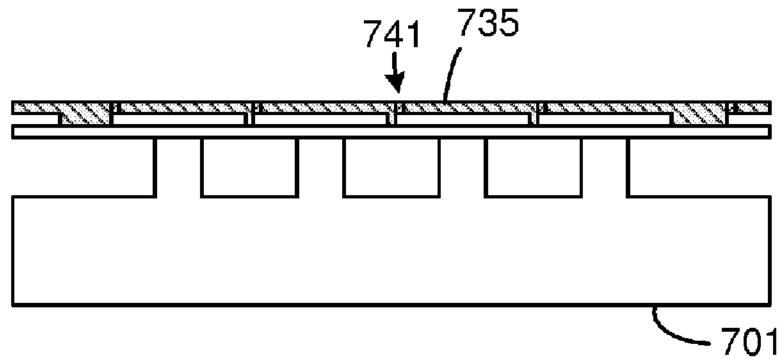
FIG. 7.8

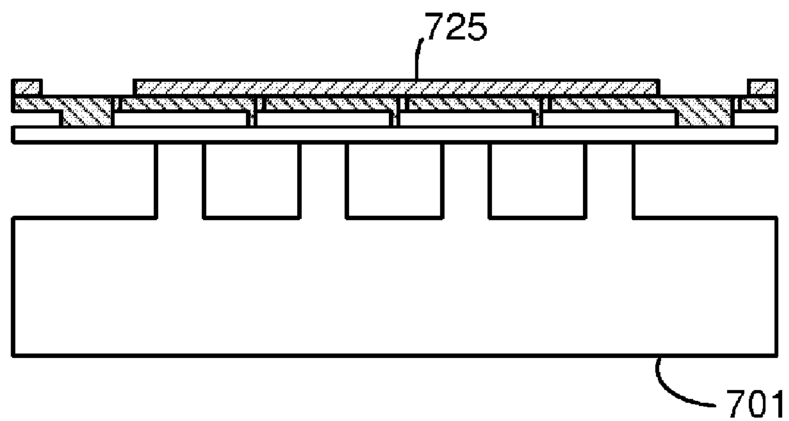
FIG. 7.9
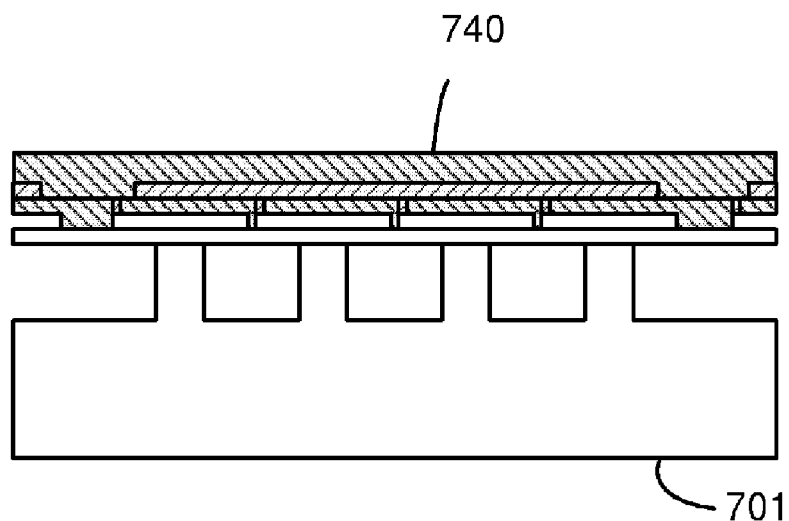
FIG. 7.10
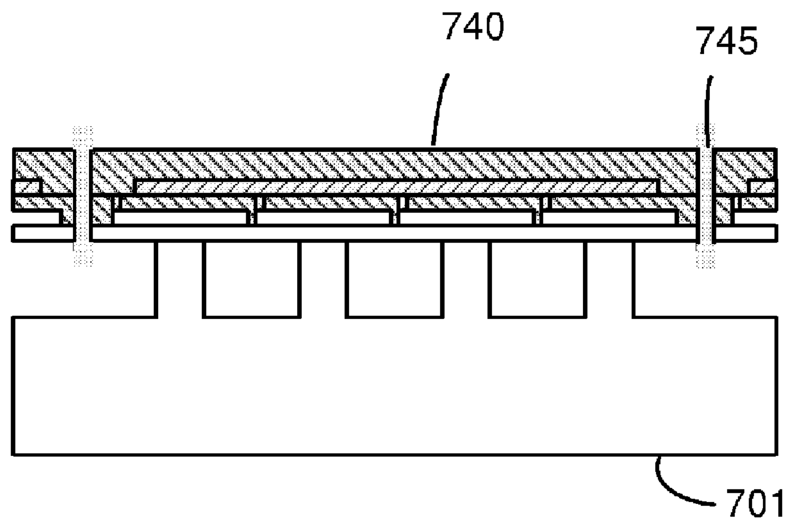
FIG. 7.11

FIG. 8.1
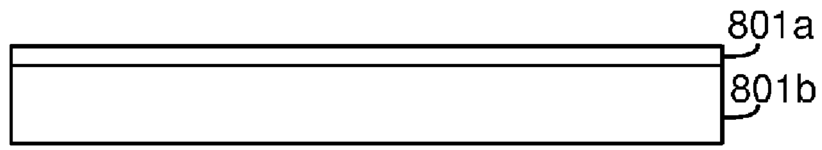
FIG. 8.2
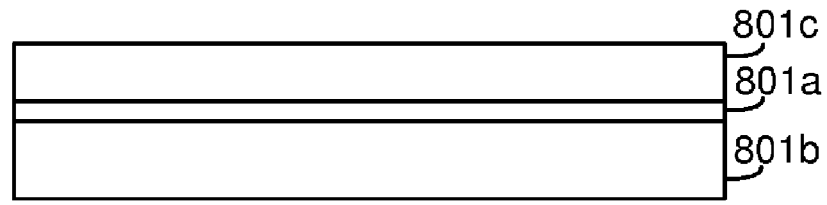
FIG. 8.3
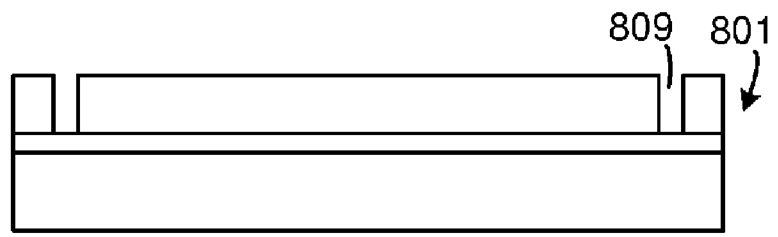
FIG. 9.1
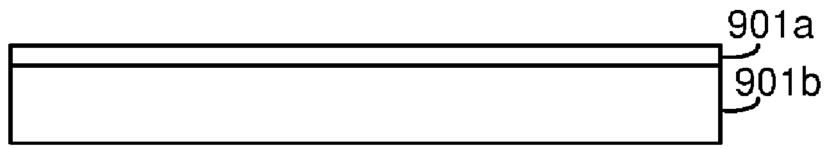
FIG. 9.2
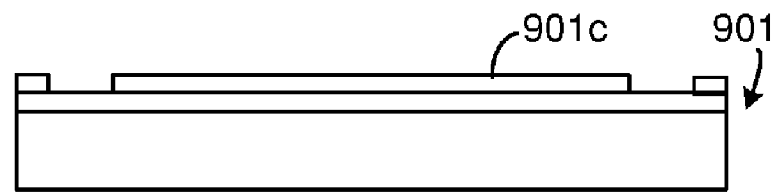

FIG. 12.1
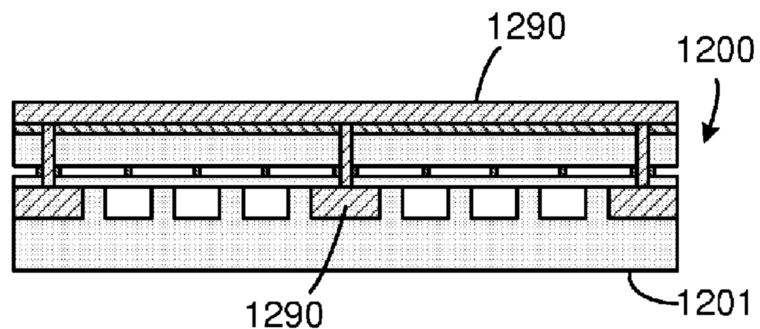
FIG. 12.2
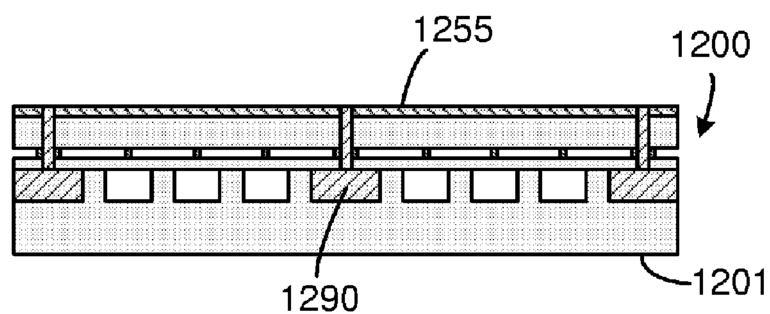
FIG. 12.3
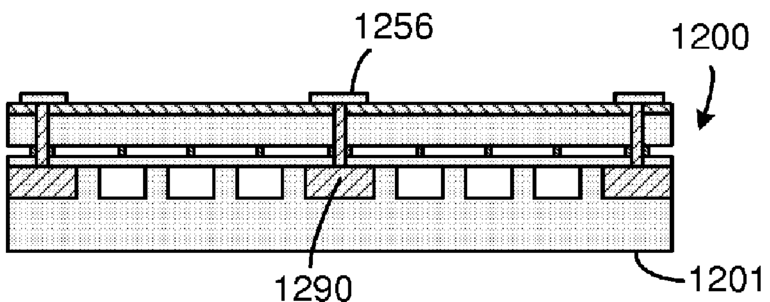
FIG. 12.4
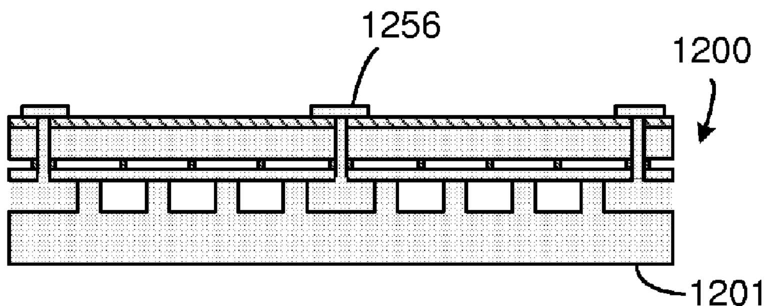

FIG. 13.1
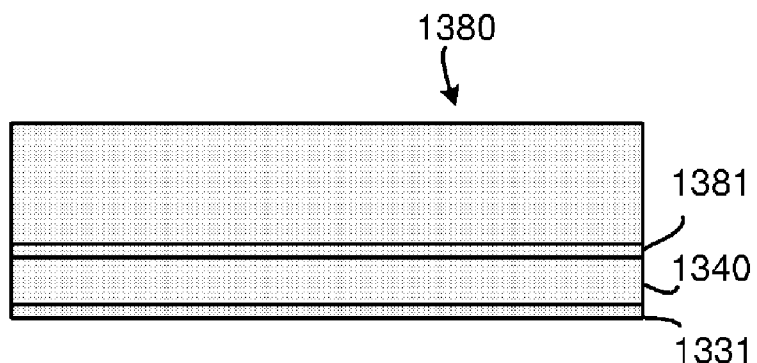
FIG. 13.2
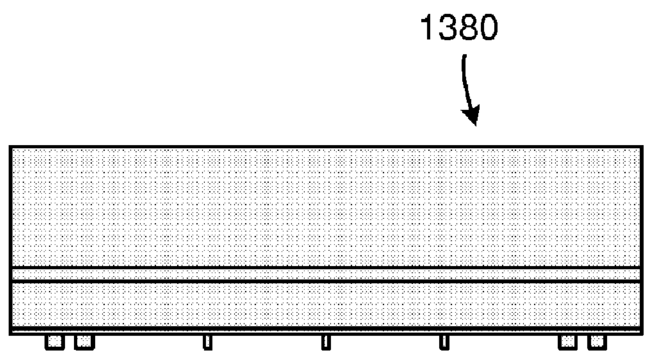
FIG. 13.3
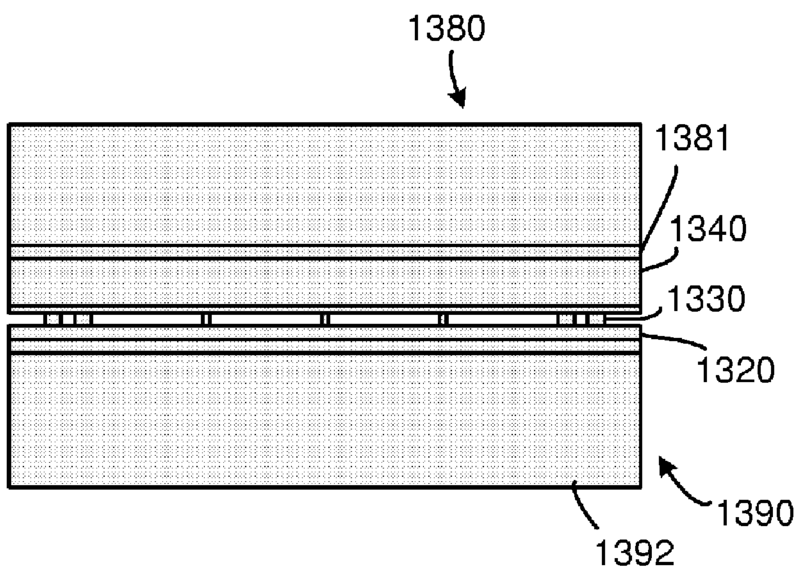

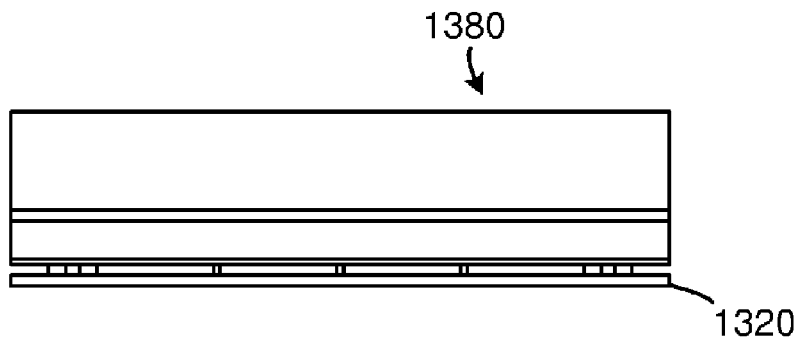
FIG. 13.4
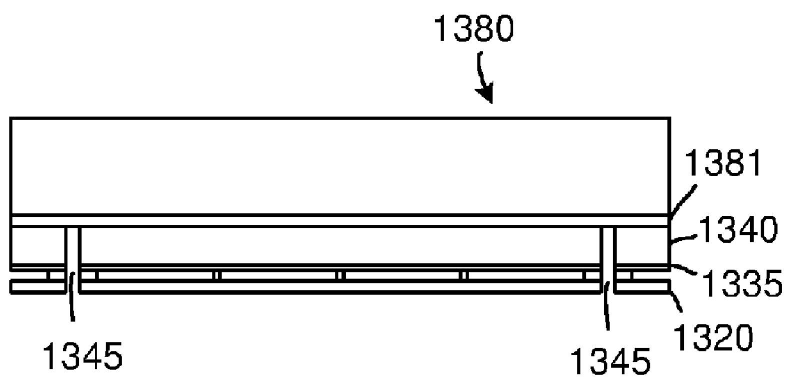
FIG. 13.5
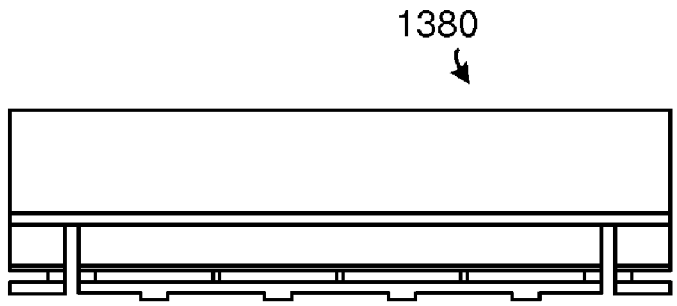
FIG. 13.6
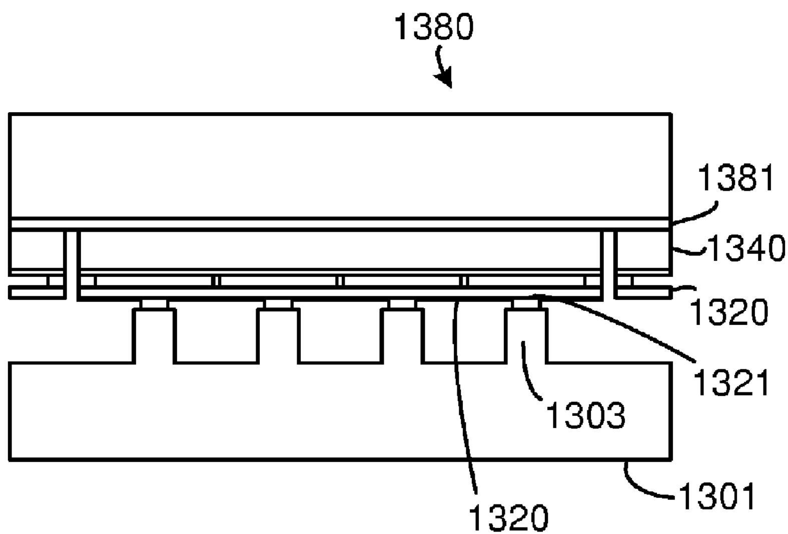
FIG. 13.7

FIG. 13.8
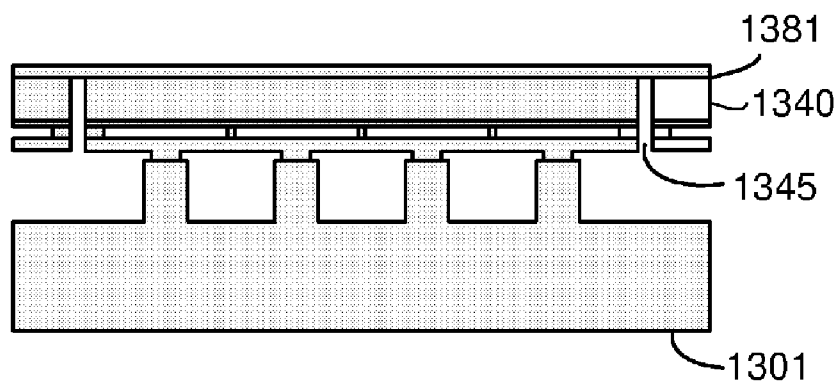
FIG. 13.9
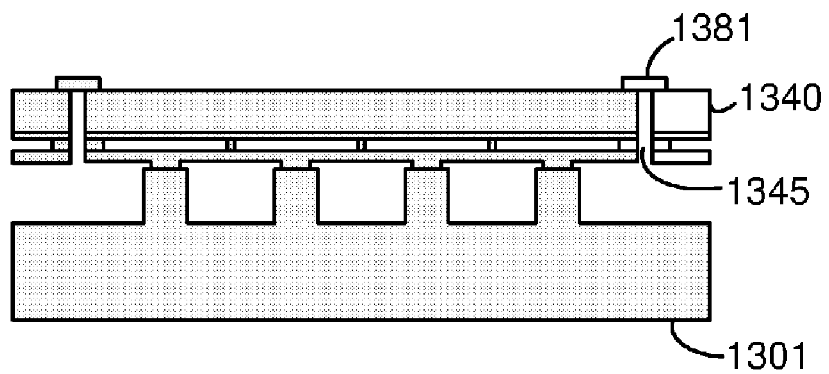
FIG. 13.10
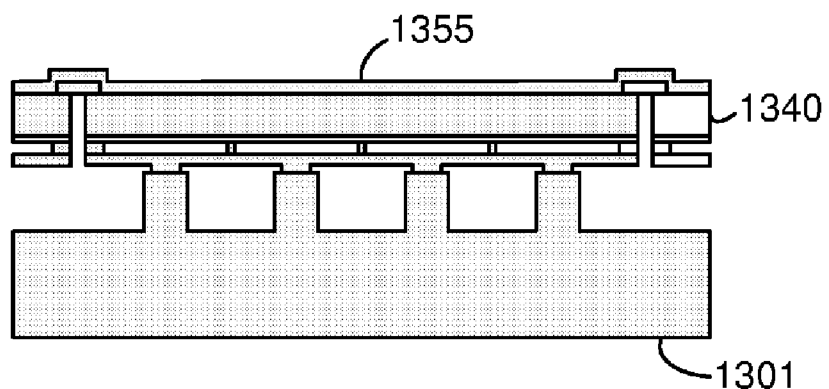

FIG. 14.1
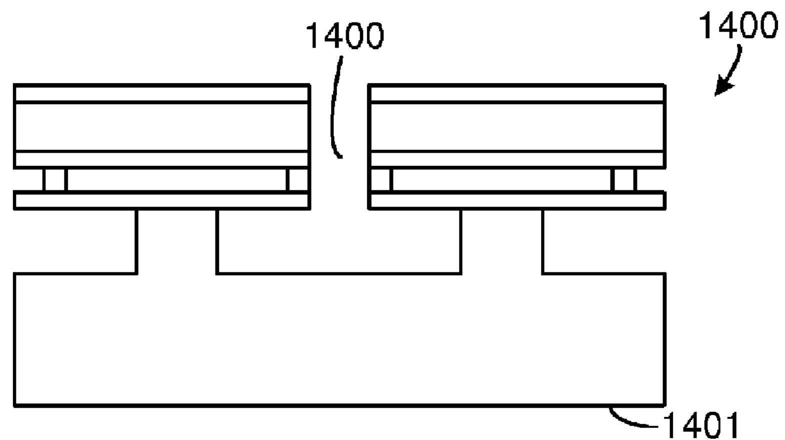
FIG. 14.2
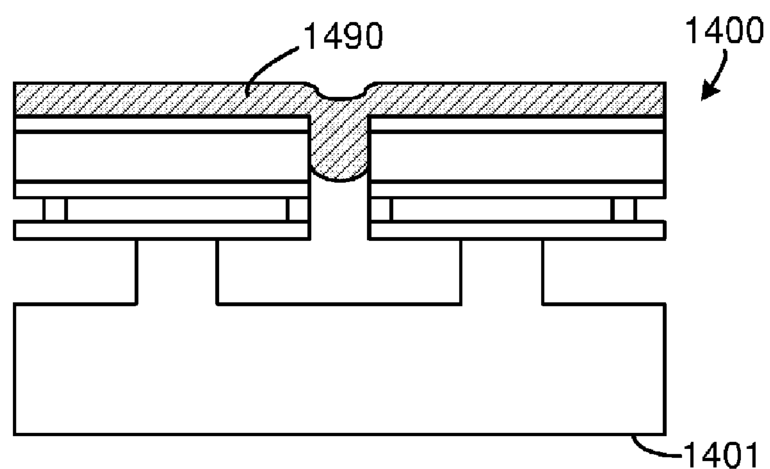
FIG. 14.3
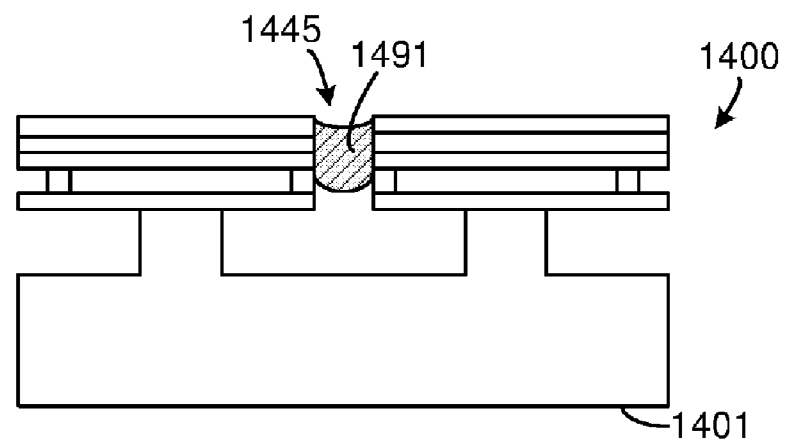

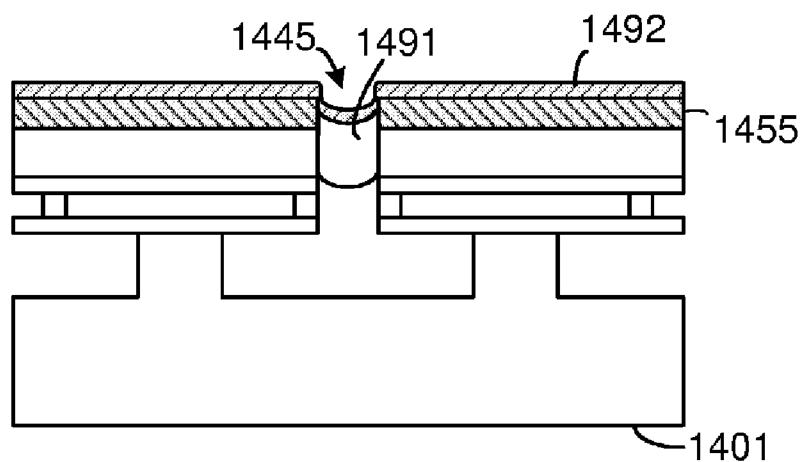
FIG. 14.4
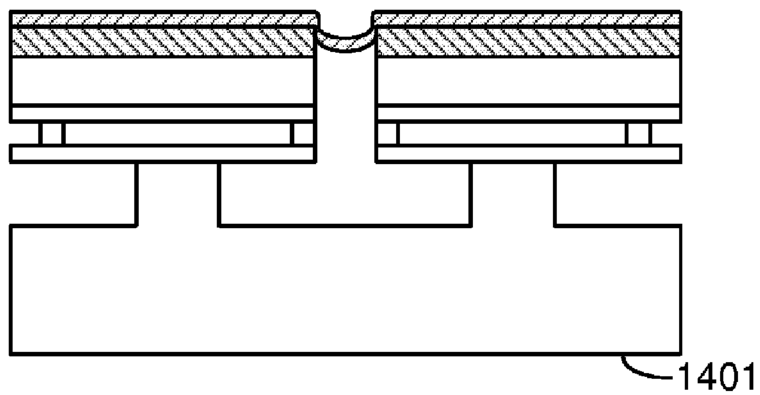
FIG. 14.5
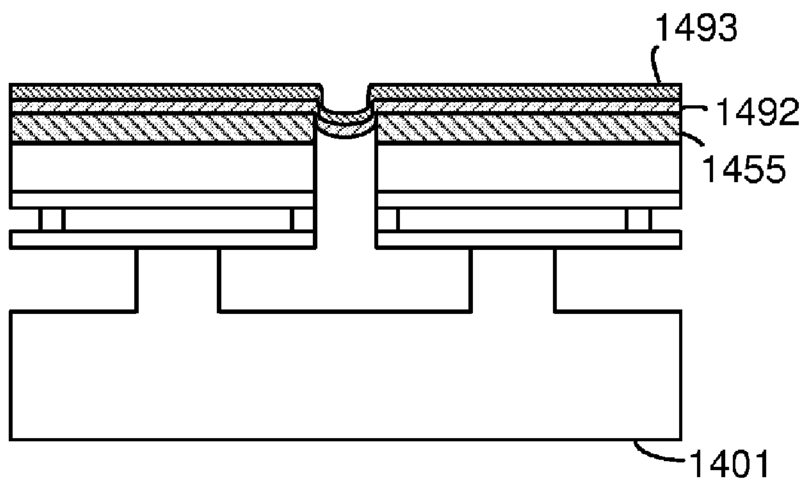
FIG. 14.6

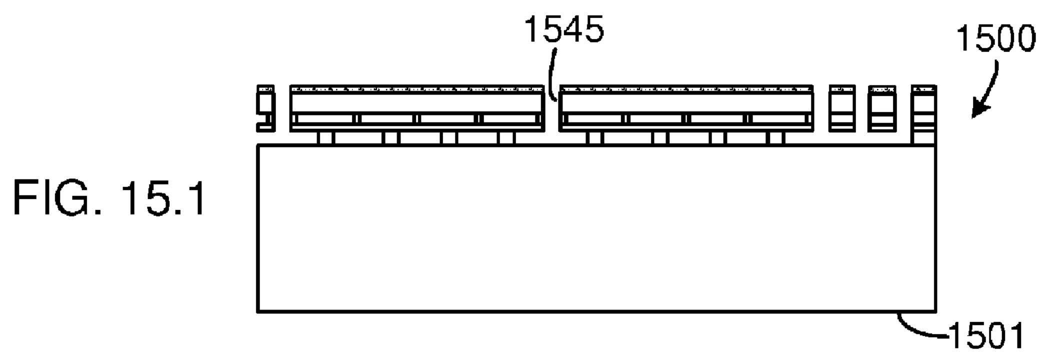
1545
1500
FIG. 15.1
1501
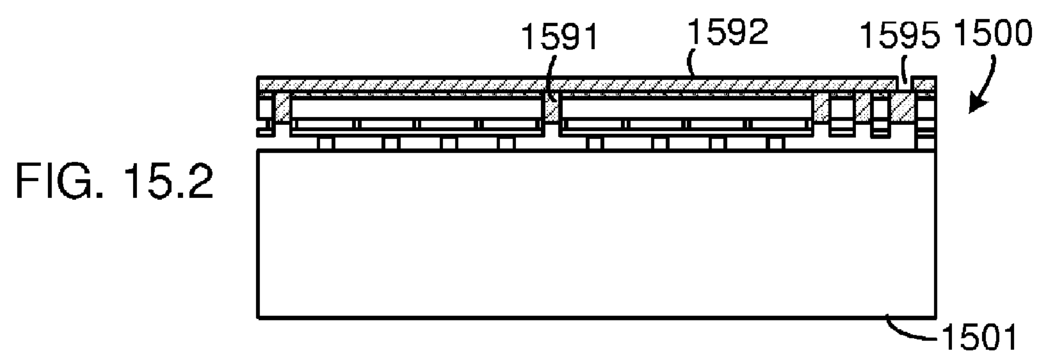
1591
1592
1595
1500
FIG. 15.2
1501
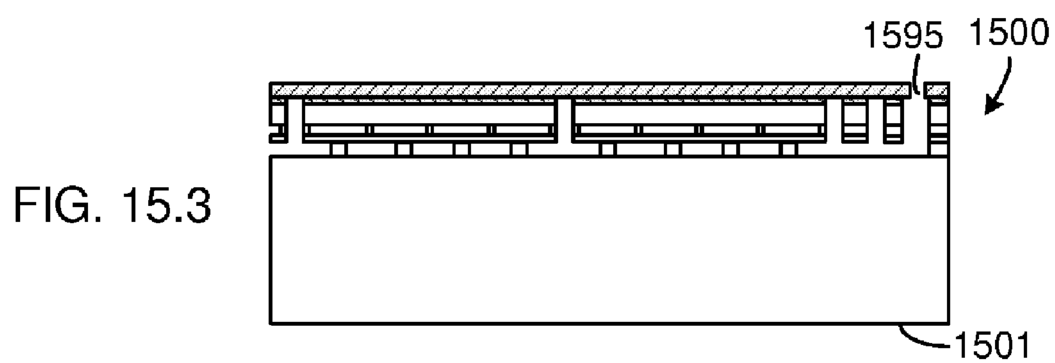
1595
1500
FIG. 15.3
1501
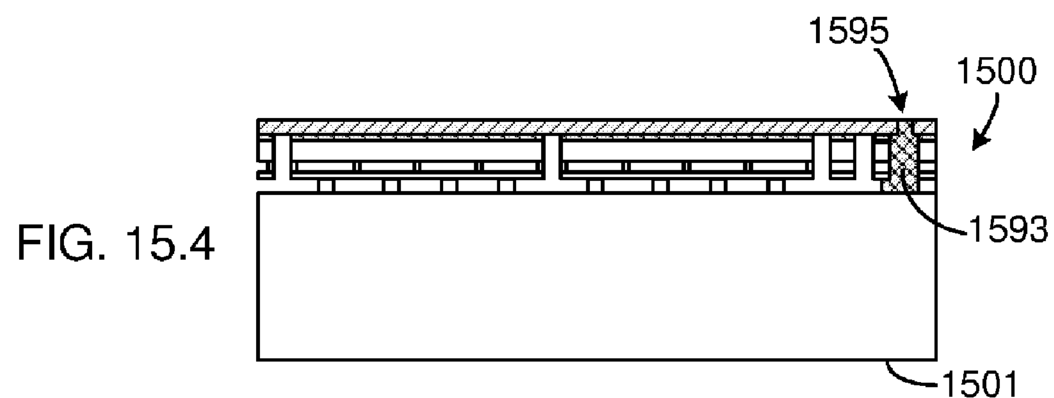
1595
1500
1593
FIG. 15.4
1501

FIG. 16.1
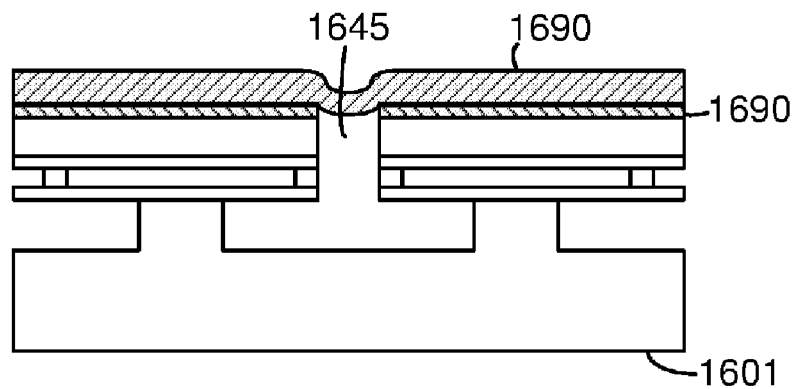
FIG. 16.2
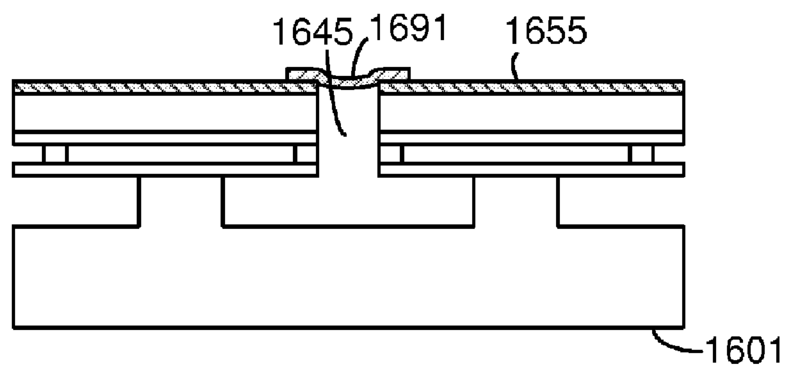
FIG. 16.3
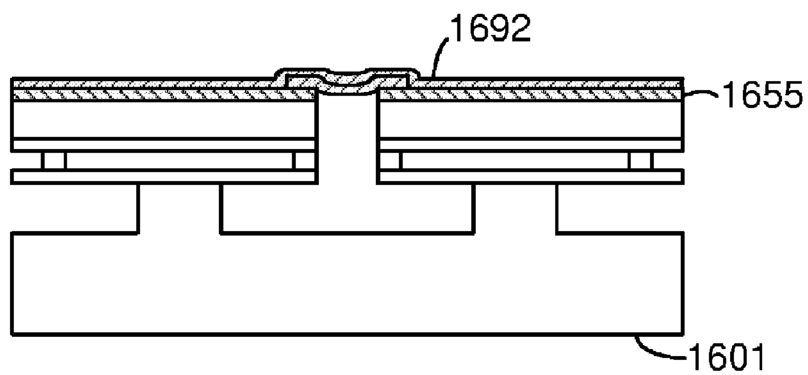
FIG. 16.4
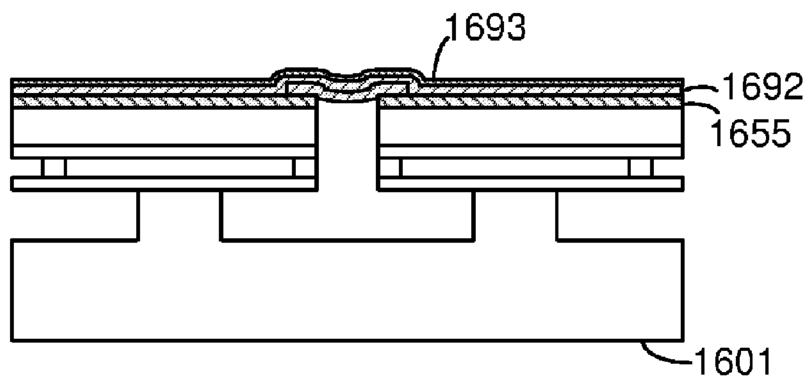

FIG. 17.1
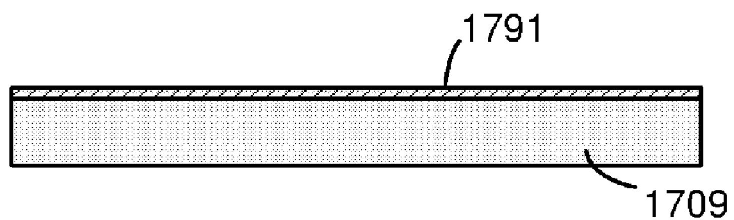
FIG. 17.2
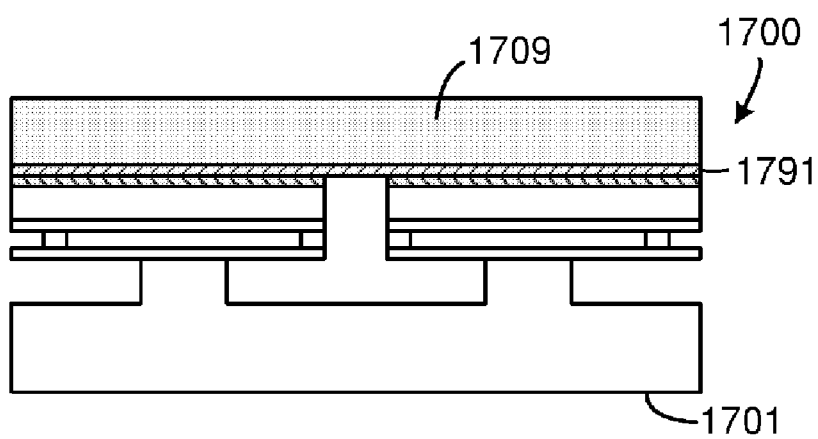
FIG. 17.3
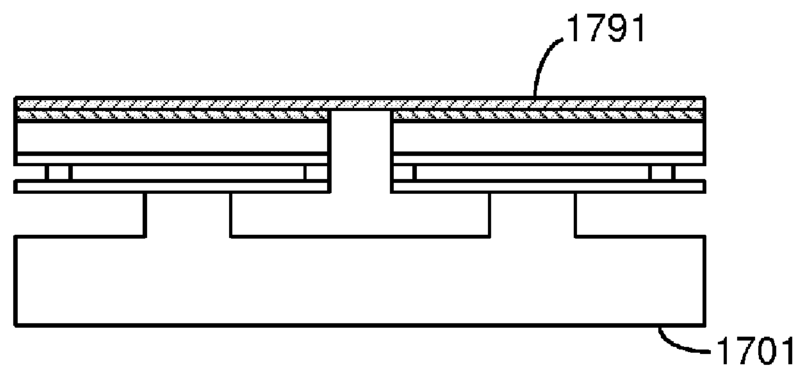
FIG. 17.4
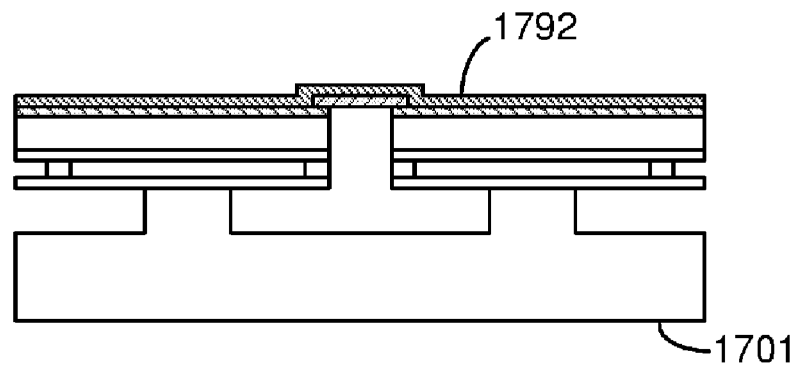

FIG. 18.1
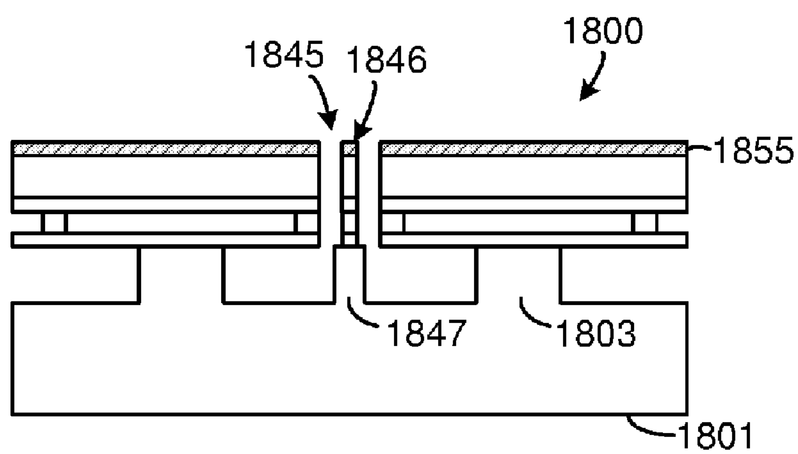
FIG. 18.2
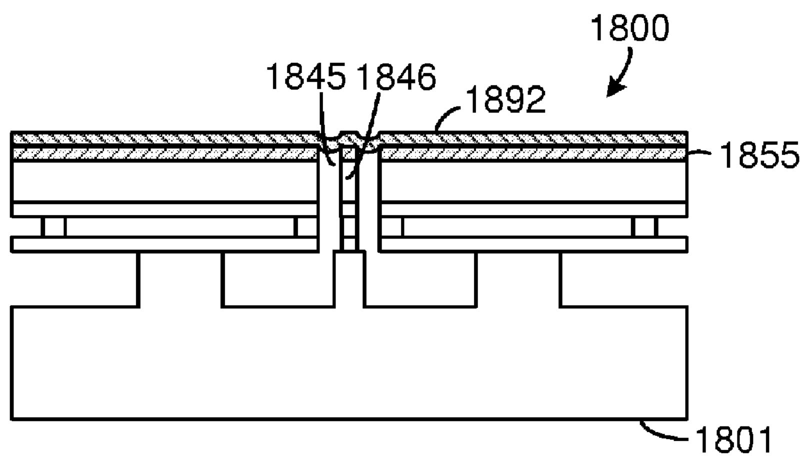
FIG. 19.1
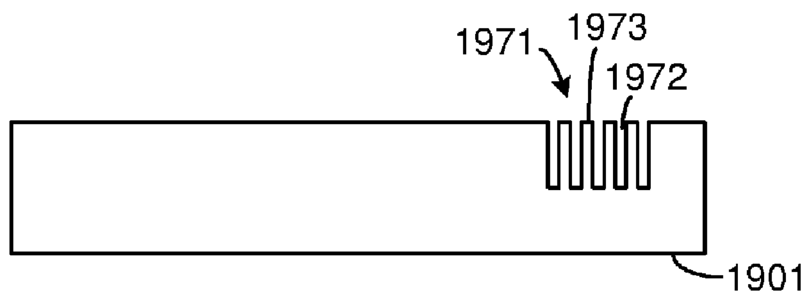
FIG. 19.2
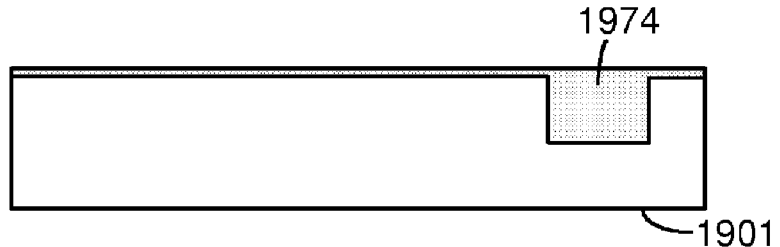

FIG. 19.3
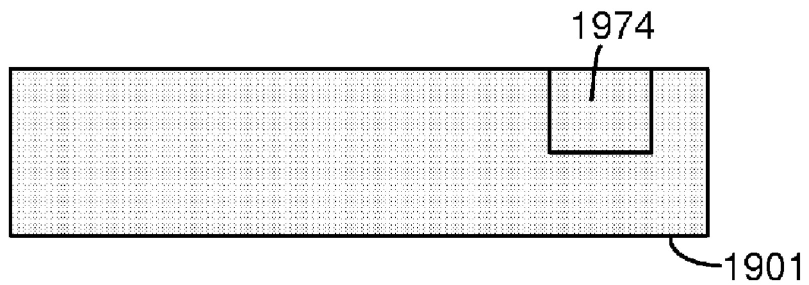
FIG. 19.4
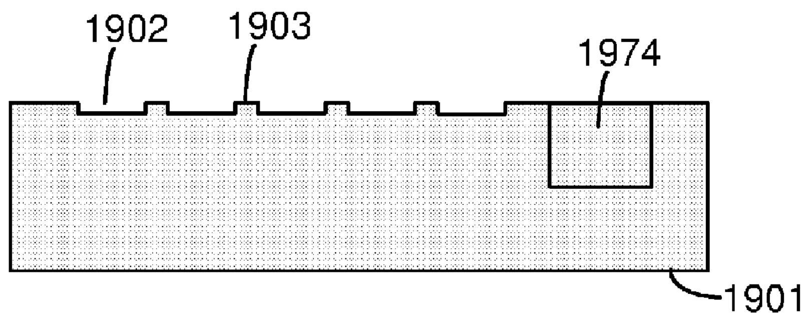
FIG. 19.5
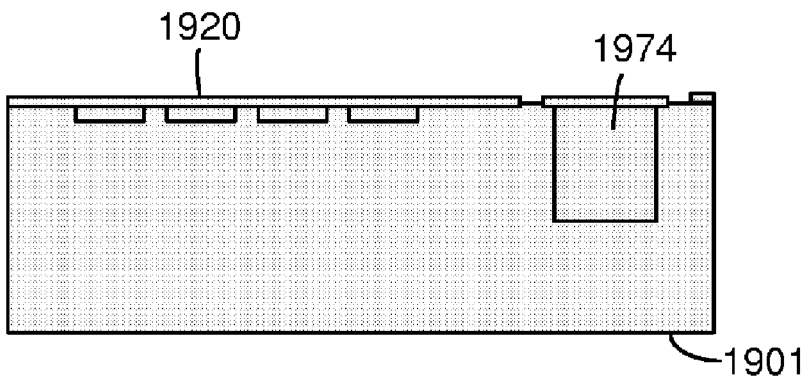
FIG. 19.6
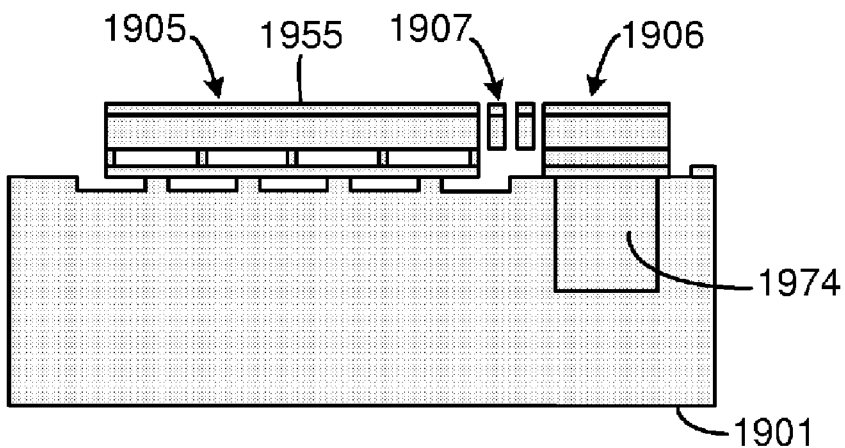

FIG. 20.1
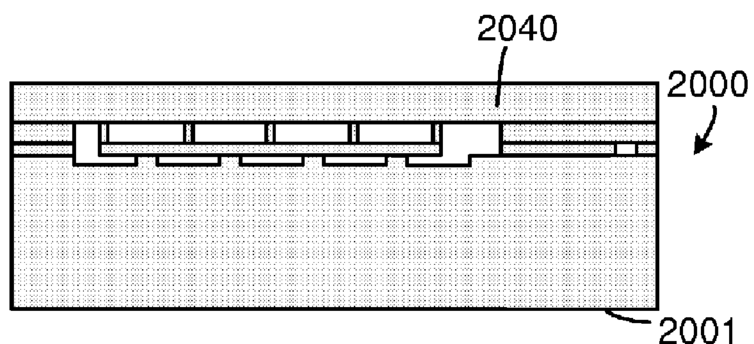
FIG. 20.2
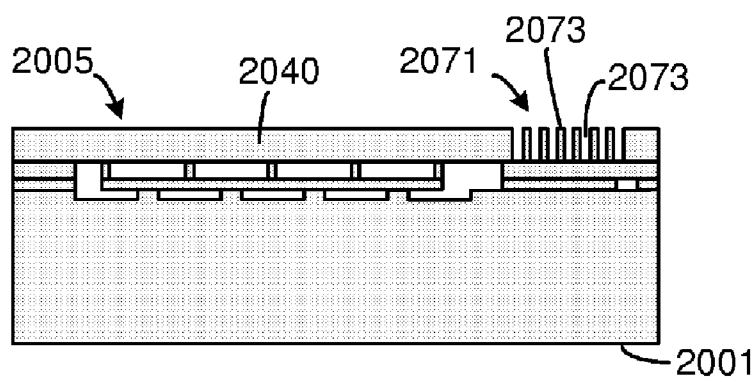
FIG. 20.3
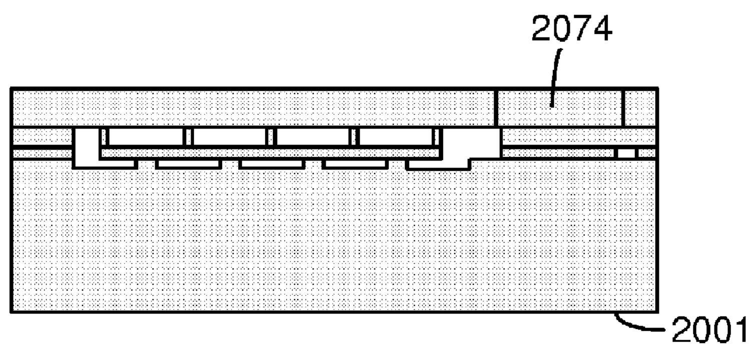
FIG. 20.4
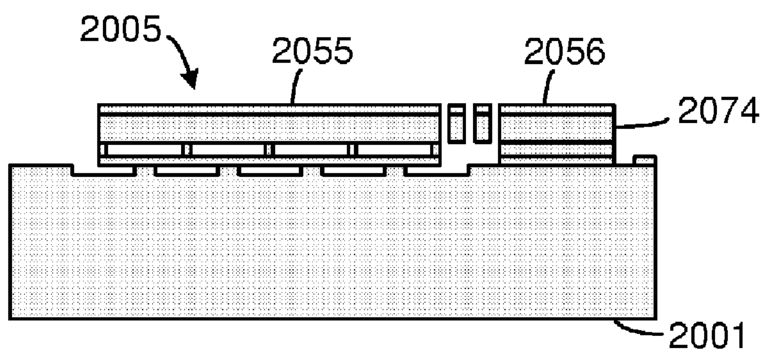

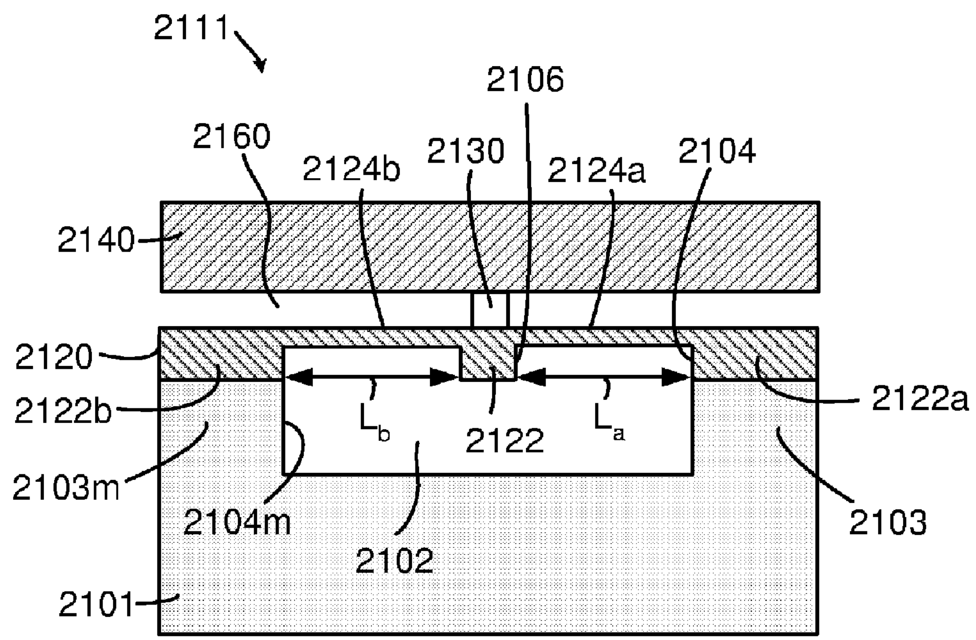
FIG. 21
FIG. 22.1
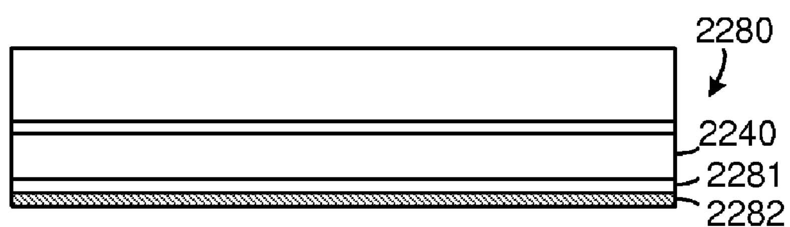
FIG. 22.2
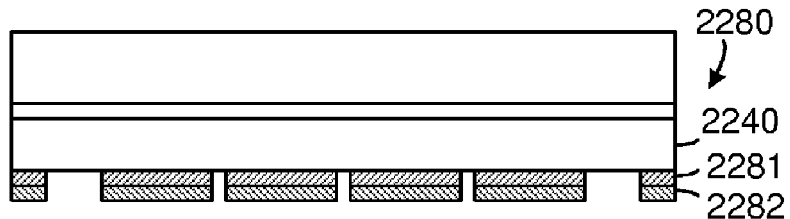

FIG. 22.3
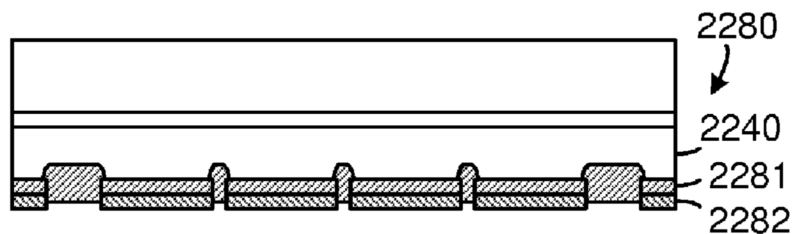
FIG. 22.4
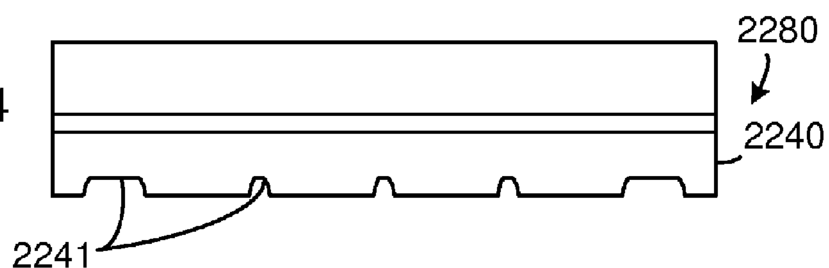
FIG. 22.5
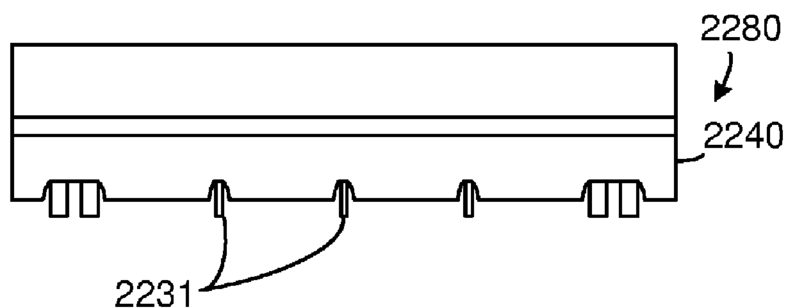
FIG. 22.6
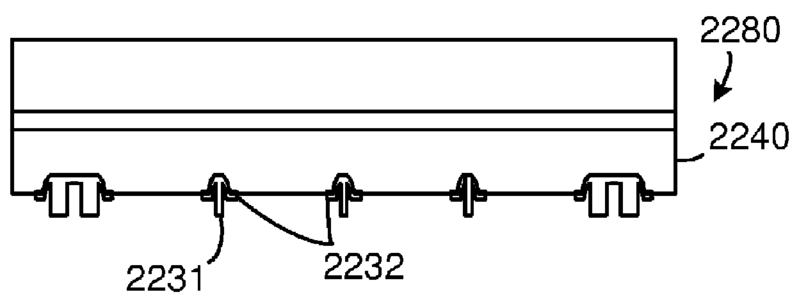

FIG. 22.7
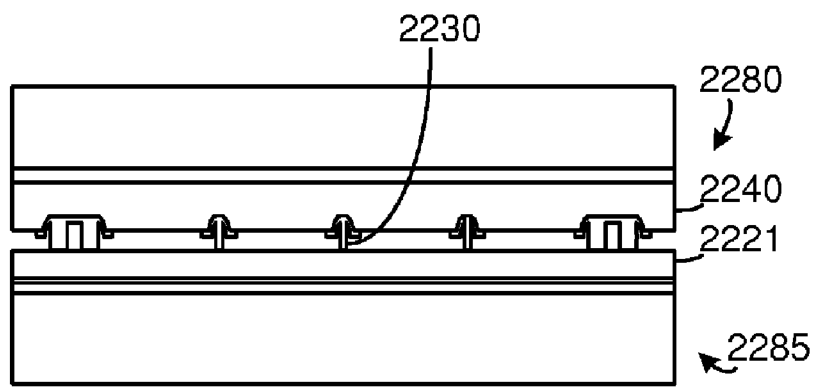
FIG. 22.8
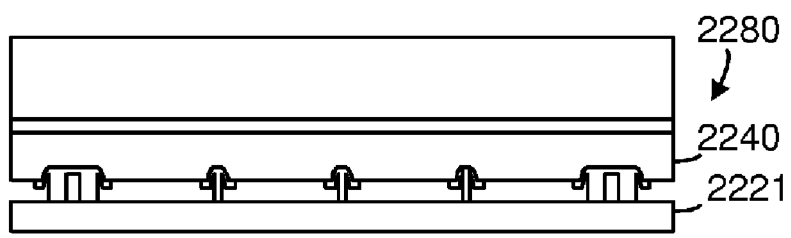
FIG. 22.9
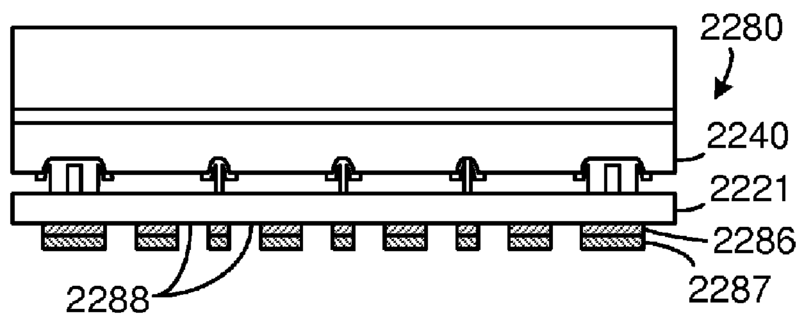
FIG. 22.10
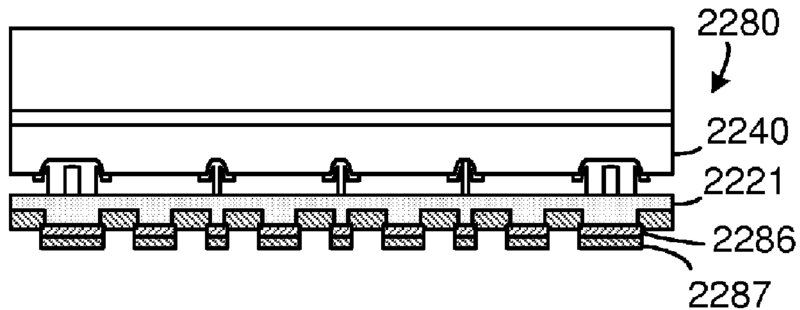

FIG. 22.11
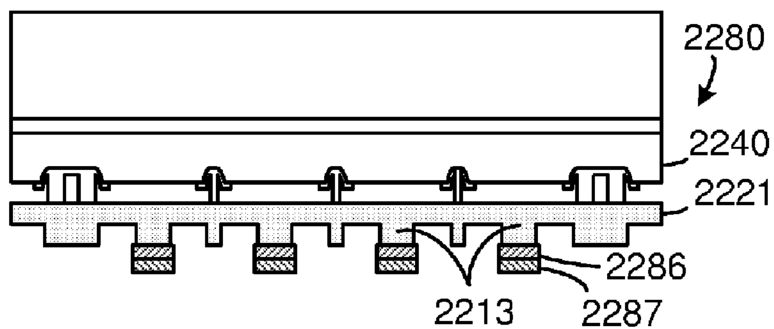
FIG. 22.12
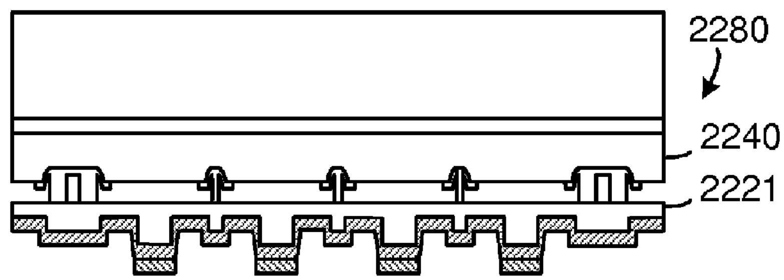
FIG. 22.13
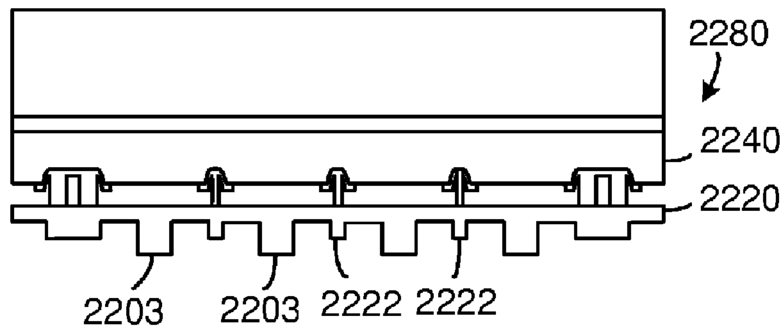
FIG. 22.14A
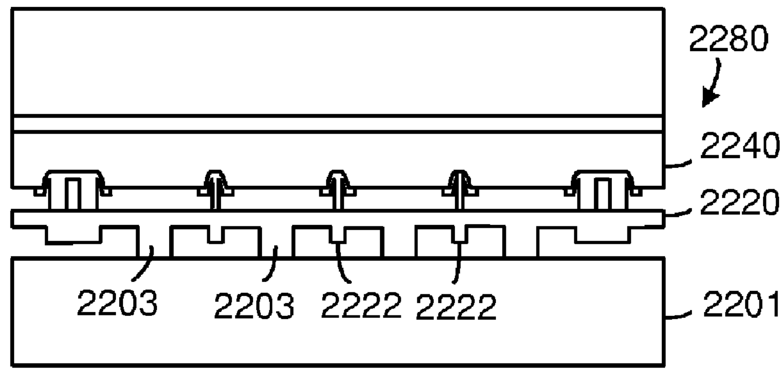

FIG. 22.15
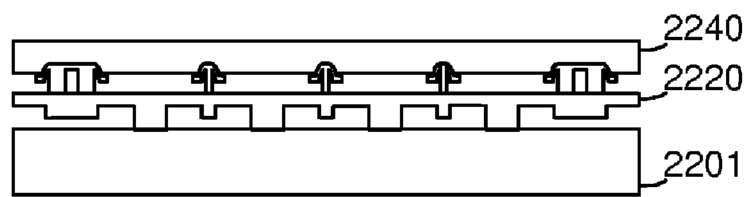
FIG. 22.16
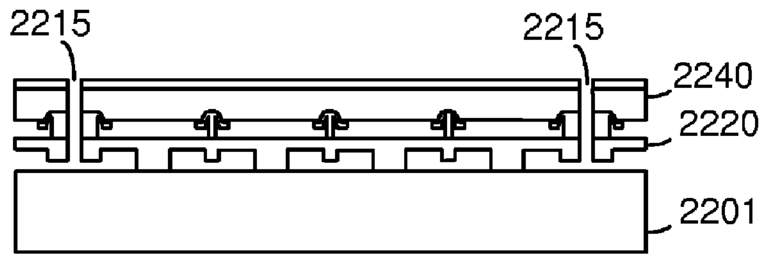
FIG. 22.14B
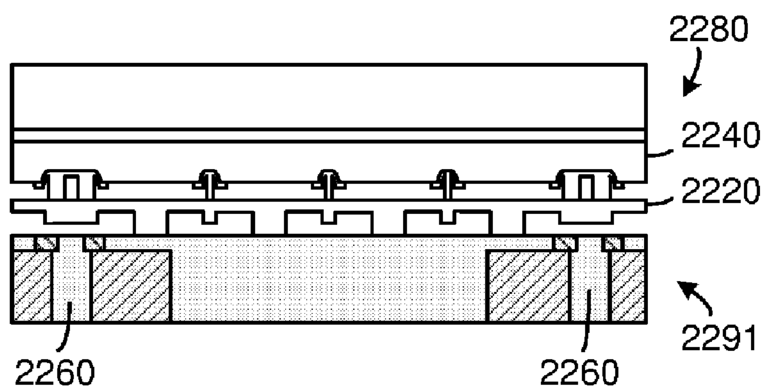
FIG. 22.14C
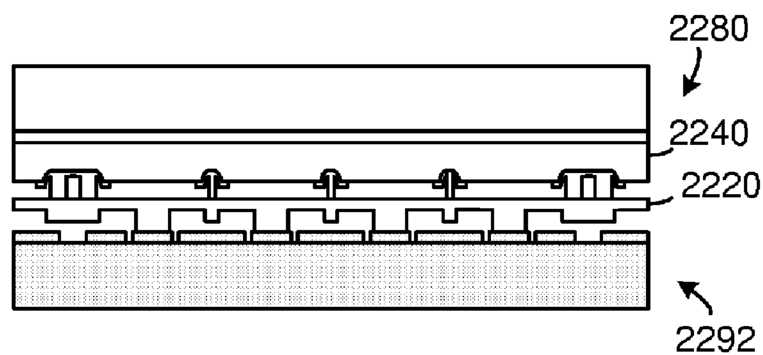

FIG. 22.14D
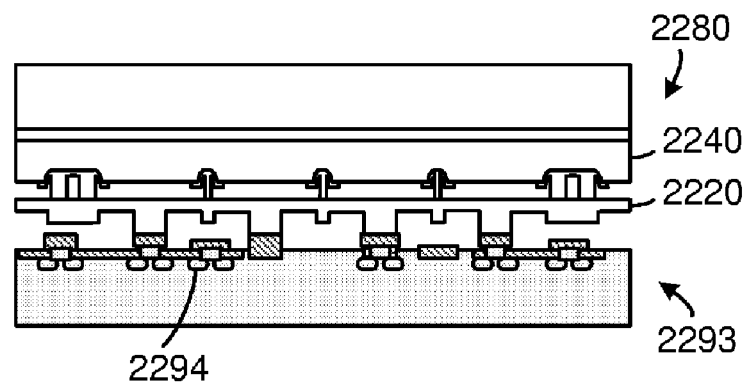
FIG. 22.5a
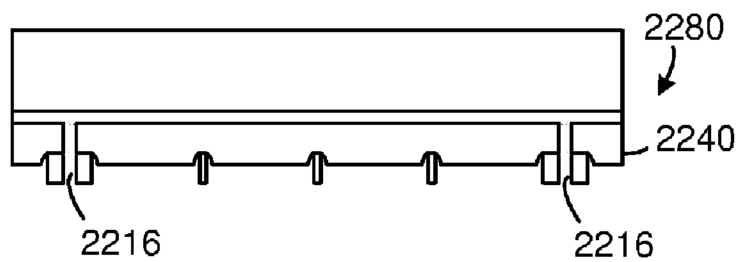
FIG. 22.5b
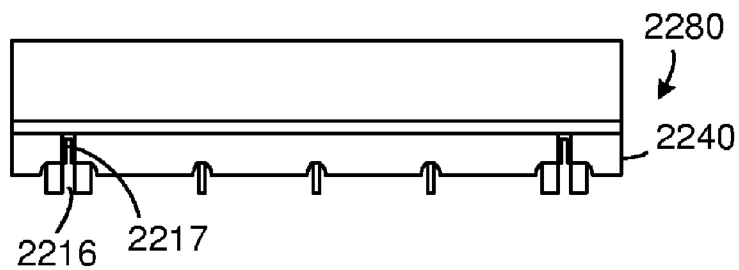
FIG. 23.1
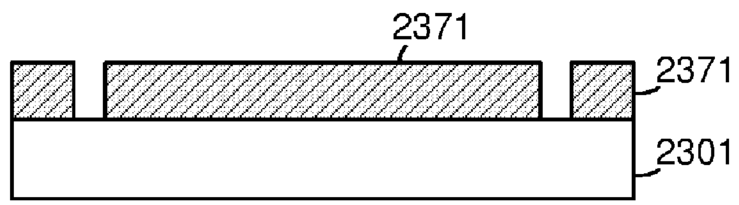
FIG. 23.2
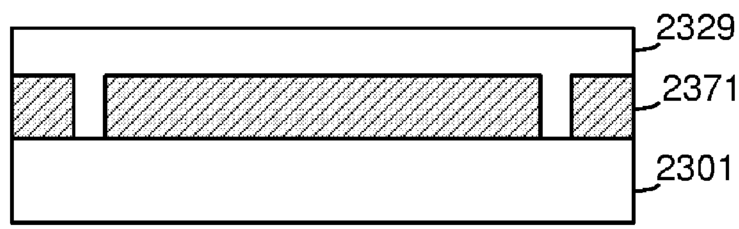

FIG. 23.3
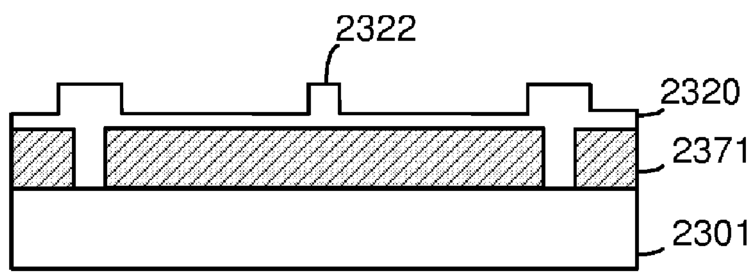
FIG. 23.4
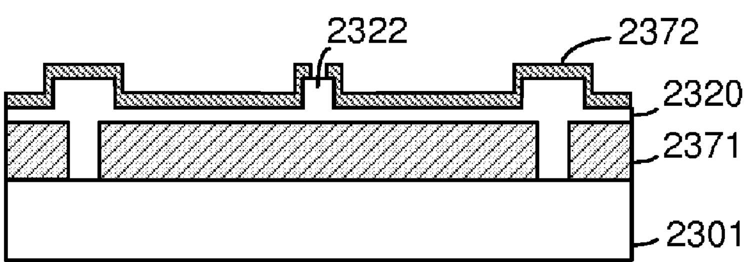
FIG. 23.5
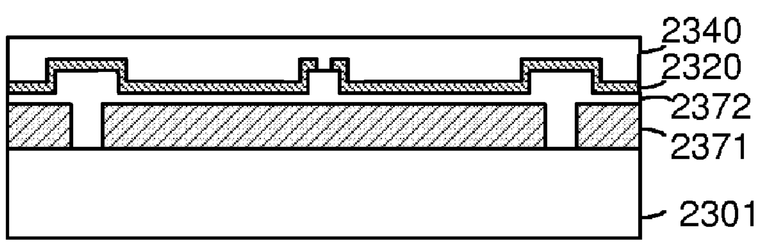
FIG. 23.6
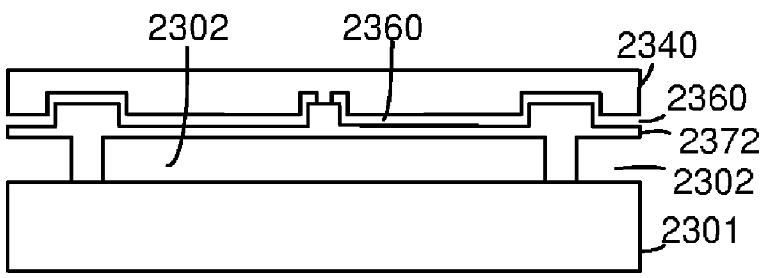
FIG. 23.7
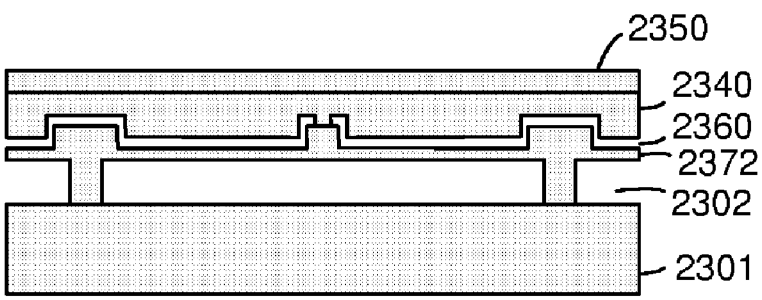

METHODS FOR FABRICATING MICRO-ELECTRO-MECHANICAL DEVICES

RELATED APPLICATIONS

This application is a national stage application of International Application PCT/IB2006/051567, claiming priority from U.S. Provisional Application Ser. No. 60/682,619, filed May 18, 2005; Ser. No. 60/692,038, filed Jun. 17, 2005; Ser. No. 60/705,606, filed Aug. 3, 2005; and Ser. No. 60/744,242, filed Apr. 4, 2006, which applications are incorporated herein by reference in their entirety.

This application further incorporates herein by reference in entirety the following:

International Application (PCT) PCT/IB2006/051566, entitled THROUGH-WAFER INTERCONNECTION, filed on May 18, 2006;

International Application (PCT), PCT/IB2006/051568, entitled MICRO-ELECTRO-MECHANICAL TRANSDUCERS, filed on May 18, 2006; and International Application (PCT), PCT/IB2006/051569, entitled MICRO-ELECTRO-MECHANICAL TRANSDUCERS, filed on May 18, 2006.

FIELD OF THE INVENTION

The present invention relates to microelectronics fabrication, and more particularly to methods for fabricating micro-electro-mechanical devices, such as micromachined ultrasonic transducers (MUT), that have a movable mechanical part for energy transformation.

BACKGROUND OF THE INVENTION

Micro-Electro-Mechanical Systems (MEMS) is the integration of mechanical elements, sensors, actuators, and electronics on a common substrate (typically a silicon substrate) through micro fabrication technology. MEMS promises to bring together silicon-based microelectronics with micromachining technology, making possible the realization of complete systems-on-a-chip. The prospect of making microsensors and micro actuators using well-developed and highly efficient semiconductor fabrication technology is a powerful argument for MEMS.

A MEMS device generally has two major components integrated together. The first component is the electronics which are fabricated using usual integrated circuit (IC) processes (e.g., CMOS, Bipolar, or BICMOS processes), while the second component is the micromechanical parts which are fabricated using compatible micromachining processes. Micromachining refers to the fabrication process to make microscopic structures using selective adding tools (deposition, bonding, injection etc.) and subtracting tools (chemical etching, plasma etching, laser ablation, ion-milling). When combined with patterning tools, the available adding tools and subtracting tools make micromachining a powerful method to create exciting new micro devices.

One example of MEMS devices is micromachined ultrasonic transducers (MUT). An ultrasound transducer performs a chain of energy transformation to realize its function of a transducer. In its receiving mode, the acoustic energy of ultrasound waves propagating in a medium where the transducer is placed is transformed to mechanical energy of a movable part (conventionally a vibrating membrane) in the transducer. The motion of the movable part is then transformed to a detectable electromagnetic (usually electrical) signal. In its transmitter mode, the reverse chain of energy transformation takes place.

Various types of ultrasonic transducers have been developed for transmitting and receiving ultrasound waves. Ultrasonic transducers can operate in a variety of media including liquids, solids and gas. These transducers are commonly used for medical imaging for diagnostics and therapy, biochemical imaging, non-destructive evaluation of materials, sonar, communication, proximity sensors, gas flow measurements, in-situ process monitoring, acoustic microscopy, underwater sensing and imaging, and many others. In addition to discrete ultrasound transducers, ultrasound transducer arrays containing multiple transducers have been also developed. For example, two-dimensional arrays of ultrasound transducers are developed for imaging applications.

Compared to the widely used piezoelectric (PZT) ultrasound transducer, the MUT has advantages in device fabrication method, bandwidth and operation temperature. For example, making arrays of conventional PZT transducers involves dicing and connecting individual piezoelectric elements. This process is fraught with difficulties and high expenses, not to mention the large input impedance mismatch problem presented by such elements to transmit/receiving electronics. In comparison, the micromachining techniques used in fabricating MUTs are much more capable in making such arrays. In terms of performance, the MUT demonstrates a dynamic performance comparable to that of PZT transducers. For these reasons, the MUT is becoming an attractive alternative to the piezoelectric (PZT) ultrasound transducers.

Among the several types of MUTs, the capacitive micromachined ultrasonic transducer (cMUT), which uses electrostatic transducers, is widely used. Other MUTs using piezoelectric (pMUT) and magnetic (mMUT) transducers are also adopted.

FIG. 1 shows a cross-sectional view of a basic structure of a prior art cMUT having multiple cells. Four cells are shown. The cMUT is built on a substrate 10 and has a parallel plate capacitor consisting of a rigid bottom electrode 12 and a top electrode 14 residing on or within a flexible membrane 16 that is used to transmit or receive an acoustic wave in the adjacent medium. The flexible membrane 16 in each cell is supported by the insulation wall or posts 18. In practice, a cMUT is made of many cells all connected in parallel. A DC bias voltage is applied between the electrodes 12 and 14 to deflect the membrane 16 to an optimal position for cMUT operation, usually with the goal of maximizing sensitivity and bandwidth. During transmission an AC signal is applied to the transducer. The alternating electrostatic force between the top electrode and the bottom electrode actuates the membrane 16 in order to deliver acoustic energy into the medium (not shown) surrounding the cMUT. During reception the impinging acoustic wave vibrates the membrane 16, thus altering the capacitance between the two electrodes. An electronic circuit detects this capacitance change. Alternatively the membrane 16 can be actuated and the displacement of the membranes detected using piezoelectric (pMUT) and magnetic (mMUT) transducers.

Methods of fabrication for making a cMUT shown in FIG. 1 have been developed. Exemplary methods are disclosed in U.S. Pat. Nos. 6,632,178 and 6, 958,255.

There are drawbacks in the cMUTs of the prior art structures and methods. Many of these drawbacks relate to the fact that the cMUTs are made of many individual cells and the cMUT membranes are clamped or fixed on their edges. Examples of the drawbacks Are listed below.

(1) The average displacement of the membranes is small because of the clamped edges. As a result both the device transmission and reception performance are poor.

(2) Surface areas occupied by the clamped areas (e.g., edges) and the walls or posts are non-active, and this reduces the device fill factor and the overall efficiency.

(3) Anchor areas introduce a parasitic capacitance which decreases the device sensitivity.

(4) The anchor pattern within the surface of the cMUT element may cause ultrasonic wave interference which limits the device bandwidth.

(5) The non-uniform displacement of the membrane may disturb the ultrasonic wave pattern. For example, the non-uniform displacement may affect the ultrasonic beam pattern emitted from the transducer surface and also cause acoustic cross coupling through the transducer surface.

(6) The resonant frequencies of individual cells in the same cMUT element may be different between each other because of the process variation. This causes phase differences of the membrane motion among different cells in the same cMUT element during operation. As a result, the sum of the average displacement of the cMUT element may degrade dramatically. This problem degrades the device performance especially when the cMUT works in a high quality factor (Q-factor) condition, for example in air.

(7) The acoustic energy can couple into the transducer substrate through supporting walls and cause undesired effects such as acoustic cross coupling between the cMUT elements. An effort to reduce the cross-coupling through the substrate by introducing materials with desired acoustic properties may require occupation of extra space between elements.

The above problems also exist in the pMUT and mMUT of the prior art since they have a similar structure as the cMUT as shown in FIG. 1.

Another method of fabrication for making a cMUT device having a compliant support structure built on the substrate to support the membrane is disclosed in the U.S. Pat. No. 7,030,536. Compared to the conventional cMUT structure shown in FIG. 1, the structure disclosed in U.S. Pat. No. 7,030,536 uses a compliant support structure in place of the conventional insulation wall 18 for fastening perimeter ends of the membrane 16. Because a relatively complex compliant support structure takes the place of the simple and narrow insulation wall 18 in FIG. 1 to become the supporting peripherals, there would be a heightened challenge to make the inactive areas occupied by these peripheral support structures according to that design. That patent further suggests making supplemental electrodes on the compliant support structures to reduce the inactive areas occupied by the compliant support structures. There is however no indication that such a design would solve the above identified problems, or whether it even works at all.

In general, MUTs described above belong to a type of MEMS devices that have a movable mechanical part for energy transformation. Fabrication of such a movable part and its integration with the other aspects of MEMS fabrication poses a challenge. Due to the importance of these MEMS devices such as MUTs, it is desirable to improve the technology in terms of performance, functionality, and manufacturability.

SUMMARY OF THE INVENTION

This application discloses a method for fabricating a micro-electro-mechanical device that has a movable mechanical part to transform energy for various applications. The method makes a multilayered structure having a substrate wafer, a middle spring layer and a top plate. A cavity is formed on either the top of the substrate wafer or the bottom of the middle spring layer. A connector is formed on either the top of the middle spring layer or the bottom of the top plate. The substrate wafer, the middle spring layer and the top plate are joined together in that order. Upon joining the layers, the connector stands out from the middle spring layer to define a transducing space between the top plate and the middle spring layer. The connector is also horizontally distanced from the sidewall of the cavity by a sufficient length to define a cantilever anchored at the sidewall. The cantilever and the cavity allow a vertical displacement of the connector, which transports the top wafer in a piston-like motion to change the transducing space.

In one embodiment, the middle spring layer is anchored at two opposing side walls of the cavity to cover the cavity. The connector on the middle spring layer is above the cavity and away from both opposing side walls to form a bridge which can be viewed as a head-to-head double cantilever. In a more efficient configuration, area or plane springs (two-dimensional "cantilevers"), instead of beam-like one-dimensional cantilevers, are formed from the middle spring layer.

The methods utilize wafer-bonding technology, surface micromachining sacrificial layer technique to achieve versatility and high-level integration with semiconductor manufacturing processes. A broad range of micro-electro-mechanical devices having a movable mechanical part to transform energy can be fabricated using the methods. Such devices include but are not limited to micromachined ultrasonic transducers (MUT) such as capacitance micromachined ultrasonic transducers (cMUT), piezoelectric micromachined ultrasonic transducers (pMUT) and magnetic micromachined ultrasonic transducers (mMUT). Methods are particularly adapted to fabricating micro-electro-mechanical devices of a unique "embedded spring" design which is the subject of disclosure several patent applications identified herein filed by the common applicant on even date.

According to the first embodiment of the fabrication method of the present invention, a micro-electro-mechanical device is fabricated by using the steps of: (1) providing a substrate wafer, a middle spring layer and a top plate layer; (2) forming at least one cavity on either a front side of a substrate wafer or a bottom side of the middle spring layer, wherein each cavity has at least one sidewall having a top surface; (3) forming at least one connector of a desired height on either a top side of a middle spring layer or a bottom side of a top plate layer; (4) forming or effectuating a transducing member on the top plate layer; and (5) joining the substrate wafer, the middle spring layer and the top plate such that the bottom side of the top plate faces the top side of the middle spring layer and a bottom side of the middle spring layer faces the front side of the substrate.

Upon joining, the connector stands out from the middle spring layer to define a transducing space between the top plate and the top surface of the sidewall, and the connector is horizontally distanced from the sidewall of the cavity by a sufficient length to define a cantilever anchored at the sidewall with an exerting end at the connector. The cantilever and the cavity enable a vertical displacement of the connector to transport the top plate layer substantially vertically with a piston-like motion to change the transducing space and activate the transducing member.

The steps of forming cavities and connectors may be accomplished using a variety of techniques, such as by directly removing or adding materials according to a desired pattern, by introducing and subsequently removing a sacrificial layer, or a combination of these two techniques.

The step of joining the substrate wafer, the middle spring layer and the top plate may be accomplished in various combinations and sequences as long as the final structure has the substrate wafer at the bottom, the middle spring layer in the middle and the top plate at the top. For example, the middle spring layer may be first placed on top of the substrate wafer to cover the first cavity; the connector may be then formed on the top side of the middle spring layer after the middle spring layer has been joined with the substrate wafer; and the top plate may be then placed over the connector after the middle spring layer with the connector formed thereon has been joined with the substrate wafer. Alternatively, the connector may be first formed on the bottom side of the top plate, the middle spring layer then placed over the connector, and the top plate and the middle spring layer are finally placed on top of the substrate wafer to cover the first cavity.

A transducing member may be formed in the micro-electro-mechanical device to achieve energy transformation through vertical transportation of the top plate or a change of the transducing space. In the case of a micromachined ultrasonic transducer, an ultrasonic transducing member may be formed on at least one of the top plate, the middle spring layer, and the substrate wafer. For a capacitance micromachined ultrasonic transducer (cMUT), for example, a top electrode may be built in or on the top plate and a bottom electrode in or on the middle spring layer or the substrate wafer. In a particular embodiment, the substrate wafer is conductive and functions as a built-in bottom electrode.

In general, the middle spring layer is desirably an elastic thin membrane and the top plate is significantly more rigid than the middle spring layer.

The specific steps of layer bonding, cavity forming and connector forming may be accomplished using a variety of techniques and many combinations thereof. For example, wafer-bonding techniques using silicon-on-insulator (SOI) wafers may be used for bonding layers together and, when used in connection with an etching or micromachining technique, for transferring a thin layer from one wafer to another as well. Sacrificial layer technology is also used in combination of other techniques in the methods.

The method can generally be used for making multiple device elements on the same wafer. Each device element itself may have multiple connectors and cantilevers. According to one aspect of the methods, multiple cavities and multiple connectors are formed using the same wafer. The connectors are disposed at different locations across the wafer. A variety of distribution patterns may be used to achieve special or optimal effects.

According to one aspect of the methods, a separation trench is formed through at least the top plate to separate a plurality of micro-electro-mechanical elements from one another. Each element has at least one cantilever, more preferably at least one bridge type double cantilever or plane spring.

Other aspects of the methods relate to interconnection of multiple micro-electro-mechanical elements, trench sealing between the elements, and reduction of parasitic capacitance on electrical interface pads of the elements. In one of the exemplary embodiment, each element is electrically connected to an inter-element connection anchor. The anchor is desirably separated and unaffected by movement of the cantilevers and the top plate. In one embodiment, the plurality of elements are arranged in an array with minimal separation therebetween, and each element are electrically connected to an inter-element connection anchor located at a corner or edge shared by at least two neighboring elements. Various interconnection schemes may be used for different element-addressing purposes. Sealing between the elements may be done using a sealing material either before or after joining the substrate wafer, the middle spring layer and a top plate.

According to one aspect of the invention, the substrate wafer is a conductive wafer, and the method further includes the following steps performed before joining the substrate wafer to the top plate to reduce parasitic capacitance of an interconnection pad by increasing thickness of an insulator under the interconnection pad: (1) forming an insulation cavity on the substrate wafer, wherein the patterned cavity has a desired overall thickness and is located at a position suitable for forming an interconnection pad for a nearby micro-electro-mechanical element of the micro-electro-mechanical device being fabricated; (2) filling the insulation cavity with a dielectric material to form an embedded insulator having the same thickness of the overall thickness of the patterned cavity; and (3) forming an electric interconnection pad over top of the embedded insulator.

According to another aspect of the invention, the following steps may be performed before joining the substrate wafer to the top plate to reduce parasitic capacitance of an interconnection pad by increasing thickness of an insulator under the interconnection pad: (1) forming a patterned cavity on the substrate wafer, wherein the patterned cavity has narrow passages interlined with solid lines of unremoved native material of the substrate, and the patterned cavity has a desired overall thickness and is located at a position suitable for forming an interconnection pad for a nearby micro-electro-mechanical element of the micro-electro-mechanical device being fabricated; (2) oxidizing the solid lines of unremoved native material in the patterned cavity to form an embedded insulator having the same thickness of the overall thickness of the patterned cavity; and (3) forming an electric interconnection pad over top of the embedded insulator.

The above method may be similarly applied to the top plate instead of the substrate wafer. According to this alternative method to reduce parasitic capacitance of an interconnection pad, a patterned cavity is formed on the top plate to form a thick embedded insulator in the top plate in a manner similar to forming a thick embedded insulator in the substrate wafer.

According to the second embodiment of the fabrication method, a micro-electro-mechanical device is fabricated using the steps of: (1) providing a substrate wafer having a front side and a back side; (2) depositing a first sacrificial layer on the front side of the substrate wafer; (3) patterning the first sacrificial layer to form a first provisional cavity; (4) depositing a first thin film material over the first sacrificial layer to fill the first provisional cavity and to further form a membrane layer covering a top surface of the first sacrificial layer, wherein the membrane layer has at least one hole for access to the first sacrificial layer underneath; (5) depositing a second sacrificial layer on top of the membrane layer; (6) patterning the second sacrificial layer to form a second provisional cavity; (7) depositing a second thin film material to at least fill the second provisional cavity; (8) removing the first sacrificial layer and the second sacrificial layer to form a first cavity on top of the substrate wafer and a second cavity on top of the membrane layer, and (9) placing a top plate over the membrane layer.

The above procedure results in a structure similar to that formed by the first embodiment of the method. The structure has a cantilever anchored at the sidewall to allow a vertical displacement of a connector on the membrane layer, which is equivalent to the middle spring layer of the first embodiment of the method. The structure also has a transducing space between the top plate and the top surface of the sidewall, whereby the vertical displacement of the connector transports the top plate substantially vertically with a piston-like motion, thus changing the transducing space. Other aspects of the method, such as the formation of multiple cavities, multiple connectors, multiple cantilevers, multiple elements, trench separation, trench sealing and reduction of parasitic capacitance, can also be applied in combination of the second embodiment of the fabrication methods in accordance with the present invention.

The foregoing and other features and advantages will become more apparent from the following detailed description of several embodiments, which proceeds with reference to the accompanying figures.

BRIEF DESCRIPTION OF THE DRAWINGS

FIGS. 3.1-3.9 show an example of the fabrication method using wafer-bonding technology.

FIGS. 4.1-4.9 show a second example of the fabrication method using wafer-bonding technology.

FIGS. 5.1-5.9 show a third example of the fabrication method using wafer-bonding technology.

FIGS. 6.1-6.12 show an example of the fabrication method using sacrificial technology.

FIGS. 7.1-7.11 show an exemplary fabrication method combining the wafer-bonding and sacrificial technologies.

FIGS. 8.1-8.3 show process steps to separate the bottom electrodes of the cMUT elements using wafer-bonding technology.

FIGS. 9.1-9.2 show process steps to separate the bottom electrodes of the cMUT elements that use a thin conductive layer as the bottom electrodes.

FIGS. 12.1-12.4 show an example of the process for fabricating connections or interconnections after the primary fabrication process for making the micro-electro-mechanical device.

FIGS. 13.1-13.12 show an example of fabrication method which incorporates a trench sealing process during the normal device fabrication process.

FIGS. 14.1-14.6 show an example of fabrication method which incorporates a trench sealing process after the normal device fabrication process.

FIGS. 15.1-15.4 show the same process with vias included in the figures.

FIGS. 16.1-16.4 show another method to seal the trenches using materials with desired properties.

FIGS. 17.1-17.4 show a method to transfer a desired film from a handle wafer to a cMUT using wafer-bonding technique.

FIGS. 18.1-18.2 show a cMUT structure having a post in the trenches between the cMUT elements and the process of sealing such a trench.

FIGS. 19.1-19.6 show an example of the method to reduce parasitic capacitance of an interconnection pad by forming a thick insulator in a patterned cavity.

FIGS. 20.1-20.4 show another example of the method to reduce parasitic capacitance of an interconnection pad by forming a thick insulator in a patterned cavity.

FIG. 21 shows a cross-sectional view of a cMUT structure featuring self-aligned cantilevers.

FIGS. 22.1-22.16, including FIGS. 22.14A-22.14D and FIGS. 22.5*a*-22.5*b*, show a wafer-bonding process for fabricating a cMUT structure having self-alignment features.

FIGS. 23.1-23.7 show a surface micromachining process for fabricating a cMUT structure having self-alignment features.

DETAILED DESCRIPTION

Figure 1:
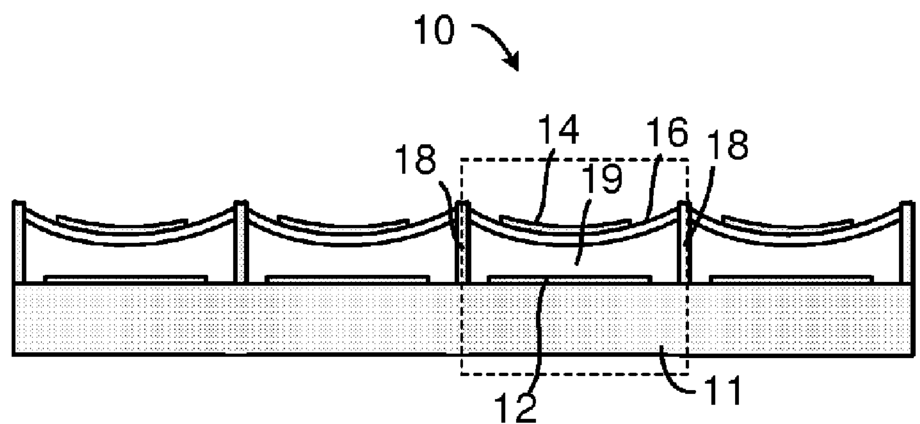
FIG. 1 shows a cross-sectional view of a basic structure of a prior art cMUT having multiple cells.

The method for fabricating a micro-electro-mechanical device such as a capacitance micromachined ultrasonic transducer (cMUT) will be described in detail along with the figures, in which like parts are denoted with like reference numerals or letters. The method of the present invention is particularly useful for fabricating a novel MUT design disclosed in several other patent applications identified herein, which are filed by a common applicant on even date.

The invention has been described below with reference to specific embodiments. In many cases, the novel MUT structures disclosed in the several other patent applications identified herein are used to illustrate the method of the present invention. It is appreciated, however, that the method of the present invention is not limited to fabricating the type of MUTs disclosed in those patent applications. The method can be used for fabricating a variety of micro-electro-mechanical devices that have a movable mechanical part to transform energy. It will be apparent to those skilled in the art that various modifications may be made and other embodiments can be used without departing from the broader scope of the inventions. Therefore, these and other variations upon the specific embodiments are intended to be covered by the present inventions. Those skilled in the art will recognize that various features disclosed in connection with the embodiments may be used either individually or jointly.

In order to illustrate the method of the present invention, the basic design of the novel cMUT structures disclosed in the several patent applications identified herein is first illustrated.

It is noted that the terms "transducer" and "transducing member" are used in a broad sense in this document to not only include devices that perform both actuation and sensing functions but also include devices that perform either an actuation function or an sensing function. It is also noted that the term "cantilever" is used in this description in a broad sense to describe a structure that has an anchored end, a resilient portion extending from the anchored, and to an exerting end to activate or move the resilient portion. A cantilever thus does not necessarily suggest a literal one-dimensional bema-like cantilever, but also includes similar structures have multibeams extending in different directions such as a bridge, or a crossbar, and most definitely also includes area or plane springs (two-dimensional "cantilevers") in which the anchored end is an extended line which may be a closed perimeter of an area or a portion thereof, the resilient portion is an extended area, and the exerting end may be a single point, a small area, or an extended line (close ended, open-ended, or segmented). In addition, the words "circular" and "annular" only suggest in the broadest sense that a shape has a looped form, a curved shape that is nearly looped, or an arrangement that is generally shaped like a ring, and do not suggest a rounded shape or any other shape in particular, nor does it suggest that the loop or ring is entirely complete or unbroken.

Figure 2A:
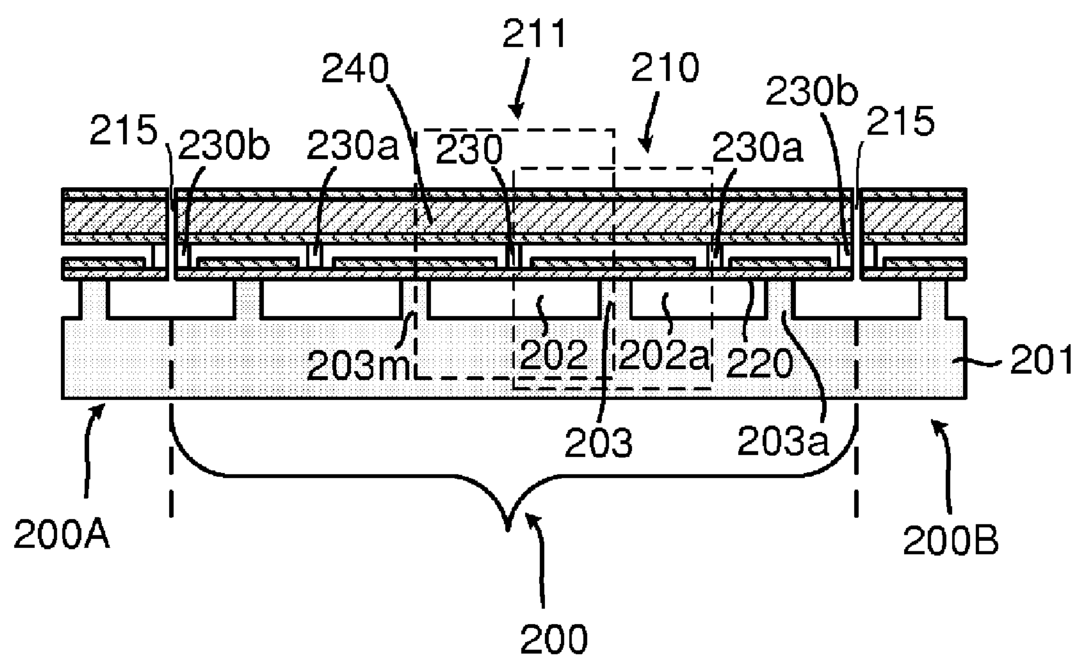
FIG. 2A is a cross-section view of a cMUT structure showing a complete cMUT element and parts of neighboring cMUT elements.

FIG. 2A is a cross-section view of a cMUT structure showing a complete cMUT element 200 and parts of neighboring cMUT elements 200A and 200B, one on each side. The cMUT structure is built on a substrate wafer 201 and also has a middle spring layer 220 and a top plate 240. The substrate wafer 201, the middle spring layer 220 and the top plate layer 240 are arranged from bottom to top in that order such that the bottom side of the top plate layer 240 faces the top side of the middle spring layer 220, and the bottom side of the middle spring layer 220 faces the front side of the substrate wafer 201. The cMUT elements 200, 200A and 200B are separated by separation trenches 215 formed through the top plate 240 and the middle spring layer 220.

The top plate 240 is connected to the middle spring layer 220 through multiple plate-spring connectors 230, 230*a* and 230*b*. In some embodiments the multiple connectors 230 are distributed over the device element area. The distribution may be designed according to the need of an application. Numerous distribution configurations are possible with the present invention.

Figure 2B:
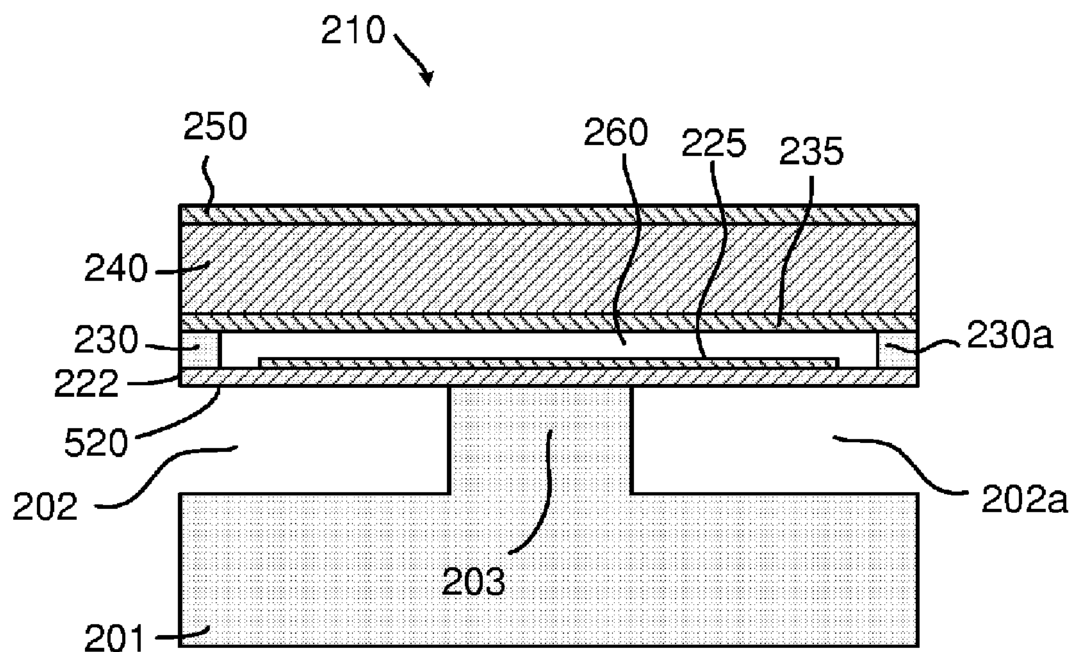
FIG. 2B is an enlarged view of a selected cMUT portion of a complete cMUT element.

FIG. 2B is an enlarged view of a selected cMUT portion 210, which is a part of the complete cMUT element 200. The selected cMUT portion 210 is a basic unit of the complete cMUT element 200 (and other cMUT elements 200A and 200B). The structure of the selected cMUT portion 210 provides a basis to understand the complete cMUT element 200.

As shown in FIG. 2B, the selected cMUT portion 210 includes two halves centered on an imaginary vertical line (not shown) going through the structure from the top to the bottom. The basic structure of the cMUT element is built on a substrate 201, which has a standing feature (referred to as "sidewall anchor" hereinafter) 203 having two sidewalls on two opposing sides bordering cavities 202 and 202*a*, respectively. The standing feature (sidewall anchor) 203 may be an integrated part of the substrate 201 formed as a result of forming the cavities 202 and 202*a*, but may also be an additional structure added onto a separate substrate. The substrate of 201 may be made of either a nonconductive material or a conductive material such as silicon or polysilicon. In a configuration where the sidewall anchor 203 is a separate structure, conductivity of the sidewall anchor 203 may be the same as or different from that of the substrate 201. For example, the substrate 201 may be made of a nonconductive material while the sidewall anchor 203 a conductive material such as metal, silicon or polysilicon.

The cMUT structure portion 210 further has these components: a middle spring layer 220 which is preferably an elastic membrane, a bottom electrode 225 placed on the middle spring layer 220, connectors 230 and 230*a* which stand on top of the middle spring layer 220, an insulation layer 235 sitting over the connector 230, a top plate 240 connected to the connectors 230 and 230*a* through an intervening insulation layer 235, and a top electrode 250.

Depending on how and where the cMUT portion 210 is taken from the cMUT element 200, the second cavity 202*a* may either belong to a different and separate cavity, or just another portion of a same circular or extended cavity as the first cavity 202. Similarly, depending on how and where the cMUT portion 210 is taken from the cMUT element 200, the second connector 230*a* may either be a part of a different and separate connector, or just another portion of a same circular or extended connector as the connector 230.

The bottom side of the top plate 240 faces the top side of the middle spring layer 220, and the bottom side of the middle spring layer 220 faces the front side of the substrate wafer, whereby the connector 230 stands out from the middle spring layer 220 to define a transducing space 260 below the top plate 240. The transducing space 260 is generally defined between the top plate layer 240 and the top surface of the sidewall anchor 203, but the actual height of the available transducing space 260 is reduced by the thicknesses of the insulation layer 235, the thicknesses of the bottom electrode 225 and the middle spring layer 220 in the configuration shown in FIG. 2B. It should be noted that in some embodiments it is possible to have the entire height between the top plate layer 240 and the top surface of the sidewall anchor 203 available for the transducing space 260.

The connectors 230 and 230*a* stand on the middle spring layer 220 and each have substantially the same connector height. The connectors 230 and 230*a* are each horizontally distanced from the respective sidewall of the sidewall anchor 203 by a sufficient length. This defines two cantilevers each anchored at the respective side of sidewall anchor 203 with a back-to-back double cantilever formation. The cantilevers are activated through the respective connector (230 or 230*a*) at an exerting end (e.g., 222 on the left side cantilever) where the connector (230 or 230*a*) located. The cantilevers and the respective cavities 202 and 202*a* enable a vertical displacement of the connectors 230 and 230*a*, which transport the top plate 240 substantially vertically with a piston-like motion, thus changing the transducing space 260. When the both halves of the cMUT structure 210 move in the same phase, the vertical piston-like motion is further assured.

In this particular example shown, top surface of the sidewall anchor 203 is covered by the middle spring layer 220, which in turn is covered by the bottom electrode 225. Furthermore, the top plate 240 and the connector 230 do not connect with each other directly but are intervened by the insulation layer 235 therebetween. The transducing space 260 between the top plate 240 and the top surface of the sidewall anchor 203 is therefore partially occupied by the middle spring layer 220, the bottom electrode 225 and the insulation layer 235. It is noted that the part of the middle spring layer 220 covering the top surface of the sidewall anchor 203, the bottom electrode 225 and the insulation layer 235 are optional. In any event, in order to achieve the intended energy transformation, the transducing space 260 should not be entirely occupied by these extra layers if they are included in the structure.

Figure 2C:
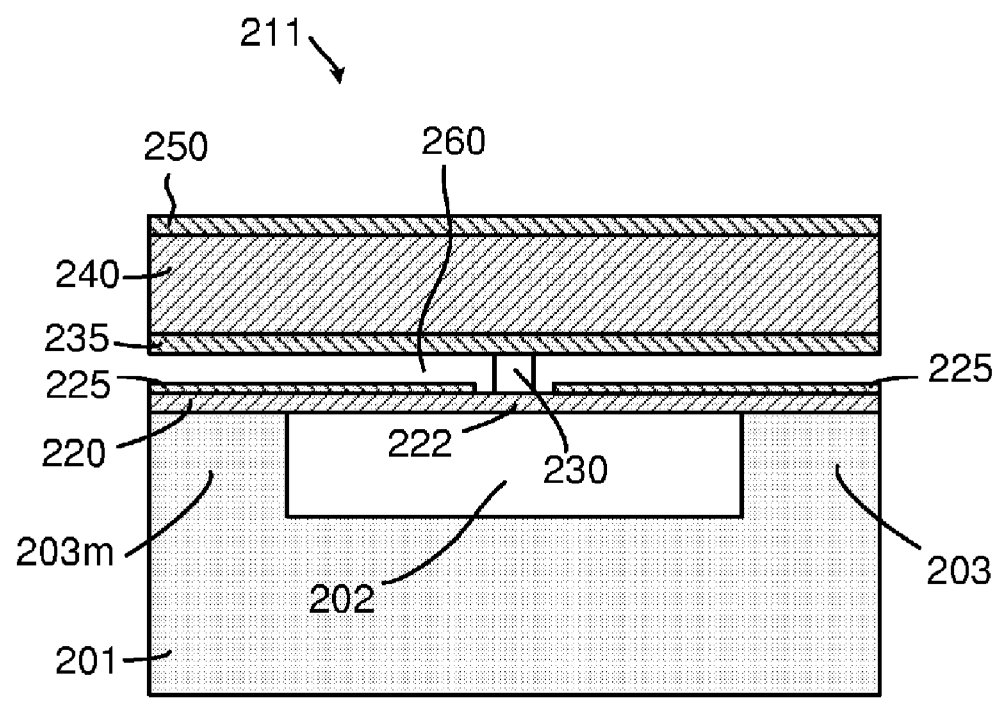

FIG. 2C is an enlarged view of a different selected cMUT portion 211, which is another part of the complete cMUT element 200. Compared to the selected cMUT portion 210 shown in FIG. 2B, the selected cMUT portion 211 is taken from a shifted location. The selected cMUT portion 211 is built on a substrate 201, which has a cavity 202 bordered by two standing features (referred to as "sidewall anchors" hereinafter) 203 and 203*m* on two opposite sides. The cMUT structure portion 211 further has these components: middle spring layer 220, bottom electrode 225 placed on middle spring layer 220, connector 230 which stands on top of the middle spring layer 220, insulation layer 235 sitting over the connector 230, top plate 240 connected to the connector 230 through an intervening insulation layer 235, and top electrode 250.

The connector 230 (which is also shown in FIG. 2B) stands on the middle spring layer, and is horizontally distanced from the sidewalls of both the sidewall anchor 203 and the sidewall anchor 203*m*. The middle spring layer 220 between the sidewall anchor 203 and the sidewall anchor 203*m* defines a double-cantilever anchored at the sidewall anchor 203 and the sidewall anchor 203*m*. The double-cantilever is connected head-to-head at location 222 where the connector 230 is positioned to form a bridge.

The top plate 240 is placed over the connector 230, which separates the top plate 240 from the middle spring layer 220 to define a transducing space below the top plate. The double-cantilever and the cavity 202 enable a vertical displacement of the connector 230, which transports the top plate 240 substantially vertically, thus changing the transducing space and activating a transducing member in the transducer for energy transformation.

The novel cMUT structure essentially did away with the conventional concept of the cell insulation wall which divides a cMUT element into cells and is required to support and clamp the membrane at the perimeter of each cMUT cell. The conventional cMUT designs shown in FIG. 1, including the cMUT design having a compliant insulation wall as disclosed in the U.S. Pat. No. 7,030,536, all require an insulation wall (e.g., insulation wall 18 in FIG. 1, or the compliant insulation wall disclosed in the U.S. Pat. No. 7,030,536) at the perimeter of each cMUT cell to define the cMUT element and to support the perimeter of the membrane. Within the perimeter defined by the insulation wall, the bottom electrode is either directly deposited on the substrate (FIG. 1) or deposited on the top of a single pedestal (U.S. Pat. No. 7,030,536) that is separated from the insulation wall (i.e., the compliant support structure).

With the cMUT design as shown in FIGS. 2A-2C, the cMUT element is no longer required to be divided into cells and thus has no need of an insulation wall to define cell perimeters. The top plate layer 240 and the top electrode 250 are supported by a resilient structure (multiple cantilevers in the embodiment shown) through multiple connectors that can be freely positioned and distributed based on need, thus effectively distributing the entire load of the top plate layer 240 over multiple springs (cantilevers). This solves the problem of the cell limitation inherent to the prior art designs. The middle spring layer 220 and a bottom electrode 225 are supported by multiple sidewall anchors 203 which can also be distributed across the entire substrate wafer 201 based on need, rather than being limited to peripheral areas.

With this design, a cMUT element with a very large active area may be formed. The operating frequency of the cMUT element may be adjusted not only by selection of the materials for the top plate 240 but also by the configuration of the multiple cantilevers, including the spring strength of individual cantilevers and the cantilever distribution density profile across the area of the cMUT element. The active area can be much larger than what would be possible with the conventional cMUT structures. The entire top plate 240 formed above the substrate wafer 201 may be movable without any clamped or fastened area. If desired, multiple cMUT elements can be formed by forming separation trenches 215 through the top plate 240. In some configurations, the suppression trench may also cut through the middle spring layer 220. In principle, however, the entire cMUT structure with a very large active area may be used as a single cMUT element.

Furthermore, with the cMUT structure design in FIG. 2A and FIG. 2B, the top plate 240 may be separated into a plurality of smaller top plates of identical or different sizes and shapes. Each smaller top plate may be addressed as a single cMUT element, or multiple smaller top plates may be combined together and addressed as a single cMUT element.

Furthermore, unlike the flexible membrane clamped on its edges (or posts) in the conventional cMUTs, the top plate 240 shown in FIG. 2A and FIG. 2B can be designed to be either flexible or rigid. With a rigid top plate, the whole surface of the cMUT, which may include any number of separate smaller top plates 240, may be movable.

As disclosed in detail in the several other patent applications identified herein, the sidewalls 203 and their corresponding connectors 230 may be freely distributed across the substrate wafer 201. The cantilevers correspondingly formed may be of an identical size and an identical spring strength or of various different desired sizes and spring strengths. The cantilevers may also be distributed across the substrate wafer 201 either uniformly or according to a desired pattern to achieve certain special effects. The unique design of the cMUT structure as shown in FIG. 2A and FIG. 2B has potential to solve many problems encountered by the prior art cMUT designs.

As will be described below, the above novel cMUT structure may be fabricated using the method of the present invention.

The fabrication process depends on the material selection for each layer. For example, silicon, glass, quartz, or sapphire may be used as the substrate. Silicon, polysilicon, silicon nitride, oxide, LTO, SiC, diamond, parylene, PMMA, PDMS, polymer, metal or other process compatible materials may be chosen as the material for the middle spring layer and the top plate. Oxide and silicon nitride, SiC, PDMS, or parylene may be used as the dielectric materials. With a variety of materials to choose from, different thin film depositions and wafer-bonding technologies (e.g., silicon fusion bonding, anodic bonding, eutectic bonding, thermal-compression and fret-glass bonding) may be selected to fabricate the cMUT in the present invention.

Examples of the fabrication processes for making the above described cMUTs are illustrated below. Variations, combinations and changes of the sequence of the steps are possible without departing the spirit of the invention. Even for a given example, there is freedom of selecting different materials and process methods to accomplish each step.

I. Fabrication Methods for Making the Basic Elements of the Micro-Electro-Mechanical Device According to one aspect of the present invention, the method for fabricating a micro-electro-mechanical device in accordance with the present invention may comprise the steps of:

(1) Forming at least one cavity on a front side of a substrate wafer, wherein each cavity has at least one sidewall having a top surface;

(2) Forming at least one connector of a desired height on either a top side of a middle spring layer or a bottom side of a top plate layer; and (3) Joining the substrate wafer, the middle spring layer and the top plate such that the bottom side of the top plate faces the top side of the middle spring layer and a bottom side of the middle spring layer faces the front side of the substrate.

Upon joining, a micro-electro-mechanical structure, such as a capacitance micromachined ultrasonic transducer (cMUT) shown in FIG. 2A and FIG. 2B, may be obtained. The structure thus made has a movable mechanical part, namely the top plate transported vertically by the cantilever, to transform energy.

It is appreciated that the above steps may take place in any order as well as they are physically compatible with each other to accomplish the final structure. In addition, the step of joining the substrate wafer, the middle spring layer and the top plate does not mean the three layers are necessary joined at the same time in a single step. It further does not mean the three layers are joined together with immediate contact with each other without any intervening material therebetween, nor does it suggest that the three layers must be joined in that particular order in time. Any combination and sequence of joining is within the meaning of the description herein, as long as in the final structure the bottom side of the top plate faces the top side of the middle spring layer, and the bottom side of the middle spring layer faces the front side of the substrate wafer, such that the desired structure as described is possible.

As will be illustrated below, the steps of forming cavities and connectors may be accomplished using a variety of techniques, such as by directly removing or adding materials according to a desired pattern, by introducing and subsequently removing a sacrificial layer, or a combination of these two techniques.

Furthermore, it is appreciated that many steps described below are optional, including but not limited to those steps that are specifically indicated as optional in the description.

(1) Fabrication Using Wafer-Bonding Technology:

FIGS. 3.1-3.9 show an example of the fabrication method using wafer-bonding technology. The steps of the fabrication method are described below. In the example, the middle spring layer may be referred to as the membrane layer.

The process starts with a conductive silicon wafer to serve as a substrate wafer 301. The conductive substrate wafer 301 may be adopted to function as the bottom electrode of the transducer.

In step one (FIG. 3.1), cavities 302 are formed on substrate wafer 301 using silicone substrate patterning and etching techniques. Each cavity 302 is defined by at least one sidewall 303. Cavities 302 and sidewalls 303 define the pattern of the membrane layer (which may be referred to as the middle spring layer in general in this description).

In step two (FIG. 3.2), a silicon-on-insulator (SOI) wafer 380 is bonded with the substrate wafer 301. The SOI wafer 380 includes a thick support layer 382 and an oxide layer 384 carrying a thin layer 320 which is to become the membrane layer. The thick support layer 382 provides support to the thin layer 320 for handling during the process. If the bonding is done in the vacuum chamber, the cavity may be vacuum-sealed in this step.

In step three (FIG. 3.3), the bonded wafer structure is annealed at high temperature, and subsequently support layer 382 and an oxide layer 384 are removed by etching to leave the membrane layer 320 over the top side of the sidewalls 303 and the cavities 302. If needed, silicon doping can be performed in this step in selected membrane areas.

In step four (FIG. 3.4), connectors 330 are formed on top of the membrane layer 320 using thermal oxide growth and patterning. Preferably, instead of forming discrete connectors 330 individually, all connectors 330 are formed in a single step by forming a patterned thermal oxide layer. The oxide layer defines the height of the connector 330 which in turn partially defines the size of the transducing space above the membrane layer 320. It should be noted that the FIG. 3.4 and other figures in this group are cross-sectional views. The connectors 330 may be of any shape in a top view of the surface. The connectors 330 may be discrete buttons, but may also be long line segments, or continuous ring-like shapes.

In step five (FIG. 3.5), another SOI wafer 385 is bonded over the connectors 330 under vacuum and annealed at high temperature. The SOI wafer 385 has a support layer 386 and an oxide layer 387 carrying a layer which is to become the top plate layer 340. The SOI wafer 385 may also carry an optional thin insulation layer 335. The optional thin insulation layer 335 may be grown on the SOI wafer 385 on top of the layer which is the predecessor of the top plate layer 340 before the SOI wafer 385 is bonded to the membrane layer 320. Alternatively, the optional thin insulation layer 335 may be grown on a prime wafer (not shown) and being subsequently bonded to the membrane layer 335.

In step six (FIG. 3.6), the support layer 386 and the oxide layer 387 are removed by etching to form the top plate layer 340. Alternatively, if a prime wafer is used in step 5 to carry the thin insulation layer 335, the prime layer is ground and polished to the desired thickness to form the top plate layer 340.

In an optional step (FIG. 3.6A), the top plate layer 340 is etched to a desired shape or configuration as illustrated. In addition, the top plate layer 340 may be doped with desired materials and densities in this step if needed. A silicon and oxide etch may be performed to etch vias through the top plate layer 340 and the insulation layer 335 to access the bottom electrode from the top (the vias are not shown). Alternatively, interconnections to access the bottom electrode may be formed using the through-wafer interconnection technique disclosed in the several other patent applications identified herein, filed by the common applicant on even date.

In step 7 (FIG. 3.7), a metal layer is deposited and patterned to form the top electrode 355.

In an optional step (FIG. 3.7A), the top plate layer 340 is patterned to form holes 342 to make the top plate layer 340 a hollow structure. If needed, holes 342 in the hollow structure (the top plate layer 340) may be refilled or sealed with a material with desired properties.

In step 8 (FIG. 3.8), separation trenches 345 are formed through the top plate layer 340 to separate the cMUT elements.

In step 9 (FIG. 3.9), passive layer 346 is formed if needed.

FIGS. 4.1-4.9 show another example of the fabrication method using wafer-bonding technology. The process starts with a conductive silicon wafer to serve as a substrate wafer 401. The conductive substrate wafer 401 may be adopted to function as the bottom electrode of the transducer.

In a preparation step (FIG. 4.1A), recesses 404 are formed on the substrate wafer 401 to define a gap between the membrane layer and motion stoppers to be formed. The motion stoppers will set an upper limit for the displacement of cMUT surface plate.

In step one (FIG. 4.1B), the substrate wafer 401 is patterned with silicon etch to form cavities 402 which are defined by sidewalls 403. Posts 405 that are shorter than the sidewalls 403 are also formed in cavities 402.

In steps two through step eight (FIGS. 4.2-4.8), a process flow nearly identical to the process flow described in FIGS. 3.2-3.8 is followed to fabricate the cMUT structure with motion stoppers 405.

The process flow shown in FIGS. 4.2-4.8 also demonstrates several variations to the process flow shown in FIGS. 3.2-3.8. In step five and step six (FIGS. 4.5-4.6), it is shown that the SOI wafer 485 has not oxidation layer on the top plate layer 440, and as a result the top plate layer 440 is placed over the connectors 430 without an intervening oxidation layer like 335 in FIGS. 3.5-3.6.

Posts 405 shorter than sidewalls 403 are another additional feature of the above process. Posts 405 are created in the cavities 402 to function as motion stoppers. It is appreciated that the posts 405 can also be formed with the other fabrication processes described herein. In addition, although the posts 405 may be formed using a separate process, they are preferably formed at the same time as the cavities 402 and sidewalls 403 are formed by properly designed patterning. Various chemical or mechanical methods may be used for such formation.

In addition, as shown in the finished cMUT structure in FIG. 4.8, each of the connectors 430 is formed at a location directly above a corresponding post 405. This particular configuration may have an optimized effect for the posts 405 to function as motion stoppers because the locations where the connectors 430 are positioned have the highest probability to make the largest vertical displacement.

Besides the silicon fusion bonding, other wafer-bonding technologies (e.g., anodic bonding, eutectic bonding, thermal-compression and fret-glass bonding) may be used to build the micro-electro-mechanical structure such as cMUT in present invention in similar ways. Different materials can be used to build each layer with an appropriate bonding technology. For example, in the process of using eutectic bonding or anodic bonding, glass or sapphire may be used as the substrate material, as well as silicon. Instead of using silicon layer in a SOI wafer to form the membrane and plate layers, a thin film layer or multiple thin film layers (e.g., silicon nitride, LTO, diamond, SiC, polyimide, PMMA, PDMS, and polymer) with desired properties can be grown or deposited on a carrier wafer (e.g., silicon wafer, glass wafer and sapphire wafer). The carrier wafer with the desired thin film layer (or layers) can be bonded to other wafers with desired structures to form the membrane layer and the top plates of the micro-electro-mechanical structure. Because the above-mentioned processes usually require much lower process temperature, they benefit the later process steps (e.g., integration of the transducers and integrated circuit) in which a high temperature is not desired.

FIGS. 5.1-5.9 show another example of the fabrication method using wafer-bonding technology. This method is a slight variation of the methods of FIGS. 3.1-3.9 and FIGS. 4.1-4.8. For example, in this embodiment of the method connector are formed on the bottom side of the top plate, the membrane layer is placed over the connector, and the top plate and the membrane layer are then placed over the top of the substrate wafer to cover the cavities formed on the substrate wafer. The steps of this method are illustrated below with reference to FIGS. 5.1-5.9.

In step one (FIG. 5.1), the process starts with an SOI wafer 580. The SOI wafer 580 has a desired silicon layer which will be become the top plate layer 540 of the cMUT in a late process step. An oxide layer 531 is grown on the silicon top plate layer 540. Alternatively, the process may also start with a prime wafer (not shown), which is ground and polished to a desired thickness as the top plate layer of the cMUT in a later step.

In step two (FIG. 5.2), the oxide layer 531 is patterned to form the plate-membrane connectors 530. Optionally, another thin oxide layer 535 is grown as an insulation layer, and may also be patterned if needed.

In step three (FIG. 5.3), the SOI wafer 580 is bonded with another SOI wafer 590, which has a support layer 592 and a thin oxide layer 594 and carries a desired membrane layer 520.

In step four (FIG. 5.4), the thick support layer 592 and the thin oxide layer 594 of the SOI wafer 590 are removed to leave the membrane layer 520 bonded with the top plate layer 540 through connectors 530.

In step five (FIGS. 5.5A-E), several alternative processes may be used. The first option is shown in FIG. 5.5A, where a prime wafer 501A with cavities 502A defined by sidewalls 503A is bonded to the SOI wafer 580 through the membrane layer 520 and the connectors 530. This completes the basic cMUT structure that is similar to what can be fabricated using the other methods described herein.

The second option of step five is shown in FIG. 5.5B. Silicon fusion bonding is used to bond a substrate wafer 501B which has through-wafer interconnections 506 and patterned cavities 502B formed therein. The resultant cMUT structure according to this option is similar to that in FIG. 5.5A but has built-in through-wafer interconnections 506 which may offer additional advantages as described in detail in the several other patent applications identified herein filed by the common applicant on even date.

The third option of step five is shown in FIGS. 5.5C (C_1 and C_2). As shown in FIG. 5.5C_1, a proper metal layer 511 (or any other adhesion layer) is deposited and patterned on the membrane layer 520. In FIG. 5.5C_2, a substrate wafer 501C which has through-wafer interconnections 506 and patterned cavities 502C defined by patterned sidewalls 503C is bonded to the upper portion of the cMUT structure through the metal layer 511. The pattern of the metal layer 511 may preferably match that of the sidewalls 503C.

The fourth option of step five is shown in FIG. 5.5D, in which the upper portion of the cMUT structure is bonded to a wafer 501D which has patterned sidewalls 503D made of a metal material. The metal material may be further patterned to cover areas to function as part of an electrode 512 of the cMUT structure. For example, the electrode 512 may be used as a third electrode in the cMUT structure that has two stacked capacitors as disclosed in the several other patent applications identified herein filed by the common applicant. The metal material layer having patterned features such as the sidewalls 503D and the bottom electrode 512 may be a formation on a PCB board with desired circuits. In this design, the substrate wafer 501D itself may be nonconductive and made of material such as glass, sapphire, or silicon with an insulation layer.

The fifth option of step five is shown in FIG. 5.5E, in which the upper portion of the cMUT structure is bonded to a substrate wafer 501E that has integrated circuits (ICs) 513 to achieve integration between the cMUT transducer.

After the above step five, the fabrication may be completed following the same steps as the steps six to nine in FIGS. 3.6-3.9.

Alternatively, in this process deep trenches separating the device elements may be formed through the membrane layer 520 and the top plate layer 540 from bottom to top before these top layers are bonded to the substrate wafer 501, instead of being formed from top to bottom after these top layers are bonded to the substrate wafer 501. This is further described in a later section in relation to techniques for sealing trenches.

(2) Fabrication Using Sacrificial Technology Technology:

Instead of forming cavities by directly removing a material from a wafer, either or both cavities on the substrate wafer and cavities above the middle spring layer (defining the transducing space) may be formed using sacrificial technology. The connectors may also be formed using sacrificial technology by filling provisional cavities formed on a sacrificial layer which is subsequently removed.

An exemplary method for fabricating a micro-electro-mechanical device using sacrificial technology comprises the steps of:

(1) Providing a substrate wafer having a front side and a back side;

(2) Depositing a first sacrificial layer on the front side of the substrate wafer;

(3) Patterning the first sacrificial layer to form a first provisional cavity;

(4) Depositing a first thin film material over the first sacrificial layer to fill the first provisional cavity and to further form a membrane layer covering a top surface of the first sacrificial layer, optionally the membrane layer having at least one hole for access to the first sacrificial layer underneath;

(5) Depositing a second sacrificial layer on top of the membrane layer;

(6) Patterning the second sacrificial layer to form a second provisional cavity;

(7) Depositing a second thin film material to fill at least the second provisional cavity;

(8) Removing the first sacrificial layer and the second sacrificial layer to form a first cavity on top of the substrate wafer and a second cavity on top of the membrane layer; and (9) Placing a top plate over the membrane layer to define a transducing space from the second cavity between the top plate and the top surface of the sidewall.

In the resultant structure, the first cavity is defined by at least one sidewall having a top surface. The sidewall is made of the first thin film material deposited in the first provisional cavity. The second cavity is defined by at least a connector on top of the membrane layer. The connector is made of the second thin film material deposited in the second provisional cavity. Similar to the micro-electro-mechanical structure fabricated using the other methods described herein, in the resultant structure made here the connector stands out from the membrane layer and is horizontally distanced from the sidewall of the first cavity by a sufficient length to define a cantilever anchored at the sidewall to allow a vertical displacement of the connector, whereby the vertical displacement of the connector transports the top plate substantially vertically with a piston-like motion, thus changing the transducing space.

FIGS. 6.1-6.12 show an example of the fabrication method using sacrificial technology. The process is based on the surface micromachining. The steps of this method are illustrated below.

In step one (FIG. 6.1), the process starts with a conductive silicon wafer 601. A first sacrificial layer 661 (e.g., an oxide, SOG, metal, polyimide, polymer, or photoresist layer) is deposited and patterned. The pattern of the first sacrificial layer 661 will partially define the shapes of the membrane layer to be formed. At selected areas 662, the sacrificial layer 661 is thinned to a desired thickness to serve as the sacrificial etching and sealing channel in the later steps.

In step two (FIG. 6.2), a first thin film material (e.g., silicon nitride, polysilicon, oxide, silicon, polyimide, or polymer) is deposited to form membrane layer 620. The thin film material also fills the voids 621 to become the sidewalls 603 defining cantilevers in future steps.

In step three (FIG. 6.3), optionally multiple etch holes 622 are formed on the membrane layer 622 by etching to connect the first sacrificial layer 661 below the membrane layer 620 and the second sacrificial layer to be formed above the membrane layer 620.

In step four (FIG. 6.4), the second sacrificial layer 611 is deposited on top of the membrane layer 620.

In step five (FIG. 6.5), the second sacrificial layer 611 is patterned to have openings 613 to define the membrane-plate connectors to be formed in the next step. The patterned second sacrificial layer 611 above the membrane layer 620 also defines the transducing space once removed. It is appreciated that step four and step five may be performed at the same time as a single step, especially when the first sacrificial layer 661 and the second sacrificial layer 611 are the same materials or different materials but with compatible removing characteristics.

In step six (FIG. 6.6), a second thin film material (e.g., silicon nitride, or oxide) is deposited to fill the openings 613 to form connectors 630. The thin-film deposition also optionally forms insulation layer 635.

In step seven (FIG. 6.7), vias 641 are etched through the insulation layer 635 and the thin film material deposited in step two to access the sacrificial etch cannel 662 formed in the first sacrificial patterning in step one (FIG. 6.1). Alternatively, the vias may be etched through the insulation layer 635 at selected locations to directly access the sacrificial layer 661.

In step eight (FIG. 6.8), the first sacrificial layer 661 and the second sacrificial layer 611 are removed by etching.

In step nine (FIG. 6.9), after removing the sacrificial layers 661 and 611, another thin film deposition is performed to seal the vias 641. In this step, additional etching may be performed to thin the insulation layer 635 to a proper thickness where the top electrode (to be deposited in the next step) may be desirably located.

In step 10 (FIG. 6.10), a metal layer is deposited in a desired position to form the top electrode 625. In this step, additional vias may be etched to access the bottom electrode if needed (vias not shown).

In step 11 (FIG. 6.11), another thin film material (e.g., silicon nitride, LTO, diamond, polyimide, polymer, polymer, PDMS or PMMA) is deposited on top of the top electrode 625 to a desired thickness to form the top plate layer 640.

In step 12 (FIG. 6.12), deep trenches 645 are formed between the cMUT elements to separate the elements. This also opens a channel to access the wire-bond pad (not shown) of the transducer.

It is appreciated that in the above process an insulation layer may be formed on top of the membrane layer 620, either in addition to or in place of forming an insulation layer 635 on top of the connectors 630. Both insulation players are optional.

It is also appreciated that in the above process, instead of forming etching channels 641, a porous film may be used to provide etching channels for etching the sacrificial layer. For example, in step six (FIG. 6.6), instead of depositing the insulation layer 635, a porous film may be deposited to fill the openings 613 to form connectors 630. The sacrificial layer 661 is removed by etching through micropores of the porous film. After the sacrificial layer etching, a thin film deposition may be performed to seal the micropores.

(3) Fabrication Using a Combination of Wafer-Bonding and Sacrificial Technologies:

The two types of the embodiments of the method described above may also be combined. For example, the forming of the cavities on the substrate were for may be accomplished using sacrificial technology while the forming of the connectors and the other steps may be accomplished using thermal oxide growth and wafer-bonding technology. Conversely, the latter may be accomplished using the sacrificial technology while the former using direct material removal and wafer bonding technology.

FIGS. 7.1-7.11 show an exemplary fabrication method combining the wafer-bonding and sacrificial technologies. The process starts with a conductive silicon wafer, which may be effectuated as the bottom electrode of the transducer.

In step one (FIG. 7.1), the substrate wafer 701 is patterned with silicon etch to form cavities 702 and sidewalls 703, which together define the membrane pattern and anchors for cantilevers to be formed.

In step two (FIG. 7.2), the patterned substrate wafer 701 is bonded with a SOI wafer 780 which has a thick support layer 782, insulation layer 784, and a desired membrane layer 720. This may be done under vacuum. The membrane layer 720 of the SOI wafer 780 faces the patterned silicon substrate wafer 701 during the wafer-bonding process. If the bonding is done in the vacuum chamber, the cavity is vacuum sealed. The bonded wafer is annealed at high temperature.

In step three (FIG. 7.3), both the thick support layer 782 and the insulation layer 784 are removed to leave the membrane layer 720. If desired, the membrane layer 720 may be highly doped in selected areas.

In step four (FIG. 7.4), a sacrificial layer 711 is deposited on the membrane layer 720 and patterned to define openings 713, which will define the connectors to be formed. The patterned sacrificial layer 711 also defines the transducing space to be formed above the membrane layer 720 and the connectors.

In step five (FIG. 7.5), a thin film material (e.g., silicon nitride, or oxide) is deposited to fill the openings 713. The filled material in the openings 713 will become connectors 730. The deposited thin film material may also form an insulation layer 735.

In step six (FIG. 7.6), vias 741 are etched to access the sacrificial layer 711.

In step seven (FIG. 7.7), the sacrificial layer 711 is then removed.

In step eight (FIG. 7.8), after etching the sacrificial layer 711, a thin film deposition is performed to seal the vias 741. An etch-back may be performed to thin the insulation layer 735 to a desired thickness where the top electrode may be properly positioned.

In step nine (FIG. 7.9), a metal layer is deposited in a desired position to form the top electrode 725. In this step, vias may be etched to access the bottom electrode if needed (vias not shown).

In step ten (FIG. 7.10), another thin film material (e.g., silicon nitride, LTO, diamond, polyimide, polymer, polymer, PDMS or PMMA) is deposited on top of the top electrode 725 to a desired thickness to form the top plate layer 740.

In step 11 (FIG. 7.11), trenches 745 are formed between the cMUT elements to separate the elements. This also opens a channel to access the wire-bond pad (not shown) of the transducer.

In this process, other wafer-bonding methods (e.g., eutectic bonding, anodic bonding) can be used if other substrate and membrane materials are selected.

For a cMUT with multiple elements, the extra process steps may be used to make the separated bottom electrodes for different elements if needed.

FIGS. 8.1-8.3 show process steps to separate the bottom electrodes of the cMUT elements using wafer-bonding technology. These steps are taken before the other steps described above to prepare the substrate wafer. As shown in FIG. 8.1, an insulation layer 801*a* is grown on a prime wafer 801*b*. As shown in FIG. 8.2, another prime wafer 801*c* is bonded to the oxidized prime wafer 801*b*. The bonded wafer is then ground and polished to a desired thickness. As shown in FIG. 8.3, trenches 809 are etched on the conductive silicon layer 801*c* to electrically separate the silicon into patterned areas which will serve as the bottom electrodes of cMUT elements. The bonded and processed wafer is provided as a substrate wafer 801. Device fabrication steps as described herein are then performed starting with a combined substrate wafer 801 to fabricate the cMUT structure.

FIGS. 9.1-9.2 show process steps to separate the bottom electrodes of the cMUT elements using a thin conductive layer as the bottom electrodes. These steps are taken before the other steps described above to prepare the substrate wafer. In FIG. 9.1, an insulation layer 901*a* is deposited on a silicon wafer 901*b* first. In FIG. 9.2, a thin conductive film 901*c* with desired thickness is deposited on the insulation layer 901*a*. The conductive layer 901*c* is then patterned to form the bottom electrodes as required by the elements to form a substrate wafer 901. Device fabrication steps as described herein are then performed starting with the substrate wafer 901 to fabricate the cMUT structure.

The above processes may also be combined with through-wafer interconnection techniques which are disclosed in the several other patent applications identify herein filed by the common applicant on even date.

Although the above-described fabrication methods are illustrated using a cMUT structure, the methods can be used for fabricating a variety of micro-electro-mechanical devices that has been movable mechanical part to transform energy. Regardless of which embodiment of the method is used, the resultant device structure is characterized with a top plate that is transported by a vertical displacement at locations of connectors. A transducing member may be either formed or effectuated in the micro-electro-mechanical device. For example, a conductive layer may be introduced to the top plate to function as a top electrode in a cMUT structure, or a conductive top plate may be effectuated as a top electrode by virtue of its inherent conductivity. A variety of transducing members based on different energy transformation schemes may be used, but the transducing member in accordance with the present invention generally effectuates energy transformation through the vertical transportation of the top plate or a change of the transducing space defined between the top plate and the middle spring layer (the membrane layer as illustrated in context of the cMUT structures).

For a cMUT structure, it is necessary to have both a top electrode and a bottom electrode. The former can be formed or effectuated in or on the top plate, and the latter can be formed or effectuated in or on the middle spring layer or the substrate wafer. For other type of micro-electro-mechanical devices which do not require a pair of electrodes forming a capacitor, such as pMUT or mMUT, a suitable transducing member may be located in or on either the movable top plate or the movable middle spring layer.

II. Design and Fabrication of Connections and Interconnections

Micro-electro-mechanical devices such as transducers need electric connections to perform their functions. For example, a moveable surface (such as the top plate shown herein) of the transducer may need to be electrically connected to fixed pads (e.g., wire bond pads) to interface with the outside. The top electrodes between elements in a cMUT may need to be interconnected together electrically in some transducer designs, especially for 2D arrays. There are many possible designs for connection structures but the connection connecting to the movable part generally should be soft (or compliant) and conductive enough so that they have minimum impact on the device performance.

Several examples of transducer connection designs in accordance with the present invention are described below.

In a first type of configuration, the connection or interconnection is made within the same process steps used to fabricate the device (e.g., cMUT) with a proper mask design.

Figure 10A:
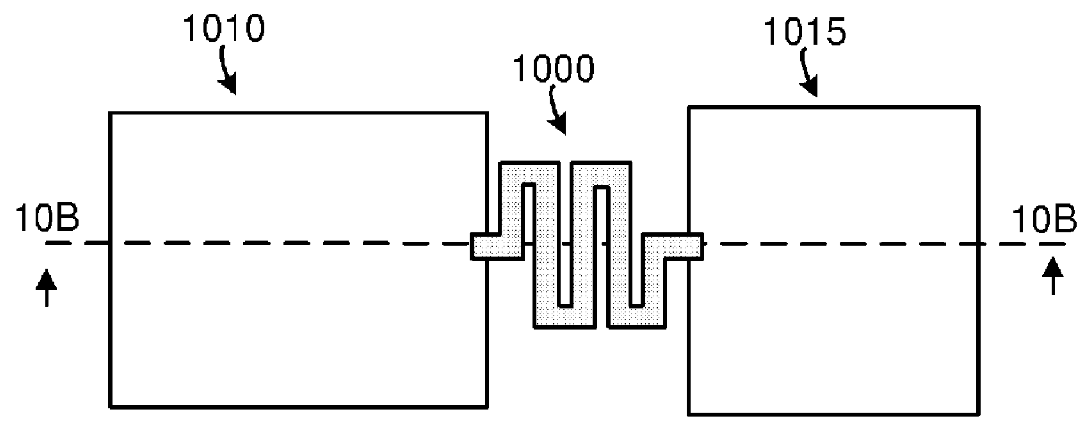
FIGS. 10A and 10B show an example of an electric connection between a transducer element and a connection etch-back.
Figure 10B:
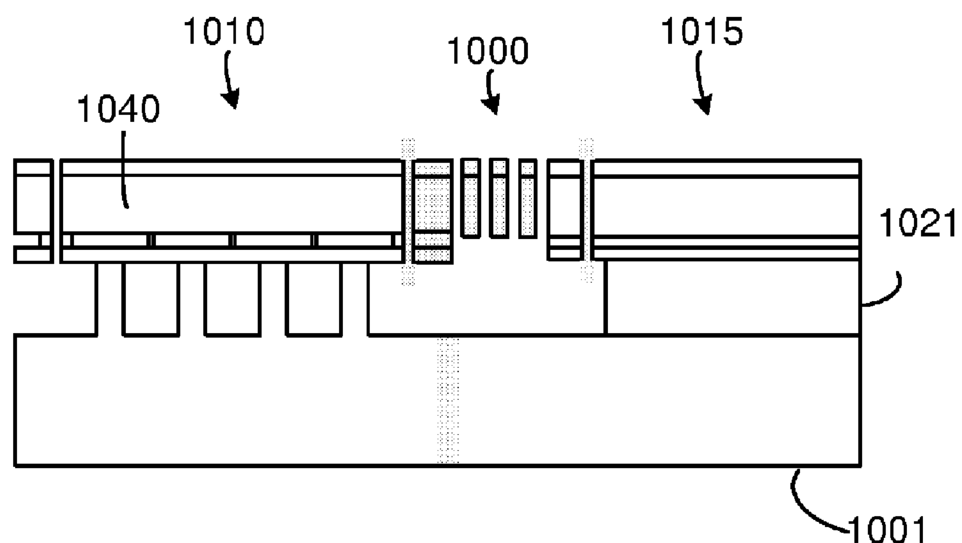

FIGS. 10A and 10B show an example of a connection between a transducer element and a connection anchor. FIG. 10A is a top view of a connection 1000 between a transducer element 1010 and an anchored connection pad 1015. FIG. 10B is the cross-sectional view of the same structure shown in FIG. 10A. As shown, an area near the transducer element 1010 is made available for building the anchored connection pad 1015 for interface. The anchored connection pad 1015 is supported by and connected to a support anchor 1021 underneath (FIG. 10B). The anchored connection pad 1015 and the support anchor are preferably separated and unaffected by movement of the cantilevers and the movable top plate layer 1040 of the transducer elements.

Both the transducer element 1010 and the anchored connection pad 1015 are built on the same substrate wafer 1001, and are compatible with the same multi-layer fabrication process, although the two parts are patterned differently to have different inner makeup. In the example shown, the connection 1000 between the transducer element 1010 and the anchored connection pad 1015 is formed on the top plate 1040 by patterning the conductive layer 1055. In order to make the connection 1000 soft and flexible, the conductive path of the connection 1000 is made thin or winding in a zigzag fashion. The conductive path of the connection 1000 can be made thin not only in the wafer surface dimension (as shown the top view in FIG. 10A), but also in the wafer depth dimension (as shown in the cross-sectional view in FIG. 10B). For example, the connection1000 includes only part of the top layers (conductive layer 1055 and the top plate layer 1040) but not a part of the substrate 1001.

Figure 11A:
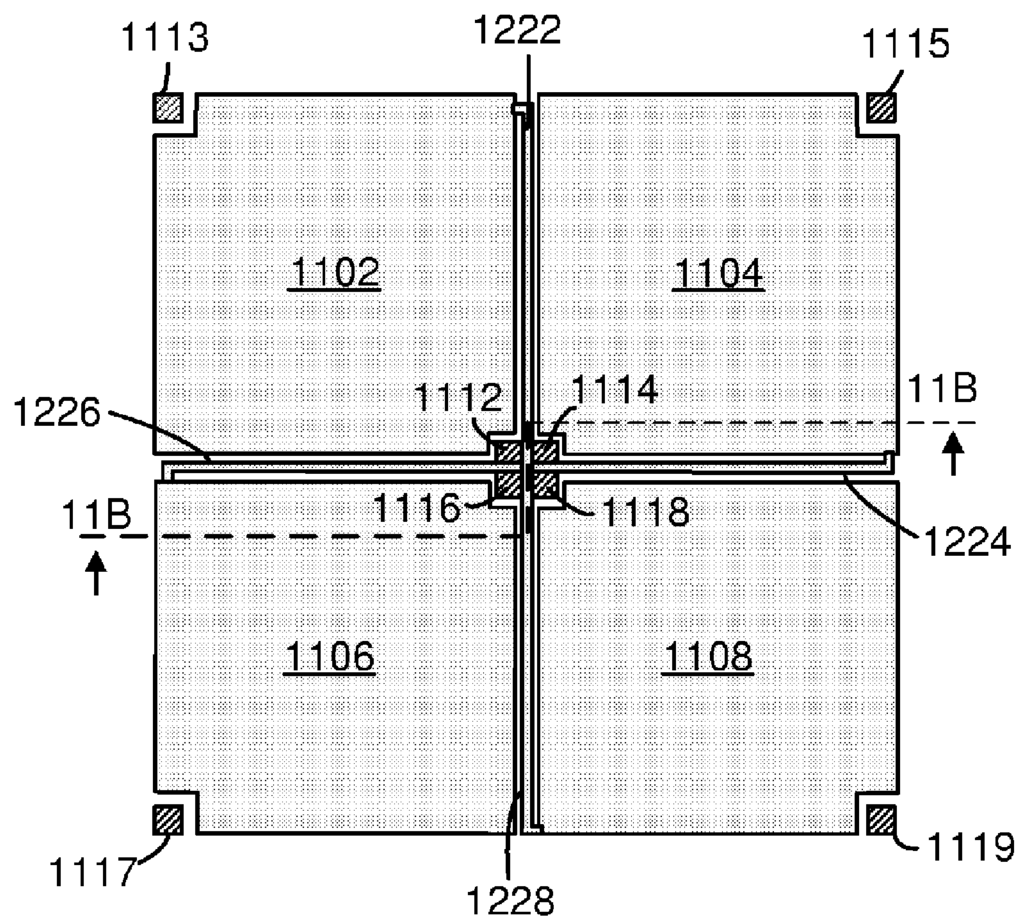
FIGS. 11A and 11B show an example of the interconnection among transducer elements.
Figure 11B:
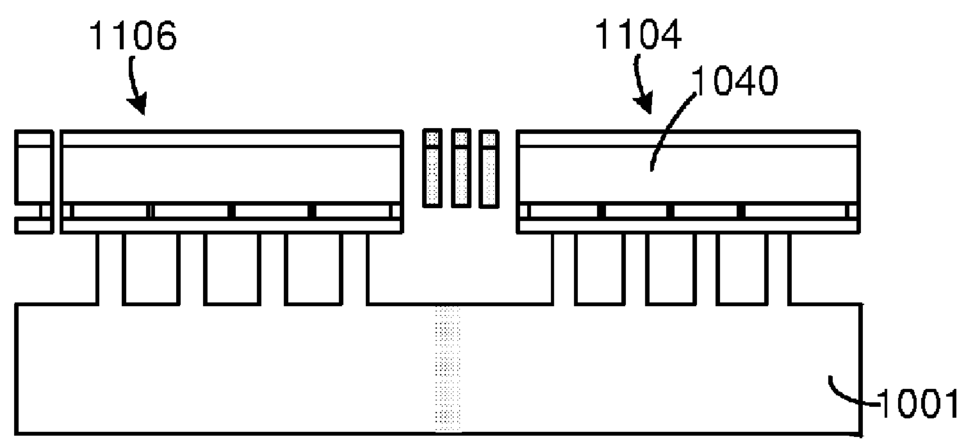

FIGS. 11A and 11B show an example of the interconnection among transducer elements. FIG. 11A is a top view of four transducer elements 1102, 1104, 1106 and 1108 interconnected through anchored connection pads 1112, 1114, 1116 and 1118. FIG. 11B is a cross-sectional view of the same structure. Although the basic element-anchor connection shown in FIGS. 10A can be used for the interconnection among other things, the design in FIGS. 11A and 11B has a different arrangement to achieve a more compact size and better interconnection efficiency. As shown, the anchored connection pads 1112, 1114, 1116 and 1118 are located at the common corner shared by the four respective transducer elements 1102, 1104, 1106 and 1108. Each transducer element is connected to a respective anchored connection pad through a respective thin connection line 1222, 1224, 1226, or 1228, which are preferably thin in both the surface dimension (horizontal) and the wafer depth (vertical) dimension. Depending on how the anchored connection pads 1112, 1114, 1116 and 1118 are electrically connected to each other, the four transducer elements 1102, 1104, 1106 and 1108 may be either addressed individually or collectively. Additional anchored connection pads 1113, 1115, 1117 and 1119 are also included at selected corners and may be used to further connect the respective transducer element shown to other transducer elements not shown.

One advantage of the above connection and interconnection scheme is that there is not need to introduce an extra process step to make the connection or interconnection structures. All connection or interconnection structures may be fabricated as part of the fabrication process for making the transducer elements themselves. However, if it is desired, an extra process step may be introduced to thin the top plate layer 1140 at areas where the connection or interconnection patterns reside to make the connection structure even more compliant.

In a second type of configuration, the connection or interconnection is made after finishing the cMUT process. FIGS. 12.1-12.4 show an example of fabricating connections or interconnections after the primary fabrication process for making the micro-electro-mechanical device, such as the cMUT structure described herein.

The process starts with an exemplary cMUT structure 1200 that is largely complete. In step one (FIG. 12.1), a sacrificial material 1290 (e.g., photoresistor, polyimide, polymer, PDMS, or parylene) is deposited on top of the cMUT structure 1200 to fill the trenches between cMUT elements or trenches between a cMUT element and an anchored connection pad. In step two (FIG. 12.2), the sacrificial material 1290 is etched back to expose the top electrode 1255 of the cMUT. In step three (FIG. 12.3), a metal layer 1256 is deposited and patterned to form the desired connection or interconnection. In step four (FIG. 12.4), the sacrificial material 1290 is optionally removed.

Alternatively, a material with desired properties (such as acoustic, mechanical or electrical) may be used to fill the trenches and remain in the trenches. The filled material is unremoved and becomes a supplemental part of the final transducer structure to provide a desired effect based on its properties.

III. Techniques for Sealing Trenches Between the Device Elements

The trenches between the cMUT elements may need to be sealed in some applications. For example, the sealing structure may help to prevent the medium or moistures leaking into the trench. The sealing structure may be designed to minimize coupling between elements. The sealing structure may also provide electrical connections between the elements. The trenches may be sealed either during or after the device fabrication FIGS. 13.1-13.12 show an example of fabrication method which incorporates a trench sealing process during the normal device fabrication process. The process is described in the following steps.

Steps one through four (FIGS. 13.1-13.4) are the same as that described in the steps one through four in FIGS. 5.1-5.4. Briefly, in step one (FIG. 13.1), the process starts with an SOI wafer 1380. The SOI wafer 1380 has a desired silicon layer 1340 which will become the top plate of the cMUT in a late process step. An oxide layer 1331 is grown on the silicon layer 1340. In step two (FIG. 13.2), the oxide layer 1331 is patterned to form the plate-membrane connectors 1330. Optionally, another thin oxide layer 1335 is grown as an insulation layer, and may also be patterned if needed. In step three (FIG. 13.3), the SOI wafer 1380 is bonded with another SOI wafer 1390, which has a support layer 1392 and a thin oxide layer 1394 carrying a desired membrane layer 1320. In step four (FIG. 13.4), the thick support layer 1392 and the thin oxide layer 1394 of the SOI wafer 1390 are removed to leave the membrane layer 1320 bonded with the top plate layer 1340 with connectors 1330. If needed, silicon doping can be done in selected areas on the membrane layer 1320.

In step five (FIG. 13.5), trenches 1345 are formed through the membrane layer 1320, insulation layer 1335 and the top plate layer 1340 to separate the cMUT element. The etching for forming trenches 1345 stops at the oxide layer 1381 of the SOI wafer 1380.

In step six (FIG. 13.6), the membrane layer 1320 is optionally patterned to define contact locations 1321 for contacting the membrane layer 1320 and the substrate wafer 1301.

In step seven (FIG. 13.7), a silicon substrate wafer 1301 which has patterned cavities 1302 and sidewalls 1303 is bonded to the membrane layer 1320 at contact locations 1321. Other type of substrate wafers may be bonded with various bonding techniques in this step.

In step eight (FIG. 13.8), the SOI wafer 1380 is etched back to the oxide layer 1381 to form a top plate wafer which includes the top plate layer 1340 and the oxide layer 1381. The top plate wafer may be patterned if needed. At this stage, the trenches 1345 are sealed by the oxide layer 1381.

In step nine (FIG. 13.9), the oxide layer 1381 is patterned in preparation for contacting the top plate layer 1340 with a top electrode in the next step. The remaining oxide layer 1381 can be thinned by a proper etch process if needed.

In step ten (FIG. 13.10), a metal layer is deposited on the top plate layer 1340 and the patterned oxide layer 1381 to form top electrode 1355.

FIGS. 14.1-14.6 show an example of fabrication method which incorporates a trench sealing process after the normal device fabrication process. The process uses sacrificial etch techniques. The process is described in the following steps.

In step one (FIG. 14.1), a finished cMUT wafer 1400 is provided. A trench 1445 separates two cMUT elements.

In step two (FIG. 14.2), a sacrificial layer 1490 (e.g., photoresistor, polyimide, polymer, PDMS, LTO, TEOS, or SOG) is coated over the top of the finished cMUT wafer 1400. The sacrificial layer 1490 may fill or partially fill the trench 1445.

In step three (FIG. 14.3), the sacrificial layer 1490 is thinned either uniformly or selectively using the lithograph until at least the part of the top electrode 1455 is exposed. Sacrificial material 1491 remains in the trench 1445. A mask may be used if the non-uniform thinning is needed.

In step four (FIG. 14.4) 4, another metal layer 1492 with desired properties is deposited over the top electrode 1455 and the sacrificial material 1491 remaining in the trench 1445. If the top electrode 1455 of the each cMUT element needs to be separately addressed, a dielectric material (e.g., polyimide, polymer, PDMS, LTO, silicon nitride, Teflon, or Pyrelene) may be used in place of the metal layer 1492. The metal layer 1492 may be patterned to the desired shapes. Vias (not shown in FIGS. 14.1-14.6, but shown in FIGS. 15.1-15.4) may also be formed on the metal layer 1492 for sacrificial layer etch.

In step five (FIG. 14.5), the remaining sacrificial material 1491 is removed using sacrificial layer etching.

In step six (FIG. 14.6), another dielectric layer 1493 (e.g., polyimide, polymer, LTO, silicon nitride, Teflon, Pyrelene, SOG, PDMS, photoresist, epoxy, or wax) is coated or dropped to seal the vias on the metal layer 1492. The dielectric layer 1493 may be patterned to the desired shapes or removed from the top surface of the cMUT if needed.

FIGS. 15.1-15.4 show the same process as above but shows a larger portion of the device structure with the vias 1595 included in the figures. The vias 1595 may be located outside of the active areas of the transducer elements for easy sealing in late process step.

FIG. 15.1 shows the cMUT structure 1500, which is the same as the cMUT transducer 1400 in FIGS. 14.1-14.6 of the showing a larger portion of the entire device structure.

FIG. 15.2 shows the status of the cMUT transducer 1500 at step four (FIG. 14.4) of the process. The trenches 1545 are filled with the remaining sacrificial material 1591. A layer 1592 with desired properties (metal or other dielectric films) has been deposited to cover the trenches 1545. FIG. 15.2 further shows the vias 1595 that have been formed by patterning to access the sacrificial material 1591.

FIG. 15.3 shows the status after the sacrificial material 1591 has been removed by sacrificial layer etching.

FIG. 15.4 shows that the vias 1595 has been sealed with a proper material 1593.

Still other variations of the trench sealing method may be used. FIGS. 16.1-16.4 show another method to seal the trenches with materials with desired properties.

In step one (FIG. 16.1), a layer 1690 of a material (e.g., polyimide, polymer, PMMA, PDMS, SOG, or epoxy) with desired properties is spin coated or painted over the top electrode 1655 to cover the trenches 1645. For example, a material that is dry to the silicon surface and has a high viscosity may be desired. This step may also be done by using thin polyimide tapes (e.g., various Kapton tapes), Teflon tape, or Parafilm (wax) to stick on the top surface of the cMUT to cover the trenches 1645.

In step two (FIG. 16.2), the layer 1690 is thinned to a desired thickness using a proper etch method (e.g., 02 plasma etch). The layer 1690 may also be patterned into desired shapes to, for example, leave the top electrode exposed. A remaining patterned layer 1691 continues to cover the trenches 1645.

In step three (FIG. 16.3), a metal layer 1692 is deposited over the remaining patterned layer 1691 and the exposed top electrode 1655. The metal layer 1692 may be further patterned.

In step four (FIG. 16.4), another dielectric layer 1693 (e.g., polyimide, polymer, PMMA, PDMS, SOG, epoxy, LTO, silicon nitride, Teflon, or Pyrelene) is coated and patterned if needed.

It is appreciated that in addition to deposition, coating, or painting methods used above, a film of a desired material may also be transferred using a wafer-bonding technique.

FIGS. 17.1-17.4 show a method to transfer a desired film from a handle wafer to a cMUT using wafer-bonding technique. In step one (FIG. 17.1), a desired film 1791 (e.g., metal film, polyimide, polymer, LTO, silicon nitride, Teflon, Pyrelene, SOG, photoresist, or epoxy) is coated on a suitable handle wafer 1709 (e.g., silicon, or glass). In step two (FIG. 16.2), the handle wafer 1709 carrying the desired film 1791 is bonded or glued on the cMUT 1700 with a proper bonding technique (e.g., eutectic bonding, thermal compression bonding, anodic bonding, or stiction layer such as epoxy). In step three (FIG. 16.3), the handle wafer 1709 is removed, leaving the film 1791 on the cMUT 1700. The film 1791 may be further patterned to desired shapes if needed. In step four (FIG. 16.4), another film is deposited and patterned if needed.

Additional features may be introduced to the trench area to further improve the performance or to achieve certain special effects. FIGS. 18.1-18.2 show a cMUT structure having a post built in the trenches between the cMUT elements. The figures also show a process of sealing such a trench.

FIG. 18.1 shows the cross-section of a cMUT structure 1800 having a post 1846 built in a trench 1845 which separates two adjacent cMUT elements. The post 1846 is added in order to decrease the cross-coupling between the cMUT elements. The post 1846 is anchored on the substrate wafer 1801. The properties of the post 1846 within the trench 1845 may be designed for maximum reduction of the cross-coupling between the cMUT elements. The post 1846 may be fabricated in the cMUT process without requiring any extra fabrication step.

FIG. 18.2 shows a layer 1892 sealing the trench 1845. The layer 1892 may also cover the top electrode 1855 and the post 1846. The same methods described above to seal the trenches between the cMUT elements may be used to seal the trench 1845.

It is appreciated that the post 1846 may be fabricated at the same time with the fabrication of the cMUT device by properly designed patterning at each fabrication step involving a certain layer. For example, post anchor 1847 may be fabricated in the same step when the sidewall 1803 are formed. Various chemical or mechanical methods may be used for such formation.

IV. Reducing Parasitic Capacitance on the Electrical Interface Pads

The micro-electro-mechanical device such as the cMUT as described may need to interconnect to the outside through bonding wires or the probes. To do this, electrical interface pads (e.g., wire-bonding pads or probing pads) may be needed. The interface pads usually would introduce some undesired parasitic parameters (e.g., parasitic capacitance, or inductance). In order to improve the transducer performance, the parasitic parameters may need to be minimized One way to decrease the parasitic capacitance is to increase the thickness of the insulation layer (e.g., a dielectric layer, such as oxide, or silicon nitride). Usually the thickness of the insulation layer is limited by the thickness of the dialectical layer that can be grown or deposited by a proper process.

According to one aspect of the present invention, a method to reduce parasitic capacitance of an interconnection pad by increasing the thickness of an insulator underneath the interconnection pad is disclosed. The method allows the thickness of insulation layer on the substrate to be defined by the etching depth instead of the thickness of a film deposition, thus making possible to fabricate insulators of a thickness significantly greater than what would be possible with film deposition techniques.

One embodiment of the method comprises the following steps performed before joining the substrate wafer to the top plate:

(1) Forming an insulation cavity on the substrate wafer, wherein the patterned cavity having a desired overall thickness and is located at a position suitable for forming an interconnection pad for a nearby micro-electro-mechanical element of the micro-electro-mechanical device being fabricated;

(2) Filling the insulation cavity with a dielectric material to form an embedded insulator having the same thickness of the overall thickness of the patterned cavity; and (3) Forming an electric interconnection pad over top of the embedded insulator.

Another embodiment of the method uses a different process to achieve a similar effect. Specifically, instead of forming a plain (featureless) insulation cavity as described above, a patterned cavity is formed on the substrate wafer. In one embodiment, the patterned cavity has narrow passages interlined with solid lines of unremoved native material of the substrate. The patterned cavity has a desired overall thickness and is located at a position suitable for forming an interconnection pad for a nearby micro-electro-mechanical element of the micro-electro-mechanical device being fabricated. After forming the patterned cavity, the solid lines of unremoved native material in the patterned cavity are oxidized to form an embedded insulator having the same thickness of the overall thickness of the patterned cavity. An electric interconnection pad is then formed over top of the embedded insulator.

In a further aspect of the present invention, an embedded insulator may be formed in the top plate, instead of the substrate wafer, of the device structure using the above method.

FIGS. 19.1-19.6 show an example of the method to reduce parasitic capacitance of an interconnection pad by forming a thick insulator in a patterned cavity. The thick insulation layer at a desired location may be finished before the cMUT fabrication. The method has steps as described below.

In step one (FIG. 19.1), a patterned cavity 1971 is etched in the substrate wafer 1901 at the desired location. In the example shown, the patterned cavity 1971 has empty passages 1972 interlined with thin lines of unremoved substrate wafer material 1973.

The cMUT structure is to be formed on the same substrate wafer 1901 after a thick insulator has been formed. The patterned cavity 1971 has a desired overall thickness and is located at a position suitable for forming an interconnection pad for a nearby micro-electro-mechanical element of the micro-electro-mechanical device being fabricated.

In step two (FIG. 19.2), the patterned cavity is either oxidized or filled with a desired material (e.g., glass frit, or SOG) to form a thick insulator 1974.

In step three (FIG. 19.3), the surface is planarized if needed.

In step four (FIG. 19.4), cavities 1902 defined by sidewalls 1903 are formed. These will be for the formation of the micro-electro-mechanical device, such as the cMUT structure. The device fabrication may use any methods including those described herein.

In step five (FIG. 19.5), a membrane layer 1920 is formed or introduced over the cavities 1902 and the sidewalls 1903.

In step six (FIG. 19.6), the fabrication process for the device (cMUT as shown) is completed to make the device. FIG. 9.6 shows a cMUT element 1905 that is fabricated on the substrate wafer 1901 adjacent to the thick insulator 1974. The thick insulator 1974 itself is also furthered during the device fabrication process to become a complete connection anchor 1906, which can be used for connecting to the cMUT element 1905 through a connection 1907, an example of which has been shown in FIGS. 10A and 10B.

FIGS. 20.1-20.4 show another example of the method to reduce parasitic capacitance of an interconnection pad by forming a thick insulator in a patterned cavity. Unlike the example shown in FIGS. 19.1-19.6, in this example the thick insulation layer at a desired location may be finished after the cMUT fabrication. The method has steps as described below.

In step one (FIG. 20.1), a largely finished cMUT structure 2000 is provided. As shown in FIG. 20.1, the cMUT fabrication process has been carried out to the step of surface layer formation on the top plate layer 2040.

In step two (FIG. 20.2), a patterned cavity 2071 is formed on the top plate layer 2040. The patterned cavity 2071 has narrow passages 2072 interlined with solid lines of unremoved native material 2073 of the top plate layer 2040, and the patterned cavity 2071 has a desired overall thickness and is located at a position suitable for forming an interconnection pad for connecting a nearby micro-electro-mechanical element (e.g., cMUT 2005). The patterned cavity 2071 can be etched into the substrate wafer 2001 if needed.

In step three (FIG. 20.3), the patterned cavity 2071 is either oxidized or filled with a desired material (e.g., glass frit, or SOG) to form a thick insulator 2074.

In step four (FIG. 20.4), a metal layer is deposited over the top of the cMUT element 2005 to form the top electrode 2055. The same metal layer is deposited and patterned to form a contact layer 2056 on top of the thick insulator 2074.

The exemplary thick insulator configurations shown in FIGS. 19.1-19.6 and FIGS. 20.1-20.4 are used for a cMUT with embedded cantilevers. However, these methods of forming a thick insulation layer or thick insulator can be applied with the fabrication process of any other micro-electro-mechanical devices that need an anchored connection.

As shown in the above examples, one unique aspect of the method of the present invention to reduce the parasitic capacitance is that the thickness of an insulation layer on the substrate wafer or the top plate is defined by the etching depth instead of the thickness of a film deposition, thus overcoming the inherent limit imposed by the film thickness.

V. Fabrication Methods for Making Micro-Electro-Mechanical Devices with Additional Features Additional features on the basic elements micro-electro-mechanical devices are envisioned and can be fabricated using the methods described below.

FIG. 21 shows a cross-sectional view of a cMUT structure featuring self-aligned cantilevers. For better clarity, some optional parts such as the top and bottom electrodes embodied in separate layers and the insulation layer are omitted in FIG. 21. (As discussed herein, although a cMUT structure requires a pair of electrodes to form a capacitor, these electrodes do not have to be embodied in separate layers.).

The cMUT structure 2111 of FIG. 21 is similar to the cMUT portion 211 shown in FIG. 2C. The cMUT structure 211 is built on a substrate 2101, and has a middle spring layer 2120 and a top plate 2140. A cavity 2102 is defined between the substrate 2101 and the middle spring layer 2120. The cavity 2102 is bordered by two sidewall anchors 2103 and 2103*m* on two opposite sides. A connector 2130 stands on top of the middle spring layer 2120, and connects to the top plate 2140. The connector 2130 is horizontally distanced from the sidewalls of both the sidewall anchor 2103 and the sidewall anchor 2103*m*. The middle spring layer 2120 between the sidewall anchor 2103 and the sidewall anchor 2103*m* defines a double-cantilever anchored at the sidewall anchor 2103 and the sidewall anchor 2103*m*. The double-cantilever is connected head-to-head at a location where the connector 2130 is positioned to form a bridge. The top plate 2140 is placed over the connector 2130, which separates the top plate 2140 from the middle spring layer 2120 to define a transducing space below the top plate 2140. The double-cantilever and the cavity 2102 enable a vertical displacement of the connector 2130, which transports the top plate 2140 substantially vertically, thus changing the transducing space and activating a transducing member in the transducer for energy transformation.

In the cMUT structures shown in FIGS. 2A-2C, a middle spring layer 220 having substantially uniform thickness is used, and as a result the beam length of the cantilevers formed is determined by the location 220 of the corresponding plate-spring connector 230 relative to the edge location of the respective sidewall anchor 203 or 203*m*. Precise control of the beam lengths and the corresponding cantilever spring strengths is achieved through precise control of the locations of the plate-spring connectors on the middle spring layer relative to the locations of the respective sidewall anchors. Because in some embodiments of the fabrication method the plate-spring connectors, the sidewall anchors and the cavities are defined in different lithograph steps, there might be difficulties to achieve such precise control. Any alignment error among these different steps may alter the cantilever lengths from their intended values.

In contrast to the cMUT structures shown in FIGS. 2A-2C, the cMUT structure 2111 features self-aligned cantilevers. To achieve this, a thick middle spring layer 2120 is used. Cantilever lengths $L_a$ and $L_b$ are defined by a respective thinner part 2124*a* or 2124*b* of the spring membrane layer 2120. In the example shown, the two thinner parts 2124*a* and 2124*b* are separated by a thicker part 2122 in the middle of the bridge formed by the spring membrane layer 2120. In the bridge configuration shown here, the thicker part 2122 functions as a cantilever divider. In other configurations, the thicker part 2122 may be a cantilever terminator forming an end of a cantilever on one side only. The two anchoring thicker parts 2122*a* and 2122*b* are on top of the two sidewall anchors 2103 and 2103*m*, respectively. In some embodiments, the two anchoring thicker parts 2122*a* and 2122*b* form at least a part of the two sidewall anchors 2103 and 2103*m*, or even the entire sidewall anchors 2103 and 2103*m*.

The plate-spring connector 2130 is located on the thicker part 2122. In this configuration, the cantilever length $L_a$ is defined by the distance between the edge 2106 of the thicker part 2122 and the edge 2104 of the thicker part 2122*a*. The cantilever length $L_b$ is defined similarly. The cantilever lengths $L_a$ and $L_b$ can therefore be predetermined by one lithograph mask. Any misalignment of the connector 2130 relative to the middle spring layer 2120 (the thicker part 2122 to be exact), or misalignment of the middle spring layer 2120 (the thicker parts 2122*a* and 2122*b* thereof to be exact) relative to the sidewall anchors 2103 or 2103*m* will have a minimum impact on the effect of cantilever lengths and the corresponding spring strengths of the cantilevers. The cantilever lengths $L_a$ and $L_b$ in the cMUT structure 2111 and the corresponding spring lengths the cantilevers therefore have little or none dependence on any discrepancies among individual fabrication steps.

The above description is given in the context of a cross-sectional view shown in FIG. 21. It is appreciated that in a three-dimensional view, the cantilevers may not be a beam-like formation but instead an area or plane cantilever as defined herein. For example, the thinner parts 2124*a* and 2124*b* each may be in a shape of an extended strip, or an ring-like (annular) shape.

FIGS. 22.1-22.16, including FIGS. 22.14A-22.14D and FIGS. 22.5*a*-22.5*b*, show a wafer-bonding process for fabricating a cMUT structure having self-alignment features. The process may also incorporate other features such as trench sealing. The steps of the process are described below.

In step one (FIG. 22.1), process starts with an SOI wafer 2280 carrying a silicon layer 2240 which is to become the top plate layer 2240 of the resultant cMUT structure. An oxide layer 2281 and a nitride layer 2282 are grown on the bottom of the top plate 2240. Alternatively, this step may start with a prime wafer, which can be ground and polished to a desired thickness for the top plate layer in a later step.

In step two (FIG. 22.2), the oxide layer 2281 and nitride layer 2282 are patterned according to the cMUT design to expose certain areas of the top plate layer 2240.

In step three (FIG. 22.3), the exposed areas of the top plate layer 2240 is oxidized to a desired thickness.

In step four (FIG. 22.4), the nitride and oxide layers are removed to form recesses 2241 on the bottom surface of the top plate layer 2240.

In step five (FIG. 22.5), patterned features 2231 are formed over the recesses 2241 of the top plate layer 2240. These patterned features 2231 will become a part of the plate-spring connectors 2230 in the final cMUT structure. One way to form such patterned features 2231 is to grow an oxide layer. At this step, several additional steps may be optionally performed. These additional steps are described with reference to FIGS. 22.5*a*-22.5*b* after the main steps are described.

In step six (FIG. 22.6), another oxide layer 2232 is grown over the recesses 2241 of the top plate layer 2240. This optional oxide layer 2232 may support the roots of the patterned features 2231 and help solidify them as a part of plate-spring connectors 2230 in the final cMUT structure.

In step seven (FIG. 22.7), another SOI wafer 2285 carrying a silicon layer 2221 is bonded to the plate-spring connectors 2230. The silicon layer 2221 is to become the middle spring layer 2220 in the final cMUT structure to form the embedded springs (cantilevers). To serve this purpose, the silicon layer 2221 should have a proper thickness.

In step eight (FIG. 22.8), SOI wafer 2285 is etched back to remove the carrier layer and the oxide layer to leave the silicon layer 2221 which is to become the middle spring layer 2220. If needed, silicon doping can be done in selected areas of the silicon layer 2221 in this step.

In step nine (FIG. 22.9), an oxide layer 2286 and a nitride layer 2287 are formed and patterned over the silicon layer 2221, leaving selected areas 2288 of the silicon layer 2221 accessible.

In step ten (FIG. 22.10), the accessible areas 2288 of the silicon layer 2221 are oxidized to a desired thickness.

In step eleven (FIG. 22.11), the oxide and nitride layers are removed at selected locations leaving remaining oxide and nitride on top of areas 2213 of the silicon layer 2221. The areas 2213 will become sidewall anchors 2203 in the final cMUT structure. The other uncovered areas of silicon layer 2221 are now exposed for the next step.

In step twelve (FIG. 22.12), the exposed areas of the silicon layer 2221 is oxidized to a desired thickness.

In step thirteen (FIG. 22.13), both the oxide and nitride layers over areas 2213 and the new oxidized layer formed in step twelve are removed to form the middle spring layer 2220 having thicker part features that will become the sidewall anchors in 2203 and cantilever dividers 2222. After this step (step thirteen), there are several options available. The first option is described below with reference to FIG. 22.14A, while the several other options are described later with reference to FIGS. 22.14B, 22.14C and 22.14C.

In step fourteen, option 1 (FIG. 22.14A), a prime wafer 2201 with a desired thickness is bonded. This layer becomes the substrate 2201 for the final cMUT structure. After this step, the process to finish the fabrication is similar to the final steps of some of the other exemplary fabrication methods described in this description. One example is briefly described below.

In step fifteen (FIG. 22.15), the top SOI wafer 2280 is etched back to remove the carrier layer and the oxide layer to form the top plate 2240.

In step sixteen (FIG. 22.16), metal layer 2250 is deposited and patterned if needed to form interconnections. Trenches 2215 are formed between cMUT elements to separate the individual cMUT elements.

Several other options are available for the above step fourteen. In a second option of step fourteen (FIG. 22.14B), instead of bonding a prime wafer, a processed wafer 2291 with through-wafer interconnections 2260 formed therein is fusion bonded to the middle spring layer 2220. The processed wafer 2291 and the middle spring layer 2220 define a cavity pattern which corresponds to the shapes of cantilever-forming areas. This step may also be done with other wafer-bonding technologies (e.g. eutectic bonding, thermal compression bonding, and anodic bonding.)

In a third option of step fourteen (FIG. 22.14C), a wafer 2292 with desired metal patterns or with a PCB board with desired circuits is bonded to the middle spring layer 2220. The wafer 2292 may be made of materials such as glass, sapphire, or silicon.

In a fourth option of step fourteen (FIG. 22.14D), a silicon wafer 2293 having integrated circuits 2294 (ICs) built therein is bonded to the middle spring layer 2220.

At the above step five, several additional steps may be optionally performed. These additional steps are described with reference to FIGS. 22.5*a*-22.5*b*). In FIG. 22.5*a*, trenches 2216 are formed through the top plate 2240 to separate cMUT element areas on the top plate 2240. This step may be performed in place of the step 16 described above. In FIG. 22.5*b*, a thin film material 2217 is formed and processed in the trenches 2216 if needed. After these extra steps, the process continues to the step six described above.

FIGS. 23.1-23.7 show a surface micromachining process for fabricating a cMUT structure having self-alignment features. The process may also incorporate other features such as trench sealing. The steps of the process are described below.

In step one (FIG. 23.1), the process starts with a substrate wafer 2301. A sacrificial layer 2371 is deposited and patterned on the substrate wafer 2301.

In step two (FIG. 23.2), a layer 2329 of a proper material is formed over the sacrificial layer 2371. The material of the layer 2329 also fills the patterns of fee sacrificial layer 2371. The layer 2329 is to become the middle spring layer 2320 of the final cMUT structure.

In step three (FIG. 23.3), the layer 2329 is patterned using surface micromachining techniques to form the middle spring layer 2320 having features, some of which will become cantilever dividers 2322.

In step four (FIG. 23.4), another sacrificial layer 2372 is deposited over the middle spring layer 2320.

In step five (FIG. 23.5), top plate layer 2340 is placed over the sacrificial layer 2372.

In step six (FIG. 23.6), sacrificial layers 2371 and 2372 are removed to form cavities 2302 and 2360. Cavities 2302 are on top of the substrate 2301 to provide displacement space for cantilevers in the cMUT structure. Cavities 2360 are on top of the middle spring layer to serve as a transducing space of the cMUT structure. Cavities may be sealed in this step if needed.

In step seven (FIG. 23.7), a metal layer 2350 is deposited and patterned if desired over the top plate 2340. Trenches may be formed to separate the cMUT elements in this step.

The material selection and process method selection in each step for the fabrication methods shown above in FIGS. 22.1-22.16 and FIGS. 23.1-23.7 are similar to those described herein in association with fabrication methods with other micro-electro-mechanical structures. Again, although a cMUT is used for the purpose of illustration in the above described processes, the methods are not limited to such. The micro-electro-mechanical structures can also by fabricated by using only a part of each process, or different step sequences of the processes shown in FIGS. 22.1-22.16 and FIGS. 23.1-23.7. In addition, in stead of using a SOI wafer, the middle spring layer of the micro-electro-mechanical structures having embedded springs can be made of a silicon wafer with highly doped layer or silicon wafer with PN junction layer. Cantilever areas on the middle spring layer can be subsequently formed using selective silicon etching.

The method for fabricating a micro-electro-mechanical device has been described in detail along with the figures and exemplary embodiments. The method of the present invention provides a potentially advantageous fabrication method for fabricating a variety of micro-electro-mechanical devices which have a movable mechanical part to transform energy. The method is particularly suitable for making capacitance micromachined ultrasonic transducers (cMUT), but can also be used for making other micro-electro-mechanical devices which have a movable mechanical part to transform energy.

In particular, the fabrication method according to the present invention may be used in fabricating and packaging the novel MUTs (especially cMUTs) disclosed in international patent applications (PCT) PCT/IB2006/051568, entitled MICRO-ELECTRO-MECHANICAL TRANSDUCERS; and PCT/IB2006/051569, entitled MICRO-ELECTRO-MECHANICAL TRANSDUCERS.

In the foregoing specification, the present disclosure is described with reference to specific embodiments thereof, but those skilled in the art will recognize that the present disclosure is not limited thereto. Various features and aspects of the above-described disclosure may be used individually or jointly. Further, the present disclosure can be utilized in any number of environments and applications beyond those described herein without departing from the broader spirit and scope of the specification. We claim all such modifications and variations that fall within the scope and spirit of the claims below. The specification and drawings are, accordingly, to be regarded as illustrative rather than restrictive. It will be recognized that the terms "comprising," "including,"

and "having," as used herein, are specifically intended to be read as open-ended terms of art.

The invention claimed is:

1. A method for fabricating a micro-electro-mechanical device having a movable mechanical part to transform energy, the method comprising the steps of:

providing a substrate wafer, a middle spring layer and a top plate layer;

forming at least one cavity on either a front side of a substrate wafer or a bottom side of the middle spring layer by directly patterning into the said side or by patterning a sacrificial layer added onto the said side, wherein each cavity has at least one sidewall;

forming at least one connector of a desired height on either a top side of a middle spring layer or a bottom side of a top plate layer; and joining the substrate wafer, the middle spring layer and the top plate layer such that the bottom side of the top plate layer faces the top side of the middle spring layer and a bottom side of the middle spring layer faces the front side of the substrate wafer, whereby the connector stands out from the middle spring layer to define a transducing space between the top plate layer and the middle spring layer, and the connector is horizontally distanced from the sidewall by a sufficient length to define a cantilever anchored at the sidewall with an exerting end at the connector, wherein the cantilever and the cavity enable a vertical displacement of the connector to transport the top plate layer substantially vertically with a piston-like motion to change the transducing space, and wherein, when so joined, the top plate layer is adapted for receiving and/or transmitting energy.

2. The method of claim 1 wherein the cavity is defined by at least two sidewalls and the connector is located between the two sidewalls and horizontally distanced from each of the two sidewalls by a sufficient length to define a bridge having two cantilevers connected head-to-head.

3. The method of claim 1, wherein the step of forming at least one cavity comprises:

forming a first cavity and a second cavity on the front side of the substrate wafer, wherein the first cavity and the second cavity are on two opposite sides of the sidewall to share the sidewall;

and the step of forming at least one connector comprises:

forming a first connector and a second connector of the same desired height, wherein the first connector and the second connector are located on opposite sides of the sidewall, and each horizontally distanced from the sidewall by a sufficient length to define two cantilevers connected back-to-back at the sidewall.

4. The method of claim 1 wherein:

the step of joining the substrate wafer, the middle spring layer and the top plate layer comprises placing the middle spring layer on top of the substrate wafer to cover the first cavity;

the step of forming a connector comprises forming the connector on the top side of the middle spring layer after the middle spring layer has been joined with the substrate wafer; and the step of joining the substrate wafer, the middle spring layer and the top plate layer further comprises placing the top plate layer over the connector after the middle spring layer with the connector formed thereon has been joined with the substrate wafer.

5. The method of claim 1 wherein the step of forming a connector comprises forming the connector on the bottom side of the top plate layer, and the step of joining the substrate wafer, the middle spring layer and the top plate layer comprises:

placing the middle spring layer over the connector; and placing the top plate layer and the middle spring layer on top of the substrate wafer to cover the first cavity.

6. The method of claim 1 further comprising depositing a metal layer on the top plate layer.

7. The method of claim 1 wherein the micro-electro-mechanical device is a capacitance micromachined ultrasonic transducer (cMUT), the method further comprising:

forming or effectuating a top electrode on the top plate layer; and forming or effectuating a bottom electrode in or on the middle spring layer or the substrate wafer.

8. The method of claim 7 wherein the step of forming or effectuating the top electrode is accomplished by using a conductive material for the top plate layer.

9. The method of claim 7 wherein the step of forming or effectuating the bottom electrode is accomplished by using a conductive material for the substrate wafer.

10. The method of claim 1 wherein the middle spring layer is an elastic thin membrane and the top plate layer is significantly more rigid than the middle spring layer.

11. The method of claim 1 wherein the step of joining the substrate wafer, the middle spring layer and the top plate layer further comprises the steps of:

bonding an SOI wafer having a support layer carrying a thin layer on the front side of the substrate wafer; and removing the support layer by a chemical or mechanical method, leaving the thin layer on top of the substrate wafer as the middle spring layer.

12. The method of claim 1 wherein the connector is formed on the bottom side of the top plate layer, and the step of joining the substrate wafer, the middle spring layer and the top plate layer further comprises the steps of:

bonding an SOI wafer having a support layer carrying a thin layer on the bottom side of the top plate layer with the connector formed thereon; and removing the support layer by a chemical or mechanical method, leaving the thin layer on the bottom side of the top plate layer as the middle spring layer.

13. The method of claim 1 wherein the step of joining the substrate wafer, the middle spring layer and the top plate layer comprises the steps of:

bonding an SOI wafer having a support layer and the top plate layer with the middle spring layer and the substrate wafer; and removing the support layer by a chemical or mechanical method, leaving the top plate layer remaining joined with the middle spring layer and the substrate wafer.

14. The method of claim 13 further comprising:

before bonding the SOI wafer with the middle spring layer and the substrate wafer, forming an insulation layer over the bottom side of the top plate layer, wherein both the top plate layer and the insulation layer are to remain joined with the middle spring layer and the substrate wafer upon removing the support layer.

15. The method of claim 1 wherein the step of joining the substrate wafer, the middle spring layer and the top plate layer comprises the steps of:

bonding a prime wafer with the middle spring layer and the substrate wafer; and thinning the prime wafer using a chemical or mechanical method, leaving the prime layer with desired thickness as the top plate layer.

16. The method of claim 1 further comprising:

after joining the top plate layer with the middle spring layer and the substrate wafer, patterning the top plate layer to a desired shape or configuration.

17. The method of claim 16 wherein the step of patterning the top plate layer comprises forming plurality of holes in the top plate layer to create a desired level of hollowness in the top plate layer.

18. The method of claim 1 wherein the step of forming at least one cavity on the substrate wafer comprises forming a plurality of cavities on the substrate wafer, and the step of forming at least one connector comprises forming a plurality of connectors, wherein the connectors are disposed at different locations across the middle spring layer.

19. The method of claim 18 further comprising the following steps before joining the substrate wafer with the middle spring layer and the top plate layer:

introducing an insulation layer on top of the substrate wafer;

introducing a conductive layer over the insulation layer; and patterning the conductive layer to form a plurality of sections electrically insulated from each other, each section responding to a separate micro-electro-mechanical element, each element having at least one cantilever.

20. The method of claim 18 further comprising forming a separation trench through at least the top plate layer to separate a plurality of micro-electro-mechanical elements from one another, each element having at least one cantilever.

21. The method of claim 20 wherein each element is electrically connected to a connection anchor.

22. The method of claim 21 wherein the connection anchor is separated and unaffected by movement of the cantilevers and the top plate layer.

23. The method of claim 20 wherein the plurality of elements are arranged in an array with minimal separation therebetween, each element being electrically connected to an inter-element connection anchor located at a corner or edge shared by at least two neighboring elements.

24. The method of claim 23, further comprising the steps of:

before forming the separation trench, introducing a conductive layer on top of the top plate layer, wherein the subsequently formed separation trench is through the conductive layer to reach the cavity;

filling the cavity using a filler material; and depositing a metal layer over the trench to electrically connect two elements on two sides of the trench.

25. The method of claim 24 wherein the filler material is a sacrificial material which can be removed subsequently.

26. The method of claim 24 wherein the filler material is that of a desired property and remains in the cavity.

27. The method of claim 20 further comprising introducing a cover layer over the separation trench to seal the separation trench.

28. The method of claim 27 further comprising depositing a metal layer over the cover layer to interconnect neighboring elements such that the interconnected neighboring elements may be jointly addressed.

29. The method of claim 20 comprising the additional steps of:

forming a sacrificial material from top of the top plate layer to fill the separation trench;

depositing a first sealing layer over the top of the top plate layer to seal the separation trench, the sealing layer having a via to access the sacrificial material;

removing the sacrificial material; and depositing a second sealing layer to close the via.

30. The method of claim 29 wherein the first sealing layer is a metal layer to interconnect neighboring elements such that the interconnected neighboring elements may be jointly addressed.

31. The method of claim 29 wherein the additional steps are performed after joining the substrate wafer, the middle spring layer and a top plate layer.

32. The method of claim 1, wherein:

the step of forming at least one cavity on the substrate wafer comprises forming a plurality of cavities on the substrate wafer;

the step of forming at least one connector comprises forming a plurality of connectors on the bottom side of the top plate layer, the connectors being disposed at different locations across the middle spring layer when the top plate layer is joined to be middle spring layer; and the step of joining the substrate wafer, the middle spring layer and the top plate layer comprises the steps of:

bonding a first SOI wafer to the bottom side of the top plate layer, wherein the first SOI wafer has a first support layer supporting the middle spring layer;

removing the support layer in the first SOI wafer but leaving the middle spring layer bonded with the top plate layer; and joining the substrate wafer having the formed cavity to the middle spring layer on an opposite side to the top plate layer.

33. The method of claim 32, further comprising the steps of:

before joining the substrate wafer, forming a separation trench through the middle spring layer and at least part of the top plate to separate a plurality of micro-electro-mechanical elements from one another, each element having at least one connector to form one cantilever.

34. The method of claim 33, wherein the top plate layer is provided as part of a second SOI wafer having a second support layer, an insulator layer and the top plate layer, the method further comprising the steps of:

after bonding the first SOI wafer to the bottom side of the top plate layer carried by the second SOI wafer, removing the second support layer in the second SOI wafer; and after forming the separation trench, partially removing the insulator layer and leaving a portion of the insulator layer over an end of the separation trench to have the trench sealed from that end.

35. The method of claim 1 wherein the substrate wafer is a conductive wafer, the method further comprising the following steps to reduce parasitic capacitance of an interconnection pad by increasing thickness of an insulator under the interconnection pad, the steps being performed before joining the substrate wafer to the top plate layer:

forming an insulation cavity on the substrate wafer, the insulation cavity having a desired overall thickness and being located at a position suitable for forming an interconnection pad for a nearby micro-electro-mechanical element of the micro-electro-mechanical device being fabricated;

filling the insulation cavity with a dielectric material to form an embedded insulator having the same thickness of the overall thickness of the patterned cavity; and forming an electric interconnection pad over top of the embedded insulator.

36. The method of claim 1 wherein the substrate wafer is a conductive wafer, the method further comprising the following steps performed before joining the substrate wafer to the top plate layer to reduce parasitic capacitance of an interconnection pad by increasing thickness of an insulator under the interconnection pad:

forming a patterned cavity on the substrate wafer, the patterned cavity comprising narrow passages interlined with solid lines of unremoved native material of the substrate, and the patterned cavity having a desired overall thickness and being located at a position suitable for forming an interconnection pad for a nearby micro-electro-mechanical element of the micro-electro-mechanical device being fabricated;

oxidizing the solid lines of unremoved native material in the patterned cavity to form an embedded insulator having the same thickness of the overall thickness of the patterned cavity; and forming an electric interconnection pad over top of the embedded insulator.

37. The method of claim 1 wherein the substrate wafer is a conductive wafer, the method further comprising the following steps to reduce parasitic capacitance of an interconnection pad by increasing thickness of an insulator under the interconnection pad, the steps being performed after joining the substrate wafer to the top plate layer:

forming a patterned cavity on the top plate layer, the patterned cavity comprising narrow passages interlined with solid lines of unremoved native material of the top plate layer, and the patterned cavity having a desired overall thickness and being located at a position suitable for forming an interconnection pad for a nearby micro-electro-mechanical element of the micro-electro-mechanical device being fabricated;

oxidizing the solid lines of unremoved native material in the patterned cavity to form an embedded insulator having the same thickness of the overall thickness of the patterned cavity; and forming an electric interconnection pad over top of the embedded insulator.

38. The method of claim 1 further comprising forming a post in the cavity, wherein the post is shorter than the sidewall and is cleared of the middle spring layer by a desired distance after the middle spring layer has been placed over the cavity.

39. The method of claim 38 wherein the cavity, the sidewall and the post are formed at the same time using a chemical or mechanical method.

40. The method of 38 wherein the connector is formed at a location directly above the post.

41. The method of claim 1, wherein the step of forming the first cavity on the front side of the substrate wafer comprises forming a first cavity by removing native material from the substrate wafer.

42. The method of claim 1, wherein the step of forming the at least one cavity on the front side of the substrate wafer comprises the steps of:

depositing a sacrificial layer on the front side of the substrate wafer;

patterning the first sacrificial layer to form a first provisional cavity;

depositing a thin film material over the first sacrificial layer to fill the first provisional cavity;

removing the first sacrificial layer to form the first cavity.

43. The method of claim 1, wherein the step of forming at least one cavity comprises forming at least one cavity on the bottom side of the middle spring layer.

44. The method of claim 43 wherein the middle spring layer is a silicon wafer, both the at least one cavity and the at least one sidewall being formed from the middle spring layer.

45. The method of claim 1, further comprising the step of:

forming a pattern on the middle spring layer such that the middle spring layer comprises a first region of a first thickness, a second region of a second thickness, and a third region of a third thickness, the second region being between the first region and the third region, the second thickness being substantially smaller than the first thickness or the third thickness, wherein when joined with the substrate and the top plate layer, the first region forms at least part of the sidewall, the second region and the third region is over the cavity, and the connector is in the third region.

46. The method of claim 45, wherein the step of forming a pattern on the middle spring layer comprises:

forming a patterned oxide or nitride layer over the middle spring layer, the oxide or nitride layer covers the first region and the third region of the middle spring layer but leaves the second region uncovered;

oxidizing the second region of the middle spring layer to form an first oxidized layer;

removing the oxide or nitride layer over the third region and the first oxidized layer in the second region;

oxidizing the second region and the third region of the middle spring layer to form a second oxidized layer; and removing the oxide or nitride layer over the first region and the second oxidized layer in the second region and the third region.

47. A method for fabricating a micro-electro-mechanical device, which has a movable mechanical part to transform energy, the method comprising the steps of:

providing a substrate wafer having a front side and a back side;

depositing a first sacrificial layer on the front side of the substrate wafer;

patterning the first sacrificial layer to form a first provisional cavity;

depositing a first thin film material over the first sacrificial layer to fill the first provisional cavity and to further form a membrane layer covering a top surface of the first sacrificial layer;

removing the first sacrificial layer to form a first cavity on top of the substrate wafer, wherein the first cavity is defined by at least one sidewall having a top surface, the sidewall being made of the first thin film material deposited in the first provisional cavity;

forming at least one connector of a desired height on either a top side of the membrane layer or a bottom side of a top plate layer; and placing the top plate layer over the connector to define a transducing space between the top plate layer and the membrane layer, wherein the connector stands out from the membrane layer and is horizontally distanced from the sidewall of the first cavity by a sufficient length to define a cantilever anchored at the sidewall to allow a vertical displacement of the connector, and whereby the vertical displacement of the connector transports the top plate layer substantially vertically with a piston-like motion, thus changing the transducing space.

48. The method of claim 47, wherein the step of forming at least one connector comprises the steps of:

depositing a second sacrificial layer on top of the membrane layer;

patterning the second sacrificial layer to form a second provisional cavity;

depositing a second thin film material to fill at least the second provisional cavity;

removing the second sacrificial layer to form a second cavity on top of the membrane layer, wherein the second cavity is defined by at least a connector on top of the membrane layer, the connector being made of the second thin film material deposited in the second provisional cavity.

49. The method of claim 48, wherein the step of removing the first sacrificial layer and the step of removing the second sacrificial layer are performed at the same time.

50. The method of claim 48, wherein the step of depositing a second thin film material over the second sacrificial layer comprises depositing an insulation layer on top of the second sacrificial layer.

51. The method of claim 48 wherein the step of depositing a second thin film material further comprises depositing a second thin film layer over the second sacrificial layer, the second thin film layer having at least one hole for access to the second sacrificial layer underneath.

52. The method of claim 51 wherein the step of depositing the second thin film comprises depositing a porous thin film.

53. The method of claim 51 wherein the at least one hole is formed by etching the second thin film after it has been deposited.

54. The method of claim 51 wherein the second thin film layer is an insulation layer.

55. The method of claim 51 further comprising the step of depositing a thin film metal layer on top of the second thin film layer.

56. The method of claim 47 wherein the micro-electro-mechanical device is a micromachined ultrasonic transducer (MUT), further comprising the step of:

forming an ultrasonic transducing member on at least one of the top plate layer, the membrane layer, and the substrate wafer, wherein the transducing member effectuates energy transformation through vertical transportation of the top plate layer or a change of the transducing space.

57. The method of claim 47 wherein the step of forming the ultrasonic transducing member comprises the steps of:

forming or effectuating a top electrode in or on the top plate layer; and forming or effectuating a bottom electrode in or on the substrate wafer.

58. The method of claim 47, wherein the membrane layer having at least one hole for access to the first sacrificial layer underneath.

59. The method of claim 58, wherein the at least one hole in the membrane layer is formed by etching the membrane layer after it has been deposited.

60. The method of claim 47 further comprising the step of:

depositing an insulation layer on top of the membrane layer.

61. The method of claim 47 wherein the substrate wafer is in conductive wafer.

62. The method of claim 47 further comprising:

forming a first region of a first thickness, a second region of a second thickness, and a third region of a third thickness on the deposited first thin film material, the second region being between the first region and the third region, the second thickness being substantially smaller than the first thickness or the third thickness, the first region being over the first provisional cavity, the second region and the third region being over the first sacrificial layer.

* * * * *